United States Patent
Kato et al.

(10) Patent No.: US 9,165,632 B2
(45) Date of Patent: Oct. 20, 2015

(54) MEMORY DEVICE AND SEMICONDUCTOR DEVICE

(71) Applicant: Semiconductor Energy Laboratory Co., Ltd., Atsugi-shi, Kanagawa-ken (JP)

(72) Inventors: Kiyoshi Kato, Kanagawa (JP); Takuro Ohmaru, Kanagawa (JP); Yasuyuki Takahashi, Miyagi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 64 days.

(21) Appl. No.: 14/160,800

(22) Filed: Jan. 22, 2014

(65) Prior Publication Data

US 2014/0204696 A1    Jul. 24, 2014

(30) Foreign Application Priority Data

Jan. 24, 2013  (JP) .................................. 2013-010795
Mar. 25, 2013  (JP) .................................. 2013-061603

(51) Int. Cl.
*G11C 11/22*    (2006.01)
*G11C 11/24*    (2006.01)

(52) U.S. Cl.
CPC ................ *G11C 11/22* (2013.01); *G11C 11/24* (2013.01)

(58) Field of Classification Search
CPC ........ G11C 11/22; G11C 11/24; G11C 5/148; G11C 7/20; G11C 5/14
USPC ............................... 365/228, 149, 150, 189.2
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Tan T. Nguyen
(74) *Attorney, Agent, or Firm* — Fish & Richardson P.C.

(57) ABSTRACT

Provided is a memory device with reduced overhead power. A memory device includes a first circuit retaining data in a first period during which a power supply voltage is supplied; a second circuit saving the data retained in the first circuit in the first period and retaining the data saved from the first circuit in a second period during which the power supply voltage is not supplied; and a third circuit saving the data retained in the second circuit in the second period and retaining the data saved from the second circuit in a third period during which the power supply voltage is not supplied. The third circuit includes a transistor in which a channel formation region is provided in an oxide semiconductor film and a capacitor to which a potential corresponding to the data is supplied through the transistor.

19 Claims, 42 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 6,741,489 B2 | 5/2004 | Takasu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 8,446,171 B2 | 5/2013 | Takahashi |
| 8,575,985 B2 | 11/2013 | Ohmaru et al. |
| 8,593,856 B2 | 11/2013 | Koyama et al. |
| 8,618,586 B2 | 12/2013 | Koyama et al. |
| 8,837,203 B2 * | 9/2014 | Shionoiri et al. ............ 365/149 |
| 8,891,285 B2 * | 11/2014 | Takemura ................... 365/149 |
| 8,929,161 B2 * | 1/2015 | Matsuzaki ................... 365/191 |
| 9,024,669 B2 | 5/2015 | Ohmaru et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0095452 A1 | 5/2003 | Takasu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0294069 A1 | 11/2012 | Ohmaru et al. |
| 2013/0057315 A1 | 3/2013 | Kato et al. |
| 2013/0222033 A1 | 8/2013 | Kato et al. |
| 2013/0234757 A1 | 9/2013 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-152506 A | 5/2003 |
| JP | 2004-103957 A | 4/2004 |
| JP | 2004-273614 A | 9/2004 |
| JP | 2004-273732 A | 9/2004 |
| JP | 2012-257207 A | 12/2012 |
| JP | 2013-009297 A | 1/2013 |
| JP | 2013-009308 A | 1/2013 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using CASTEP," Zeitschrift fur Kristallographie, 2005, vol. 220, pp. 567-570.

Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing $MOO_3$ as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL, $YbFe_2O_4$, and $Yb_2Fe_3O_7$ Types of Structures for Compounds in the $In_2O_3$ and $Sc_2O_3$—$A_2O_3$—BO Systems [A; Fe, Ga, or Al; B: Mg, Mn, Fe, Ni, Cu, or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges To, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds $InMO_3(ZnO)m$ (M=In,Ga; m=Integer) Described by Four-Dimensions Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector with Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Ando Koji; "Nonvolatile Magnetic Memory"; FED Review, vol. 1, No. 14; pp. 1-8; Mar. 2002; with English translation.

\* cited by examiner

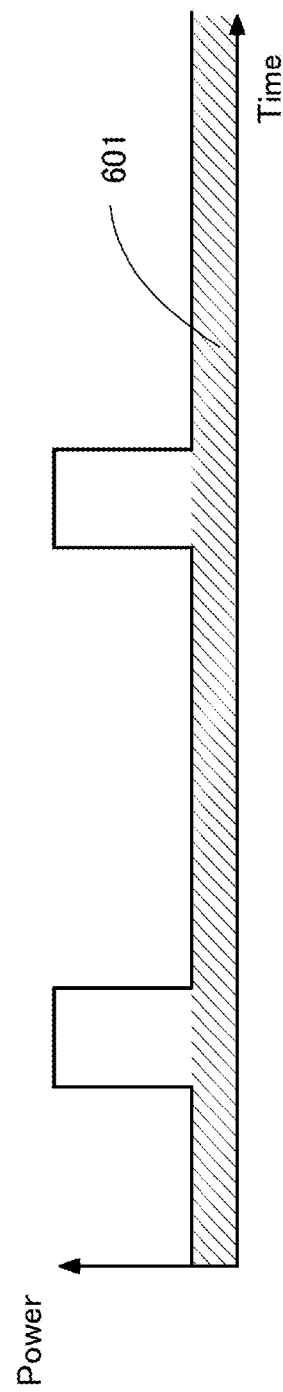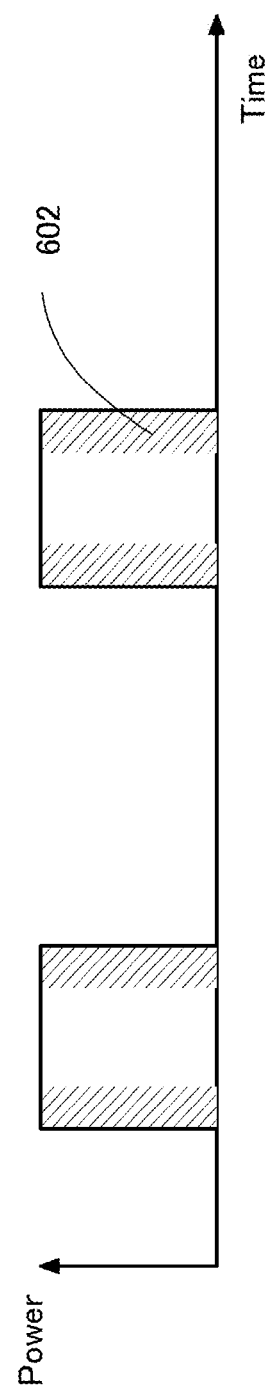
FIG. 6A
FIG. 6B

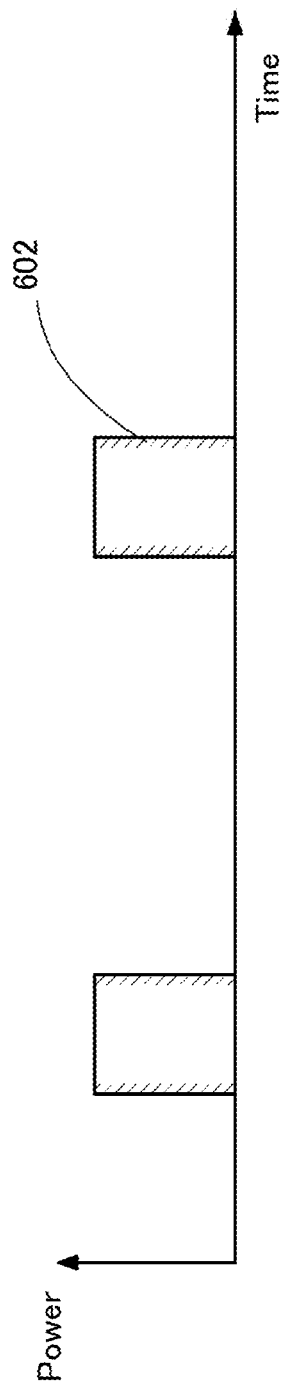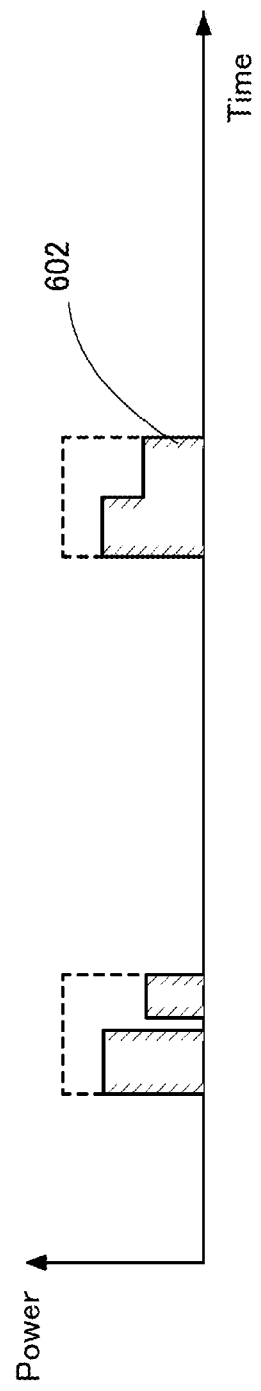
FIG. 7A
FIG. 7B

300

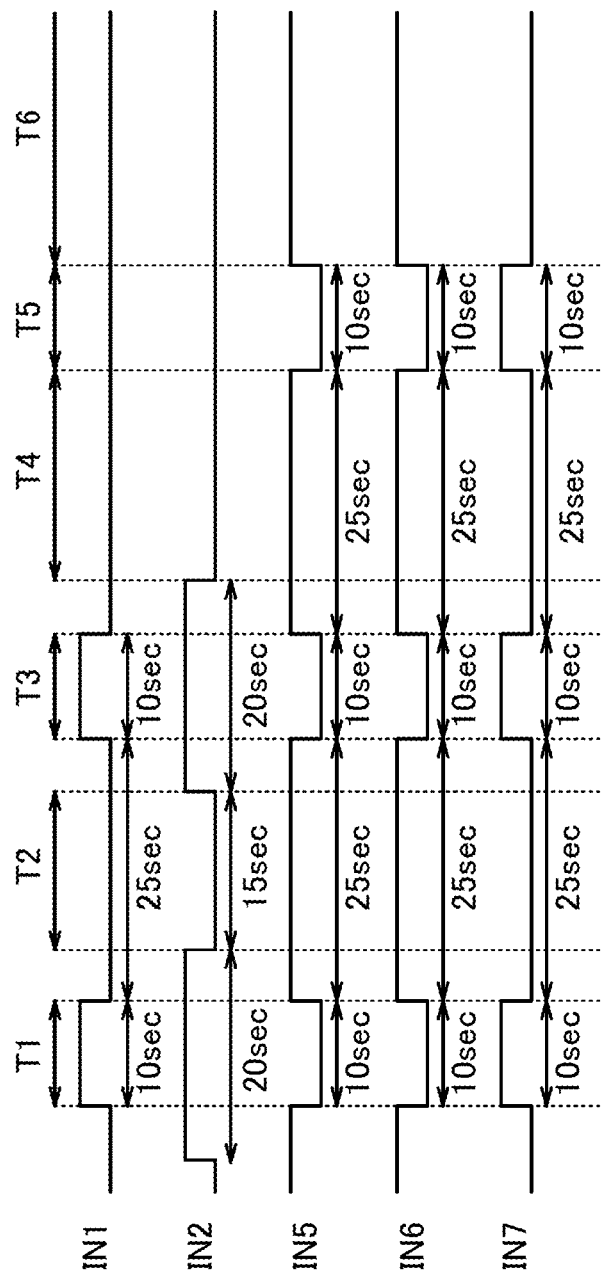

MEMORY DEVICE AND SEMICONDUCTOR DEVICE

BACKGROUND OF THE INVENTION

1. Field of the Invention

The present invention relates to a semiconductor device. In particular, the present invention relates to, for example, a memory device and a semiconductor device including the memory device.

2. Description of the Related Art

Semiconductor elements of semiconductor devices such as central processing units (CPUs) has been downsized to increase operation speed and integration degree, and now transistors with a channel length of approximately 30 nm are manufactured. On the other hand, downsizing semiconductor elements leads to an increase in power consumption (leakage power) due to leakage current of transistors in CPUs. Specifically, most of power consumption of conventional CPUs is power consumption (operation power) at the time of calculations, while leakage power accounts for at least 10% of power consumption of CPUs in recent years.

In particular, a cache often has large capacity to achieve high CPU throughput, and corresponds to an integrated circuit whose leakage power is the largest among elements of a CPU. In particular, buffer memory device such as caches or registers in a CPU for portable devices such as mobile phones and portable information terminals occupy more than or equal to half a chip area or more than or equal to half the number of transistors; therefore, a reduction in leakage power of buffer memory devices is highly needed. Accordingly, attention is paid to a technique called normally-off computing in which power consumption of a CPU is reduced in such a manner that the supply of power to integrated circuits such as caches that are inactive is stopped by power gating (Non-Patent Document 1). The supply of power is stopped within a short time in the normally-off computing; accordingly, a memory element used as a buffer memory device is required to not only be nonvolatile but also operate at a high speed. Flash memories, which are nonvolatile memories, are incapable of performing such high-speed operation and have an insufficient number of data rewrites for use as a buffer memory device of a CPU.

In view of the above, a memory device in which a nonvolatile memory element which can operate at a higher speed and has a larger number of data rewrites than a flash memory is provided in addition to a volatile memory element which is conventionally used for a buffer memory device is proposed. Patent Document 1 discloses an electronic circuit which includes a volatile data holding circuit using an inverter and a ferro-electric capacitor and in which data can be held by storing the data in the ferro-electric capacitor even when the supply of power is stopped.

Patent Document

[Patent Document 1] Japanese Published Patent Application No. 2003-152506

Non-Patent Document

[Non-Patent Document 1] Koji Ando, "FUKIHATSUSEI JIKIMEMORI" [Nonvolatile Magnetic Memory], *FED Review*, vol. 1, No. 14, 14 Mar. 2002.

SUMMARY OF THE INVENTION

A normally-off computer has a problem in that in power gating, a short period of stopping the supply of power is likely to result in an increase in power consumption of a CPU when a period of stopping the supply of power to equalize an electric power consumed by data saving and data recovery (overhead power) and an electric power saved by stopping the supply of power, that is, a break even time (BET) is long. Therefore, a reduction in power consumed by data saving and data recovery is important to achieve low power consumption.

Further, in the normally-off computer, if time (overhead time) required for data saving and data recovery in accordance with the stop of supply of power in power gating is not short, it is hard to stop the supply of power during a period when the CPU is not operated. As the overheat time is shorter and the BET is shorter, supply of power is more favorably stopped even in a short amount of time when the CPU is not operated and power gating having fine time granularity is achieved.

In view of the foregoing technical background, an object of one embodiment of the present invention is to provide a memory device with reduced overhead power. Another object of one embodiment of the present invention is to provide a memory device with shorter overhead time and reduced overhead power. Another object of one embodiment of the present invention is to provide a semiconductor device with low power consumption including the memory device.

One embodiment of the present invention is a memory device including a first circuit retaining data in a first period during which a power supply voltage is supplied; a second circuit saving the data retained in the first circuit in the first period and retaining the data saved from the first circuit in a second period during which the power supply voltage is not supplied; and a third circuit saving the data retained in the second circuit in the second period and retaining the data saved from the second circuit in a third period during which the power supply voltage is not supplied. The third circuit includes a transistor in which a channel formation region is provided in an oxide semiconductor film and a capacitor to which a potential corresponding to the data is supplied through the transistor.

Another embodiment of the present invention is a memory device including a first circuit retaining data in a first period during which a power supply voltage is supplied; a second circuit saving the data retained in the first circuit in the first period and retaining the data saved from the first circuit in a second period during which the power supply voltage is not supplied; and a third circuit saving the data retained in the second circuit in the second period and retaining the data saved from the second circuit in a third period during which the power supply voltage is not supplied. The second circuit includes a first transistor and a first capacitor to which a first potential corresponding to the data is supplied through the first transistor. The third circuit includes a second transistor in which a channel formation region is provided in an oxide semiconductor film and a second capacitor to which a second potential corresponding to the data is supplied through the second transistor. A capacitance of the second capacitor is larger than a capacitance of the first capacitor.

The memory device according to one embodiment of the present invention includes a third transistor in addition to the above-described structure. The data retained in the third circuit is recovered to the first circuit by selection between a conduction state and a non-conduction state of the third transistor in accordance with the second potential.

According to one embodiment of the present invention, a memory device with reduced overhead power is provided. Alternatively, according to one embodiment of the present invention, a memory device with shortened overheat time and reduced overhead power is provided. Alternatively, according to one embodiment of the present invention, a semiconductor device with reduced power consumption is provided with the use of the memory device.

BRIEF DESCRIPTION OF THE DRAWINGS

FIGS. 6A and 6B schematically illustrate power consumption.
FIGS. 7A and 7B schematically illustrate power consumption.
FIG. 42 is a timing chart.

DETAILED DESCRIPTION OF THE INVENTION

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

The present invention includes in its category the following semiconductor devices in which a memory device can be used: integrated circuits such as microprocessors, image processing circuits, digital signal processors (DSPs), and microcontrollers, radio frequency (RF) tags, and semiconductor display devices. The semiconductor display devices include the following in its category: liquid crystal display devices, light-emitting devices in which a light-emitting element typified by an organic light-emitting element is provided for each pixel, electronic paper, digital micromirror devices (DMDs), plasma display panels (PDPs), field emission displays (FEDs), and other semiconductor display devices in which a memory device is included in a driver circuit or a control circuit.

(Embodiment 1)

Figure 1:
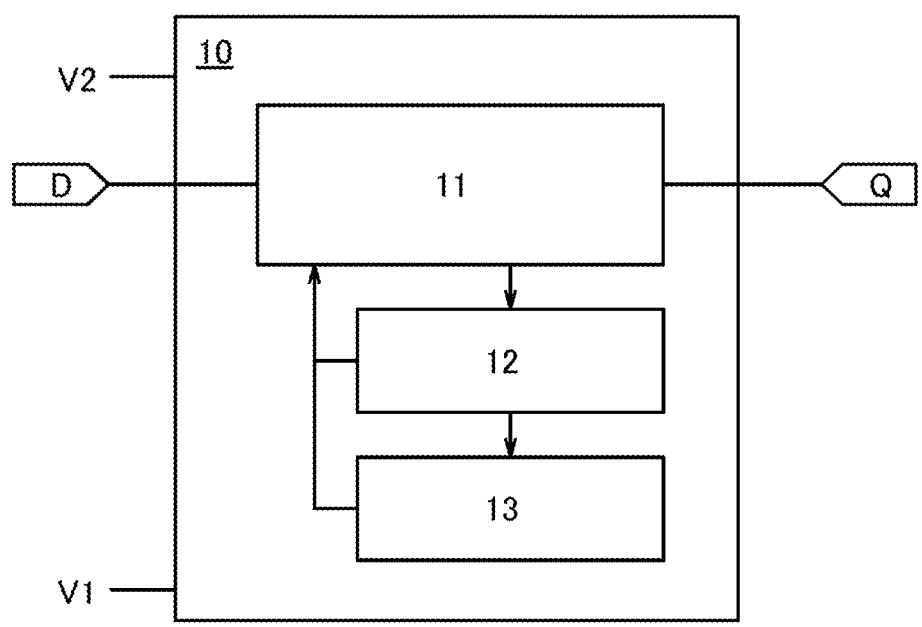
FIG. 1 illustrates a structure of a memory device.

A structure example of a memory device according to one embodiment of the present invention is illustrated in FIG. 1. A memory device 10 in FIG. 1 includes a first memory circuit 11, a second memory circuit 12, and a third memory circuit 13.

In addition, as a power supply voltage, potential difference between a potential V1 and a potential V2 is supplied to the memory device 10. One of the potential V1 and the potential V2 is at a high level, and the other is at a low level. Hereinafter, the case where the potential V1 is at a low level and the potential V2 is at a high level is given as an example to describe the structure example of a memory device according to one embodiment of the present invention.

The first memory circuit 11 has a function of retaining data when a signal D including the data is input in a period during which the power supply voltage is supplied to the memory device 10. Thus, a signal Q including the retained data is output from the first memory circuit 11.

The second memory circuit 12 has a function of reading the data retained by the first memory circuit 11 and saving the data in the period during which the power supply voltage is supplied to the memory device 10. Specifically, the second memory circuit 12 includes at least a capacitor and a transistor for controlling supply, retention, and release of charge in the capacitor. Then, charge is supplied to the capacitor through the transistor which is in a conduction state in accordance with a potential which corresponds to the data held by the first memory circuit 11. Therefore, the data retained by the first memory circuit 11 is saved in the second memory circuit 12.

Further, the second memory circuit 12 has a function of retaining the saved data in a period during which the power supply voltage is not supplied to the memory device 10. Specifically, the transistor included in the second memory circuit 12 is brought into a non-conduction state and the charge in the capacitor is kept, whereby the data is retained.

The period during which data is retained in the second memory circuit 12 when the power supply voltage is not supplied to the memory device 10 is determined by the off-state current of the transistor included in the second memory circuit 12 and capacitance of the capacitor. The transistor in the second memory circuit 12 is brought into the non-conduction state, whereby the data is retained in a period determined by off-state current of the transistor and capacitance of the capacitor, even in the period during which the power supply voltage is not supplied to the memory device 10.

Note that unless otherwise specified, in this specification, off-state current of an n-channel transistor is current that flows between a source and a drain when the potential of the drain is higher than that of the source or that of a gate while the potential of the gate is 0 V or lower in the case of the potential of the source used as a reference. Alternatively, in this specification, off-state current of a p-channel transistor is current that flows between a source and a drain when the potential of the drain is lower than that of the source or that of a gate while the potential of the gate is 0 V or higher in the case of the potential of the source used as a reference.

The third memory circuit 13 has a function of reading the data retained by the second memory circuit 12 and saving the data, in the period during which the power supply voltage is not supplied to the memory device 10. Specifically, the third memory circuit 13 includes at least a capacitor and a transistor for controlling supply, retention, and release of charge in the capacitor. Then, charge is supplied to the capacitor through the transistor which is in the conduction state in accordance with a potential which corresponds to the data held by the second memory circuit 12. Therefore, the data retained by the second memory circuit 12 is saved in the third memory circuit 13.

The off-state current of the transistor included in the third memory circuit 13 is preferably extremely smaller than that of the transistor included in the second memory circuit 12. A transistor in which a channel formation region is formed in a film of a semiconductor having a wider band gap and lower intrinsic carrier density than silicon has extremely small off-state current and thus is preferably used as the third memory circuit 13. Examples of such a semiconductor are an oxide semiconductor and gallium nitride that have a band gap more than twice as wide as that of silicon. A transistor including the semiconductor can have a much lower off-state current than a transistor including a conventional semiconductor such as silicon or germanium. Therefore, with the use of the third memory circuit 13 which includes the transistor having the above-described structure, leakage of the charge held in the capacitor is prevented in the third memory circuit 13. Thus, the third memory circuit 13 retains the saved data in the period during which the power supply voltage is not supplied to the memory device 10 for a longer time than the second memory circuit 12.

The capacitance of the capacitor included in the third memory circuit 13 is desirably larger than that of the capacitor included in the second memory circuit 12. When the capacitance of the capacitor included in the third memory circuit 13 is larger than that of the capacitor included in the second memory circuit 12, the third memory circuit 13 retains the saved data in the period during which the power supply voltage is not supplied to the memory device 10 for a longer time than the second memory circuit 12.

Further, since the capacitance of the capacitor included in the second memory circuit 12 is smaller than that of the capacitor included in the third memory circuit 13, the data retained in the first memory circuit 11 can be read at high speed in the period during which the power supply voltage is supplied to the memory device 10. Thus, for example, in a period shorter than the cycle of a signal CLK for controlling the operation of the memory device 10, time needed to save the data is shortened to the degree that the data retained in the first memory circuit 11 is saved in the second memory circuit 12.

In one embodiment of the present invention, in the period during which the power supply voltage is supplied to the memory device 10, data is saved from the first memory circuit 11 to the second memory circuit 12 capable of high-speed data reading, and then, the data saved in the second memory circuit 12 is saved in the third memory circuit 13 capable of retaining data for a longer time in the period during which the power supply voltage is not supplied. That is, data is saved not before but after the supply of the power supply voltage is stopped. Therefore, time needed to stop the supply of the power supply voltage is shortened, compared to the memory device in which data is saved before the supply of the power supply voltage is stopped. As a result, overhead time is shortened.

In addition, power required for data writing depends on the amount of charge that is charged in the capacitor in the second memory circuit 12 and the third memory circuit 13 in which charge of the capacitor is retained by the transistor. Thus, overhead power consumed by data saving is suppressed, compared to the case of using a magnetoresistive random access memory (MRAM) or the like. As a result, in the memory device 10, BET is shortened than the case of using the MRAM and thus power consumption in the semiconductor device is suppressed.

Accordingly, in the semiconductor device using the memory device according to one embodiment of the present invention, power gating having fine time granularity is achieved and the effect of reducing power consumption which is obtained by the power gating having fine time granularity is increased.

Figure 2:
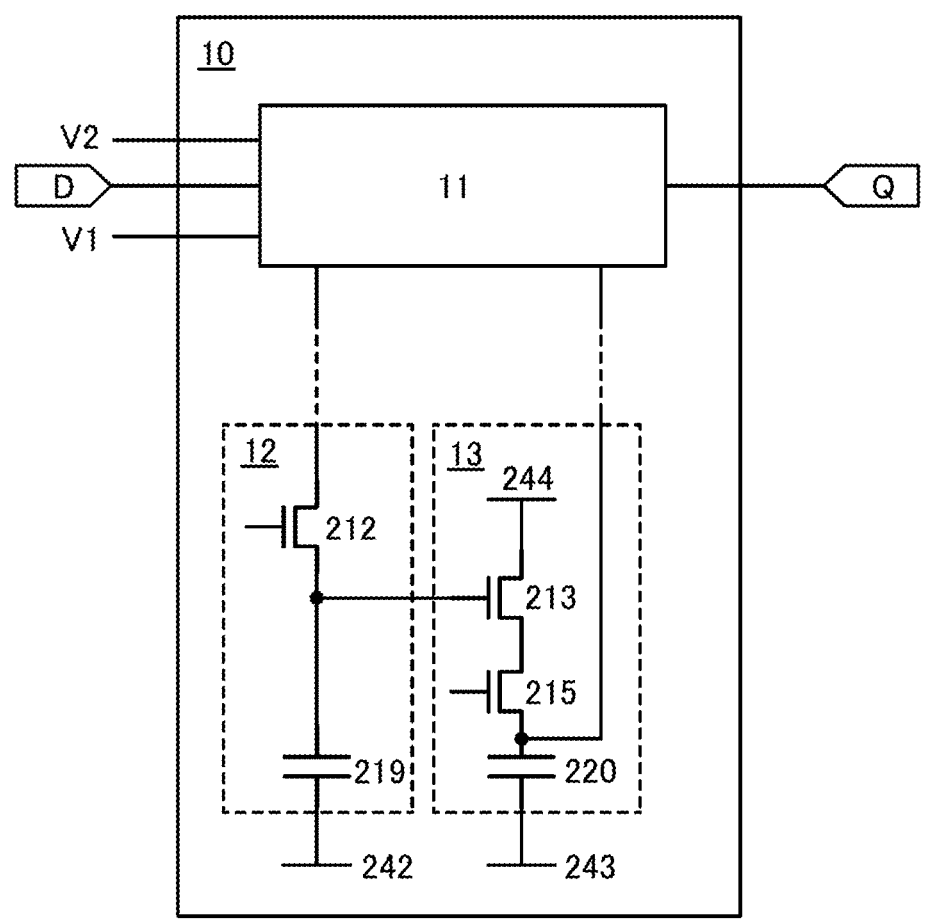
FIG. 2 illustrates a structure of a memory device.

Next, an example of a more specific structure of the memory device 10 shown in FIG. 1 is shown in FIG. 2. In the memory device 10 shown in FIG. 2, the second memory circuit 12 includes a transistor 212 and a capacitor 219, and the third memory circuit 13 includes a transistor 213, a transistor 215, and a capacitor 220.

The transistor 212 has a function of supplying a potential corresponding to data retained in the first memory circuit 11 to the capacitor 219. The conduction state or the non-conduction state of the transistor 213 is selected in accordance with the potential supplied to the capacitor 219. The transistor 215 has a function of supplying a potential of a wiring 244 to the capacitor 220 when the transistor 213 is in the conduction state. It is desirable that off-state current of the transistor 215 be extremely small.

Specifically, one of a source and a drain of the transistor 212 is connected to the first memory circuit 11. The other of the source and the drain of the transistor 212 is connected to one electrode of the capacitor 219 and a gate of the transistor 213. The other electrode of the capacitor 219 is connected to the wiring 242. One of a source and a drain of the transistor 213 is connected to the wiring 244. The other of the source and the drain of the transistor 213 is connected to one of a source and a drain of the transistor 215. The other of the source and the drain of the transistor 215 is connected to one electrode of the capacitor 220 and the first memory circuit 11. The other electrode of the capacitor 220 is connected to the wiring 243.

Note that the term "connection" in this specification refers to electrical connection and corresponds to the state in which current, a potential, or voltage can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted.

The names of the "source" and the "drain" of the transistor interchange with each other depending on the conductivity types of the transistor or the levels of potentials applied to the respective electrodes. In general, in an n-channel transistor, an electrode to which a lower potential is applied is called a source, and an electrode to which a higher potential is applied is called a drain. In a p-channel transistor, an electrode to which a low potential is applied is called a drain, and an electrode to which a high potential is applied is called a source. In this specification, although connection relation of the transistor is described assuming that the source and the drain are fixed in some cases for convenience, actually, the names of the source and the drain interchange with each other depending on the relation of the potentials.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Although FIG. 2 shows an example in which the third memory circuit 13 is connected to the first memory circuit 11, a circuit for reading data retained in the third memory circuit 13 and supplying the data to the first memory circuit 11 may be provided in the memory device 10.

(Embodiment 2)

Next, an example of the structure of the memory device 10 shown in FIG. 1 and FIG. 2 is described.

Figure 3:
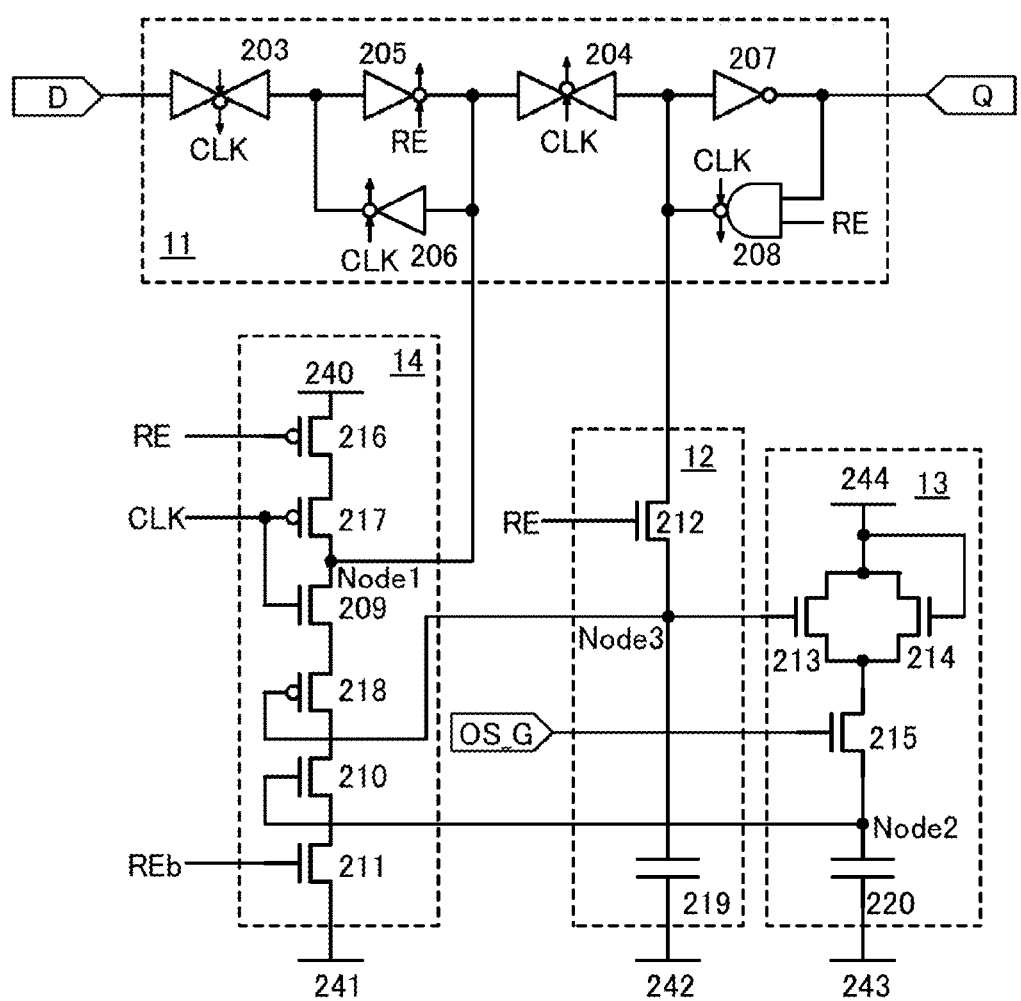
FIG. 3 illustrates a structure of a memory device.

FIG. 3 shows an example of a circuit diagram of the memory device 10.

The memory device 10 includes the first memory circuit 11, the second memory circuit 12, the third memory circuit 13, and a reading circuit 14. The first memory circuit 11 stores data during a period in which potential difference between the low-level potential V1 and the high-level potential V2 is supplied as a power supply voltage.

The first memory circuit 11 includes a transmission gate 203, a transmission gate 204, an inverter 205, an inverter 206, an inverter 207, and a NAND 208. Note that the first memory circuit 11 may further include another circuit element such as a diode, a resistor, or an inductor, as needed.

The transmission gate 203 determines whether to output a signal based on the signal CLK. Specifically, the transmission gate 203 has a function of supplying a signal D including data to an input terminal of the inverter 205 when the potential of the signal CLK is a low level. Further, the transmission gate 203 becomes high impedance and stops the supply of the signal D to the input terminal of the inverter 205 when the signal CLK has a high-level potential.

The inverter 205 determines whether to output a signal based on the signal RE. Specifically, the inverter 205 has a function of inverting the polarity of a signal which is supplied to the input terminal and supplying the signal to an input terminal of the transmission gate 204 and an input terminal of the inverter 206 when the potential of the signal RE is at a high level. Further, the inverter 205 becomes high impedance and stops the supply of the signal to the input terminal of the transmission gate 204 and the input terminal of the inverter 206 when the potential of the signal RE is at a low level.

The inverter 206 determines whether to output a signal based on the signal CLK. Specifically, the inverter 206 has a function of inverting the polarity of a signal which is supplied to the input terminal and supplying the signal to an input terminal of the inverter 205 when the potential of the signal CLK is at a high level. Further, the inverter 206 becomes high impedance and stops the supply of the signal to the input terminal of the inverter 205 when the potential of the signal CLK is at a low level.

The transmission gate 204 determines whether to output a signal based on the signal CLK. Specifically, the transmission gate 204 has a function of supplying the signal supplied to the input terminal to an input terminal of the inverter 207 when the potential of the signal CLK is at a high level. Further, the transmission gate 204 becomes high impedance and stops the supply of the signal to the input terminal of the inverter 207 when the potential of the signal CLK is at a low level.

The inverter 207 has a function of supplying a signal Q to a first input terminal of the NAND 208. The signal Q is obtained by inverting the polarity of the potential supplied to the input terminal of the inverter 207.

The NAND 208 is a 2-input NAND and determines whether to output a signal based on the signal CLK. A second input terminal of the NAND 208 is supplied with the signal RE. Specifically, the NAND 208 has a function of supplying a signal to an input terminal of the inverter 207 when the potential of the signal CLK is at a low level in accordance with the signal input to the first input terminal and the second input terminal. In addition, the NAND 208 becomes high impedance and stops supply of a signal irrespective of the signal input to the first input terminal and the second input terminal, when the potential of the signal CLK is at a high level.

The second memory circuit 12 includes the n-channel transistor 212 and the capacitor 219. The third memory circuit 13 includes the n-channel transistors 213, 214, and 215 and the capacitor 220. The reading circuit 14 includes n-channel transistors 209, 210, and 211 and p-channel transistors 216, 217, and 218. Note that another circuit element such as a diode, a resistor, or an inductor may be further included in the second memory circuit 12, the third memory circuit 13, and the reading circuit 14, as needed.

The transistors 216, 217, 209, 218, 210, and 211 are connected in series in this order between a wiring 240 to which the potential V2 is applied and a wiring 241 to which the potential V1 is applied. Specifically, one of a source and a drain of the transistor 216 is connected to the wiring 240, and the other is connected to one of a source and a drain of the transistor 217. The other of the source and the drain of the transistor 217 is connected to one of a source and a drain of the transistor 209. The other of the source and the drain of the transistor 209 is connected to one of a source and a drain of the transistor 218. The other of the source and the drain of the transistor 218 is connected to one of a source and a drain of the transistor 210. The other of the source and the drain of the transistor 210 is connected to one of a source and a drain of the transistor 211. The other of the source and the drain of the transistor 211 is connected to the wiring 241.

A gate of the transistor 216 and a gate of the transistor 212 are supplied with the signal RE. A gate of the transistor 211 is supplied with a signal REb which is obtained by inverting the polarity of the potential of the signal RE. A gate of the transistor 217 and a gate of the transistor 209 are supplied with the signal CLK. A gate of the transistor 215 is supplied with a signal OS_G.

A gate of the transistor 218 is connected to the other of the source and the drain of the transistor 212, the gate of the transistor 213, and the one electrode of the capacitor 219. The other electrode of the capacitor 219 is connected to the wiring 242 to which the potential V1 is applied.

A gate of the transistor 210 is connected to the other of the source and the drain of the transistor 215 and one electrode of the capacitor 220. The other electrode of the capacitor 220 is connected the wiring 243 to which the potential V1 is applied.

Note that the wiring 240 may be connected to the wiring 244. In addition, the wiring 241, the wiring 242, and the wiring 243 may be connected to one another.

The one of the source and the drain of the transistor 213 is connected to the wiring 244 to which the potential V2 is applied, one of a source and a drain of the transistor 214, and a gate of the transistor 214. The other of the source and the drain of the transistor 213 is connected to the one of the source and the drain of the transistor 215 and the other of the source and the drain of the transistor 214.

An output terminal of the inverter 205, the input terminal of the transmission gate 204, and the input terminal of the inverter 206 which are included in the first memory circuit 11 are connected to the other of the source and the drain of the transistor 217 and the one of the source and the drain of the transistor 209 which are included in the reading circuit 14.

The output terminal of the transmission gate 204, the input terminal of the inverter 207, and an output terminal of the NAND 208 which are included in the first memory circuit 11 are connected to the one of the source and the drain of the transistor 212 included in the second memory circuit 12.

In one embodiment of the present invention, the low off-state current of the transistor 215 leads to a reduction in the amount of charge leaked from the capacitor 220, thereby ensuring a long period during which data is retained in the third memory circuit 13. A transistor where a channel formation region is formed in a semiconductor film, a band gap of which is wider than that of silicon and an intrinsic carrier density of which is lower than that of silicon, can have an off-state current much lower than that of a transistor where a channel formation region is formed in a semiconductor film of silicon, germanium, or the like. Therefore, the former is suitable for the transistor 215.

In particular, a highly purified oxide semiconductor (a purified oxide semiconductor) obtained by reduction of impurities such as moisture or hydrogen which serve as electron donors (donors) and reduction of oxygen vacancies is an intrinsic (i-type) semiconductor or a substantially i-type semiconductor. For this reason, a transistor having a channel formation region in a highly purified oxide semiconductor film has extremely small off-state current and high reliability.

Next, an example of operation of the memory device 10 shown in FIG. 3 will be described with reference to a timing chart shown in FIG. 4.

First, in a period T1 to a period T3, potential difference between the potential V1 and the potential V2 is applied to the memory device 10 as a power supply voltage ("Power Supply"). Therefore, the potential V1 and the potential V2 are applied to the wirings 241 to 243 and the wirings 240 and 244, respectively.

In the period T1, the potential of the signal RE is set at a high level, the potential of the signal OS_G is set at a high level, and the potential of the signal CLK alternately is changed to a high level and a low level at predetermined intervals. Thus, a node (Node 1) connected to the other of the source and the drain of the transistor 217 and the one of the source and the drain of the transistor 209 is applied with a potential corresponding to data that is written to the first memory circuit 11. Further, a node (Node 3) connected to the other of the source and the drain of the transistor 212 and the one electrode of the capacitor 219 is also applied with a potential corresponding to data that is written to the first memory circuit 11. The potential corresponding to the data and applied to the Node 3 is retained by the capacitor 219. Further, the node (Node 2) connected to the other of the source and the drain of the transistor 215 and the one electrode of the capacitor 220 is applied with a high-level potential through the wiring 244. The potential applied to the Node 2 is retained by the capacitor 220.

In the next period T2, the potential of the signal RE is kept at a high level; however, the potential of the signal OS_G is set at a low level and the potential of the signal CLK is set at a high level. Thus, the transmission gate 203 becomes high impedance and the supply of the signal D to the memory device 10 is stopped, so that data that is last written in the period T1 is retained in the first memory circuit 11. Therefore, a potential corresponding to the data retained in the first memory circuit 11 is retained at the Node 1. In addition, a potential corresponding to the data retained in the first memory circuit 11 is held in the Node 3 by the capacitor 219. The transistor 215 is brought into the non-conduction state, so that a high-level potential is kept at the Node 2 by the capacitor 220.

Through the above operation in the period T2, data retained in the first memory circuit 11 is saved in the second memory circuit 12.

In the next period T3, the potential of the signal RE is changed from a high level to a low level. The signal OS_G and the signal CLK are kept at a low-level potential and a high-level potential, respectively. Thus, the inverter 205 becomes high impedance and the transistor 212 is brought into the non-conduction state. Therefore, in the period T3, as in the period T2, potentials corresponding to data are kept at the Node 1 and the Node 3. Note that in the period T3, even if high-level potentials are kept at the Node 1 and the Node 3 just before the period T3, the potentials of the Node 1 and the Node 3 decrease a little as time passes due to leakage current. In the timing chart of FIG. 4, the case where a high-level potential is kept at each of the Node 1 and the Node 3 is exemplified. Further, since the transistor 215 with extremely low off-state current is brought into the non-conduction state, a high-level potential is kept at the Node 2.

In the next period T4, the supply of the power supply voltage to the memory device 10 is stopped. Thus, the potential V1 is applied to the wirings 240 to 244. The potential of the signal RE is kept at a low-level, and the potential of the signal OS_G is kept at a low-level. The potential of the signal CLK is changed to a low level. Accordingly, in the period T4, the transistors 216 and 217 are brought into the conduction state, so that the potential of the wiring 240 is supplied to the Node 1. Further, in the period T4, as in the period T3, a potential corresponding to data is kept at the Node 3. However, in the period T4, even if a high-level potential is kept at the Node 3 at the beginning of the period T3, the potential of the Node 3 is decreased a little as time passes due to leakage current. In addition, a high-level potential is kept at the Node 2 because the transistor 215 with extremely small off-state current is maintained in the non-conduction state.

In the next period T5, a state in which the supply of the power supply voltage to the memory device 10 is stopped is kept. The potentials of the signal RE and the signal CLK are kept at a low level. The potential of the signal OS_G is changed to a high level. Thus, in the period T5, since the transistors 216 and 217 are kept in the conduction state, the potential of the wiring 240 is supplied to the Node 1. In the period T5, since the transistor 215 is brought into the conduction state, the potential of the Node 2 is determined whether the transistor 213 is in the conduction state or the non-conduction state. For example, in the case where a low-level potential is kept at the Node 3, the transistor 213 is in the non-conduction state; thus, a high-level potential is kept at the Node 2. For example, in the case where a high-level potential is kept at the Node 3, the transistor 213 is in the conduction state. Since the supply of the power supply voltage to the memory device 10 is stopped, the wiring 244 has the potential V1. Thus, a low-level potential is supplied to the Node 2.

In the period T5, a potential corresponding to data saved from the first memory circuit 11 is kept at the Node 3. Therefore, in the period T5, data saved from the first memory circuit 11 to the second memory circuit 12 in the period T2 is saved in the third memory circuit 13.

In the next period T6, a state in which the supply of the power supply voltage to the memory device 10 is stopped is kept. The potential of the signal OS_G is changed to a low level and the transistor 215 is brought into the non-conduction state, so that the potential of the Node 2 is held. In the period T6, the potentials of the signal RE and the signal CLK are kept at a low level. In addition, in the case where a high-level potential is kept at the Node 3 in the period T5, the potential of the Node 3 is decreased to a low level depending on the length of the period T6. Alternatively, in the case where a low-level potential is kept at the Node 3 in the period T5, the Node 3 is kept at the low-level potential regardless of the length of the period T6.

Next, in periods T7 to T11, supply of the power supply voltage is restarted. Accordingly, the potential V1 is applied to the wirings 241 to 243 and the potential V2 is applied to the wirings 240 and 244. In the period T7, the potentials of the signal RE, the signal CLK, and the signal OS_G are kept at a low level. Thus, the transistors 216 and 217 are in the conduction state and the potential of the wiring 240 is supplied to the Node 1.

In the next period T8, the potentials of the signal RE and the signal OS_G are kept at a low level. The potential of the signal CLK is changed to a high level. The potential of the Node 3 is kept at a low level. Therefore, since the transistors 209, 218, and 211 are in the conduction state and the transistor 217 is in the non-conduction state in the period T8, the potential of the Node 1 is determined whether the transistor 210 is in the conduction state or the non-conduction state. For example, in the case where a low-level potential is kept at the Node 2, the transistor 210 is in the non-conduction state. Thus, a high-level potential is kept at the Node 1. In addition, for example, in the case where a high-level potential is kept at the Node 2, the transistor 210 is in the conduction state. Thus, a low-level potential is supplied to the Node 1 because the wiring 241 has the potential V1.

The Node 1 is connected to the output terminal of the inverter 205, the input terminal of the transmission gate 204, and the input terminal of the inverter 206 that are included in the first memory circuit 11. Thus, in the period T8, data saved from the second memory circuit 12 to the third memory circuit 13 in the period T5 is recovered to the first memory circuit 11.

Figure 4:
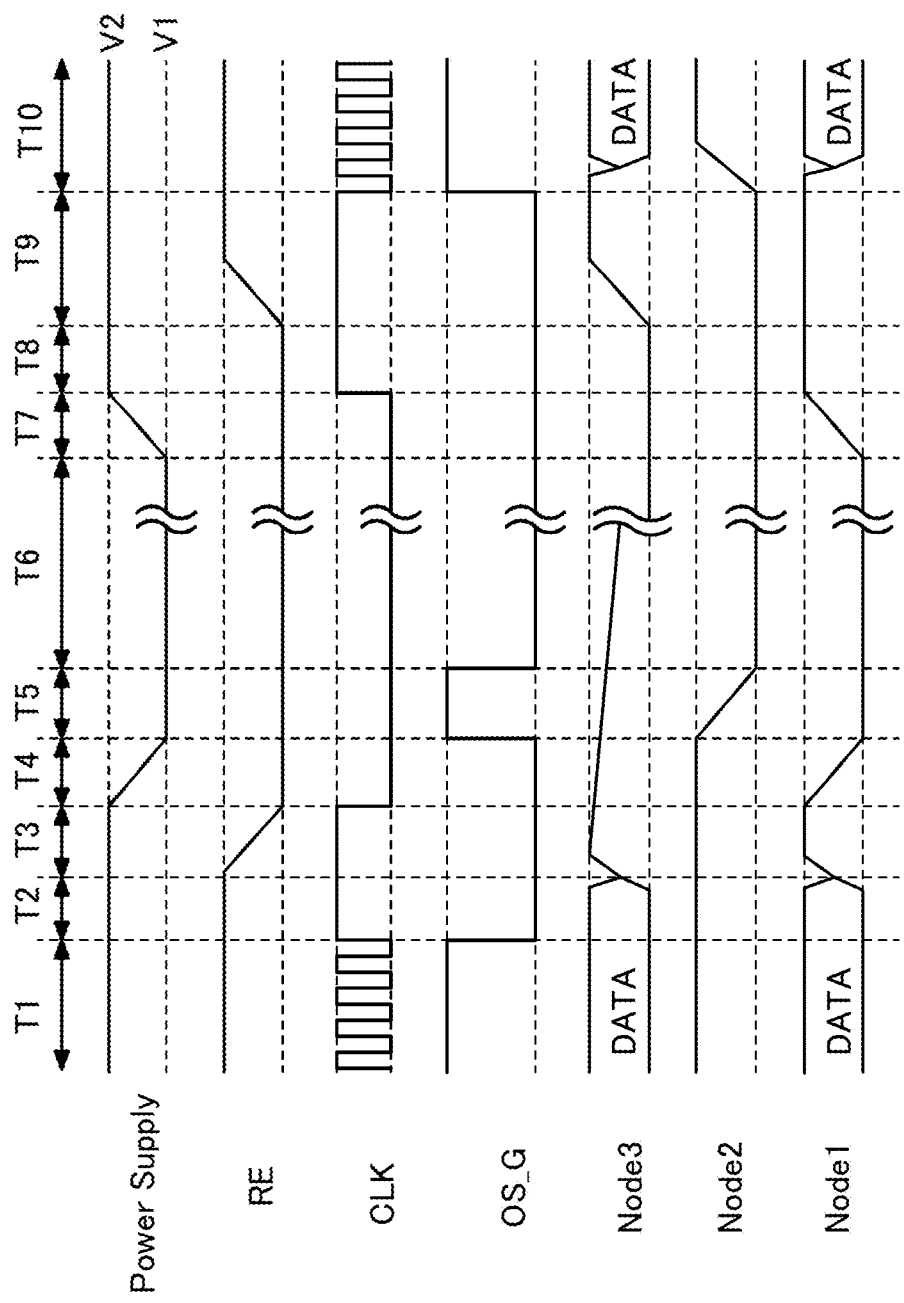
FIG. 4 is a timing diagrams showing operation of a memory device.

In the timing chart of FIG. 4, the case where a high-level potential is kept at the Node 1 in the period T6 is exemplified.

Note that in the case where the period T6 is short, there is a possibility that the potential of the Node 3 is not decreased to a low level in the period T8. In this case, since the transistor 218 is in the non-conduction state, a high-level potential is kept at the Node 1 as in the case where a low-level potential is kept at the Node 2. Therefore, in any cases, data saved from the second memory circuit 12 to the third memory circuit 13 is recovered in the first memory circuit 11 in the period T5.

In the next period T9, the potential of the signal RE is changed from a low level to a high level. The potentials of the signal CLK and the signal OS_G are kept at a high level and a low level, respectively. Thus, in the period T9, the inverter 205 starts to supply signals to the input terminal of the transmission gate 204 and the input terminal of the inverter 206. The NAND 208 starts to supply a signal that is obtained by inverting the polarity of the potential supplied to the first input terminal, to the input terminal of the inverter 207. The transmission gate 204 supplies the signal to the input terminal of the inverter 207. Therefore, the recovered data is retained in the first memory circuit 11 in the period T9.

In the period T9, the transistor 212 is brought into the conduction state and thus the potential corresponding to a potential kept in the first memory circuit 11 is applied to the Node 3. The potential applied to the Node 3 is kept by the capacitor 219.

In the timing chart of FIG. 4, the case where the potential V2 is applied to the Node 3 in the period T9 is exemplified.

In the next period T10, as in the period T1, the potential of the signal RE is at a high level, the potential of the signal OS_G is at a high level, and the potential of the signal CLK alternately is changed at a high level and a low level at predetermined intervals. Thus, a potential corresponding to data written to the first memory circuit 11 is applied to the Node 1. In addition, a potential corresponding to data written to the first memory circuit 11 is applied to the Node 3. The potential applied to the Node 3 and corresponding to data is kept by the capacitor 219. A high-level potential is applied to the Node 2. A potential applied to the Node 2 is kept by the capacitor 220.

When the memory device 10 is used in a buffer memory device such as a register or a cache memory included in a semiconductor device, data in the buffer memory device can be prevented from being lost by stop of supply of the power supply voltage. Further, the state before the stop of supply of the power supply voltage can be backed up in a short time, and the buffer memory device can return to the state before the stop of supply of the power supply voltage in a short time after supply of the power supply voltage restarts. Thus, in the semiconductor device, the supply of power supply voltage can be stopped a time as long as 60 seconds, or as short as several milliseconds. Therefore, a semiconductor device with reduced power consumption can be provided.

Note that in the memory device 10 shown in FIG. 3, operation mode (the conduction state or the non-conduction state) of the transistor 210 is selected in accordance with the potential kept by the capacitor 220 or the gate capacitance of the transistor 210, and data is read out based on the selected operation mode. Consequently, the original data can be accurately read even when a potential corresponding to the signal held in the capacitor 220 or the gate capacitance of the transistor 210 fluctuates to some degree.

In addition, as shown in FIG. 3, the memory device 10 includes the third memory circuit in which a potential of the node is kept by a transistor having extremely small off-state current. Thus, overhead power consumed in data saving and data recovery is suppressed, compared to the case of using an MRAM or the like as the third memory circuit. Specifically, a current necessary for data writing in an MRAM is said to be 50 μA to 500 μA. On the other hand, in the memory device 10 having the structure illustrated in FIG. 3, a current needed for data writing can be approximately 1/100 that of an MRAM because data is backed up by supply of charge to the capacitor 220. As a result, a power shut-off time during which the overhead power and power cut by power shut-off become equal in amount, that is, a break even time (BET) can be shorter in the memory device 10 having the structure illustrated in FIG. 3 than in a unit memory circuit including an MRAM. Consequently, the power consumption of the semiconductor device can be reduced.

In addition, in the memory device 10 shown in FIG. 3, data in the first memory circuit 11 is saved once in the second memory circuit 12 and then the data is saved from the second memory circuit 12 to the third memory circuit 13. Therefore, after the supply of the power supply voltage to the memory device 10 is stopped in the period T4, data is saved in the third memory circuit 13 in the period T5. Accordingly, the length from the period T2 during which operation for data saving is started to the period T4 during which supply of the power supply voltage is stopped is shortened. As a result, overhead time required for data saving is shortened and power gating having fine time granularity is achieved.

Note that in the memory device 10 in FIG. 3, an example in which the conduction state or the non-conduction state of the transistor 212 is selected (switched) using the signal RE is described. However, the switching of the transistor 212 may be controlled by a signal other than the signal RE and the transistor 212 may be in the non-conduction state in the periods T1 and T10. With this structure, in the periods T1 and T10, charge in the capacitor 219 is not charged and discharged and thus the first memory circuit 11 operates at higher speed. In this case, the switching of the transistor 212 is controlled so that the last data written to the first memory circuit 11, before supply of the power supply voltage to the memory device 10 is stopped, is saved from the first memory circuit 11 to the second memory circuit 12 in the period T2 or T3.

Note that in the case of controlling the switching of the transistor 212 with the signal RE, the number of signals required to control the operation of the memory device 10 is smaller than the case of controlling the switching of the transistor 212 with a signal other than the signal RE.

Further, in the memory device 10 in FIG. 3, in the case where a period during which supply of the power supply voltage to the memory device 10 is stopped is short and the potential V1 or V2 corresponding to data is kept at the Node 3 in this period, data recovery to the first memory circuit 11 is achieved without data saving from the second memory circuit 12 to the third memory circuit 13.

In the reading circuit 14 in the memory device 10 shown in FIG. 3, an example in which the switching of the transistors 217 and 209 is controlled with the signal CLK is shown. However, the switching of the transistors 217 and 209 may be controlled with a signal other than the signal CLK. In this case, the transistors 216 and 211 are not necessarily provided in the reading circuit 14 and the number of transistors used in the reading circuit 14 is reduced.

Note that in the case of controlling the switching of the transistors 217 and 209 with the signal CLK, the number of signals required to control the operation of the memory device 10 is smaller than the case of controlling the switching of the transistors 217 and 209 with a signal other than the signal CLK.

This embodiment can be implemented in appropriate combination with any of the other embodiments.

(Embodiment 3)

Next, as for data saving in the first memory circuit, difference of the operation between in a memory device in which data saving is performed in a single memory circuit and in the memory device described in Embodiments 1 and 2 will be described.

Figure 5:
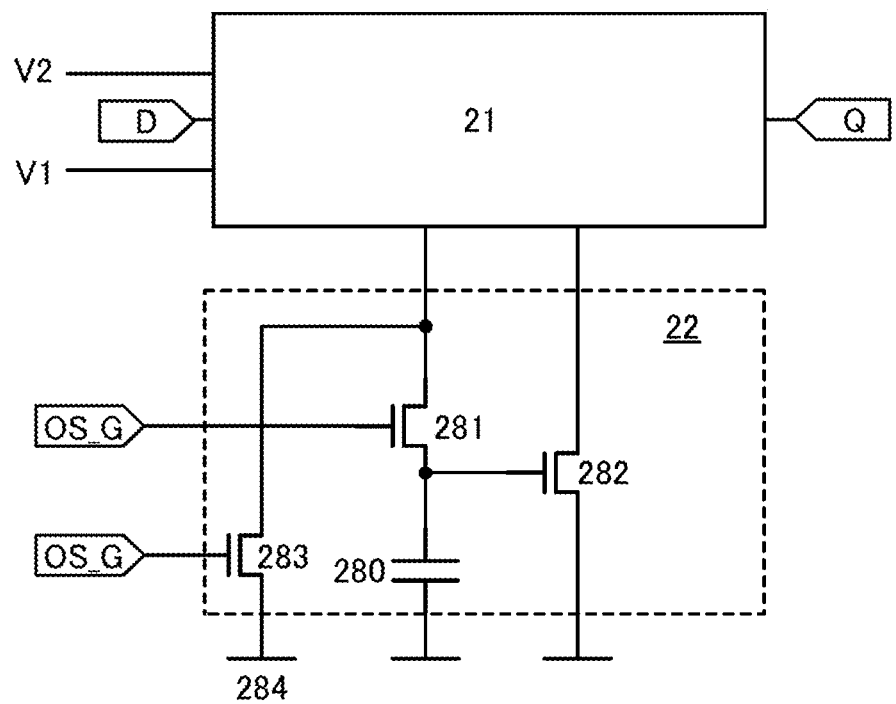
FIG. 5 illustrates a structure of a memory device.

First, an example of a specific structure of a memory device 20 which is a comparative example is shown in FIG. 5. The memory device 20 in FIG. 5 includes a first memory circuit 21 and a second memory circuit 22.

As the first memory circuit 11 included in the memory device 10 in FIG. 1, the first memory circuit 21 has a function of retaining data when the signal D including the data is input to the memory device 20 in a period during which the power supply voltage is supplied to the memory device 20. Thus, the signal Q including the retained data is output from the first memory circuit 21.

The second memory circuit 22 has a function of saving the data in the period during which the power supply voltage is supplied to the memory device 20. Specifically, the second memory circuit 22 includes a capacitor 280 and n-channel transistors 281, 282, and 283. The transistor 281 has a function of supplying a potential corresponding to data retained in the first memory circuit 21 to the capacitor 280. The conduction state or the non-conduction state of the transistor 282 is selected in accordance with the potential supplied to the capacitor 280. The transistor 283 has a function of supplying a potential of a wiring 284 to the capacitor 280 when the transistor 283 is in the conduction state. The off-state current of the transistor 281 is extremely small.

Table 1 below shows operation characteristics and circuit configuration of the memory device 20 shown in FIG. 5 and the memory device 10.

TABLE 1

| Structure | Memory device 20 | Memory device 10 |
|---|---|---|
| Saving control | Just before stop of supplying power supply voltage | Just after stop of supplying power supply voltage |
| Recovery control | Just after start of supplying power supply voltage | Just after start of supplying power supply voltage |
| Control | 1os + 1c + Reading circuit | 1os + 1c + Reading circuit + Writing circuit |
| Overhead time (in saving) | Selected | None (except precharge time) |
| Overhead power (in saving) | Charge/discharge of capacitance in selection | Charge/discharge of capacitance in selection |
| Frequency characteristics | Favorable | Favorable |

FIG. 6A schematically shows relation between power and time in a semiconductor device when clock gating is performed. When clock gating is performed, a power supply voltage is successively supplied to a semiconductor device and thus a power consumption 601 caused by leakage current is generated; thus, an effect of reducing power consumption is insignificant.

FIG. 6B schematically shows relation between power and time in a semiconductor device when power gating with the use of an external memory is performed. When power gating is performed using an external memory, power consumption caused by leakage current is reduced, compared to the case of clock gating; however, an overhead power 602 is generated before and after the power gating process. Further, it is difficult to perform power gating having fine time granularity because the overhead time is long; thus, an effect of reducing power consumption is insignificant.

FIG. 7A schematically shows relation between power and time in a semiconductor device when power gating is performed utilizing data saving in the memory device shown in FIGS. 1 to 3 and FIG. 5. When power gating is performed utilizing data saving in the memory device, power consumption caused by leakage current is reduced, compared to the case of clock gating. In addition, the overhead power 602 is sufficiently suppressed, compared to the case of power gating using an external memory. Further, since the overhead time is shortened, compared to the case of power gating using an external memory, power gating having finer time granularity than in FIG. 6B is achieved.

In the case of using the memory device shown in FIGS. 1 to 3, the overhead time is further shortened, compared to the case of using the memory device shown in FIG. 5; thus, power gating having finer time granularity is achieved. FIG. 7B schematically shows relation between power and time in a semiconductor device when power gating having fine time granularity is performed utilizing data saving in the memory device shown in FIGS. 1 to 3. By power gating having fine time granularity, power consumption is further reduced.

Figure 20:
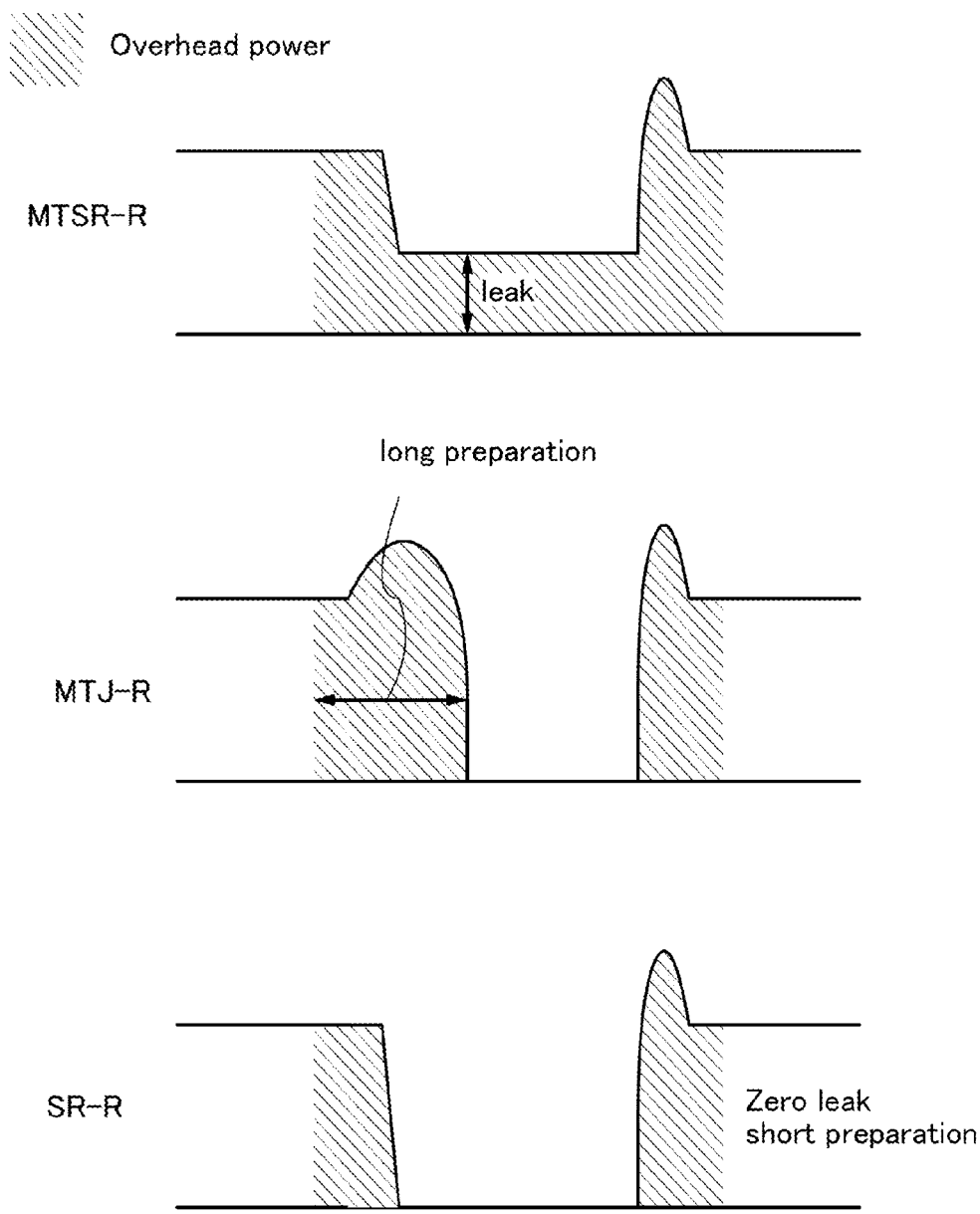
FIG. 20 illustrates diagrams comparing overhead power.
Figure 21:
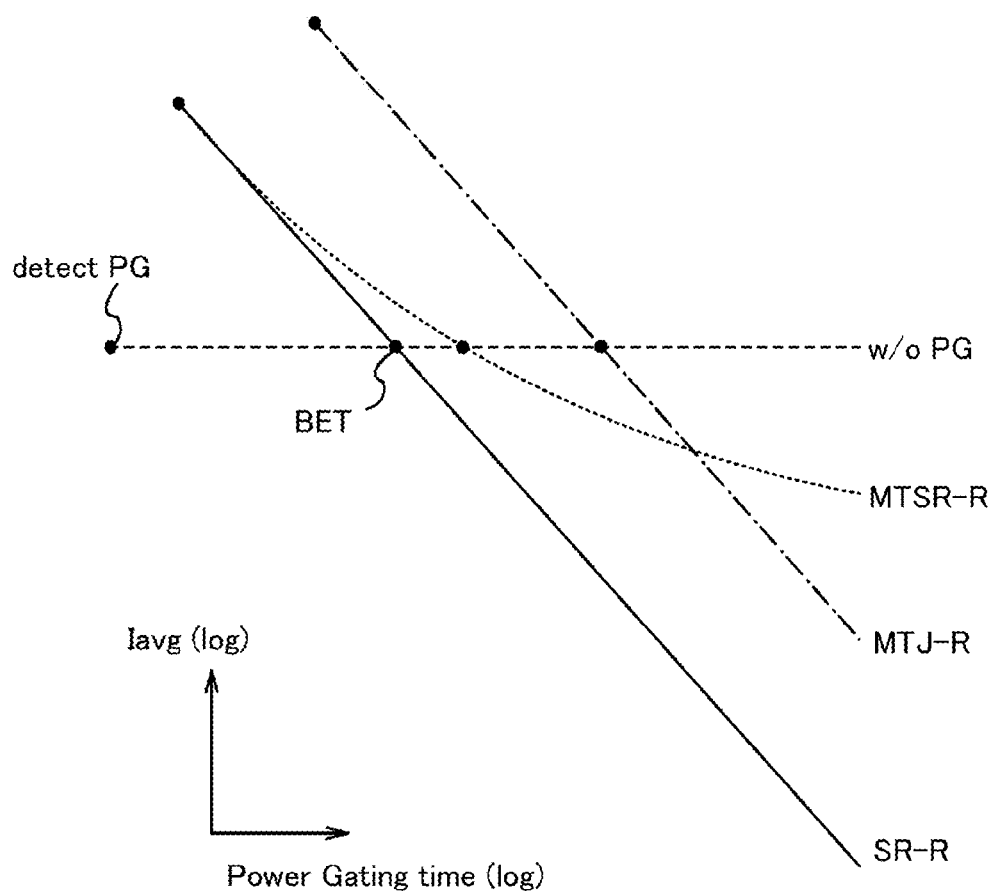
FIG. 21 shows relationship between power gating time and average values of current flowing in power gating.

FIG. 20 shows comparison of overhead power among power gating using a state retention register (MTSR-R), power gating using a register including a magnetic tunnel junction (MTJ) element (MTJ-R), and power gating using a memory device (SR-R) according to one embodiment of the present invention. Note that, in FIG. 20, a horizontal axis represents time and a vertical axis represents power consumption. FIG. 21 shows relationship between power gating time and average values of current flowing in power gating, in each of the MTSR-R, the MTJ-R, and the SR-R. Note that, in FIG. 21, a horizontal axis represents a power gating time (log plot) and a vertical axis represents an average value of current (log plot). As shown in FIGS. 20 and 21, power gating having fine time granularity is achieved in the power gating using the SR-R, compared to power gating using the MTSR-R and the MTJ-R. Further, the overhead and the power are smaller.

This embodiment can be combined with any of the other embodiments as appropriate.

(Embodiment 4)

Figure 8A:
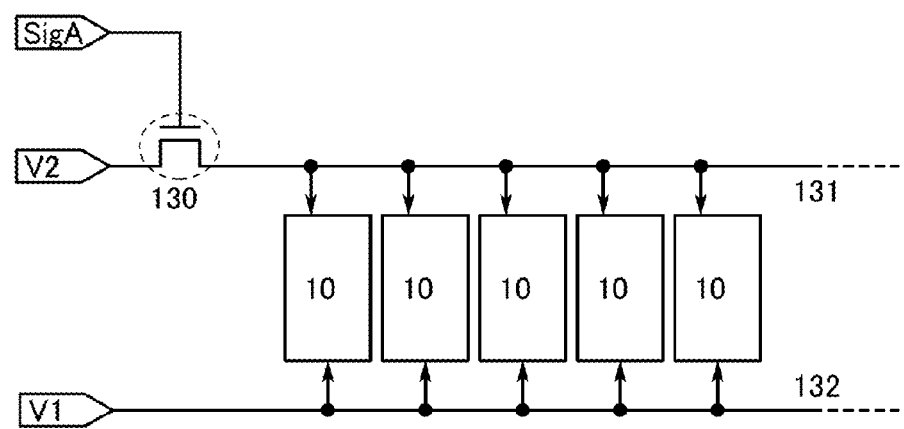
FIGS. 8A and 8B illustrate a structure of a memory device.

Next, a structure example of a memory device is shown in FIG. 8A. The memory device in FIG. 8A includes a switch 130 and a plurality of memory devices 10. In addition, the potential V2 applied to a wiring 131 through the switch 130 is supplied to each of the memory devices 10. Further, the potential V1 is applied to each of the memory devices 10 through a wiring 132.

FIG. 8A shows an example in which a single transistor is used as the switch 130. The switching of the switch 130 is controlled by a signal SigA. By the switch 130, the supply of the potential V2 to each of the memory devices 10 is controlled.

Figure 8B:
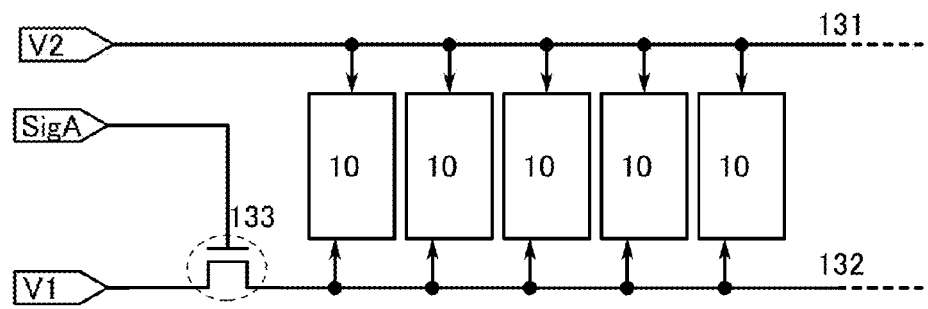

A memory device in FIG. 8B includes a switch 133 and a plurality of the memory devices 10. The potential V1 applied to the wiring 132 through the switch 133 is supplied to each of the memory devices 10. The potential V2 is applied to each of the memory devices 10 through the wiring 131.

FIG. 8B shows an example in which a single transistor is used as the switch 133. The switching of the switch 133 is controlled by the signal SigA. By the switch 133, the supply of the potential V1 to each of the memory devices 10 is controlled.

This embodiment can be combined with any of the other embodiments as appropriate.

(Embodiment 5)

Figure 9:
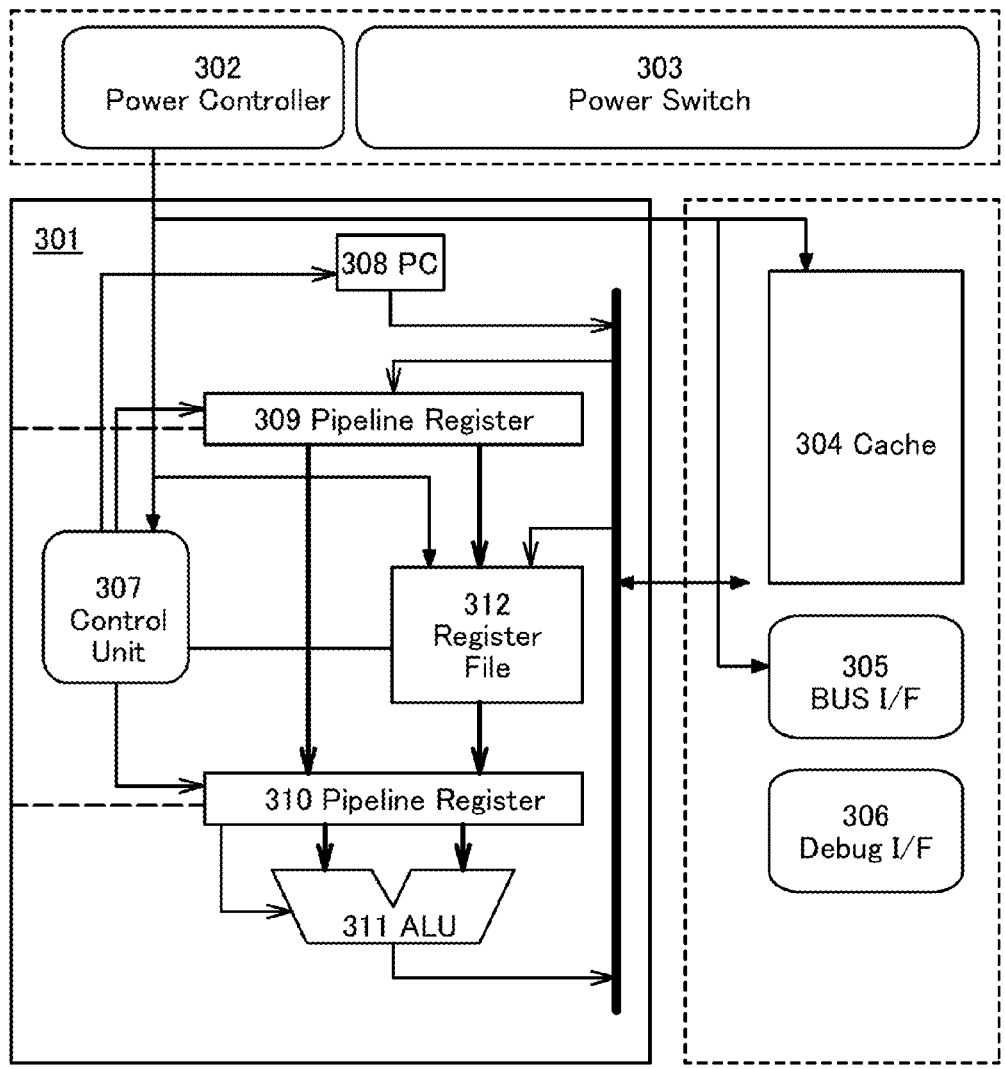
FIG. 9 illustrates a structure of a semiconductor device.

An example of a structure of a semiconductor device including the memory device of one embodiment of the present invention is illustrated in FIG. 9. A semiconductor device 300 in FIG. 9 includes a CPU core 301, a power controller 302, a power switch 303, a cache 304, a bus interface 305, and a debug interface 306. The CPU core 301 includes a control unit 307, a PC (program counter) 308, a pipeline register 309, a pipeline register 310, an arithmetic logic unit (ALU) 311, and a register file 312.

The control unit 307 has functions of totally controlling operations of the PC 308, the pipeline register 309, the pipeline register 310, the ALU 311, the register file 312, the cache 304, the bus interface 305, the debug interface 306, and the power controller 302; and decoding and executing instructions contained in a program such as input applications.

The ALU 311 has a function of performing a variety of arithmetic operations such as four arithmetic operations and logic operations.

The control unit 307 includes a main memory having a function of storing a program such as an application including a plurality of instructions, which is executed in the control unit 307, and data used for arithmetic processing performed by the ALU 311.

The cache 304 has a function of temporarily storing frequently-used data. The PC 308 is a register having a function of storing an address of an instruction to be executed next. The pipeline register 309 has a function of temporarily storing frequently-used instructions of instructions (programs) used in the control unit 307. Although not shown in FIG. 9, the semiconductor device 300 includes a cache controller for controlling the operation of the cache 304.

The register file 312 includes a plurality of registers including a general purpose register and can save data which is read out from the main memory of the control unit 307, data which is obtained during the arithmetic operations in the ALU 311, data which is obtained as a result of the arithmetic operations in the ALU 311, and the like.

The pipeline register 310 has a function of temporarily storing data obtained during arithmetic processing performed by the ALU 311 or data obtained as a result of performing arithmetic processing by the ALU 311. The pipeline register 310 may have a function of temporarily storing a program such as an application.

The bus interface 305 functions as a path for data between the semiconductor device 300 and devices outside the semiconductor device. The debug interface 306 functions as a path of a signal for inputting an instruction to control debugging to the semiconductor device 300. The bus interface 305 and the debug interface 306 are each provided with a register.

The power switch 303 has a function of controlling supply of a power source voltage to a circuit included in the semiconductor device 300 other than the power controller 302. The circuit is included in power domains. The circuits included in the same power domain are uniformly controlled to be supplied with the power supply voltage by the power switch 303. The power controller 302 has a function of controlling the operation of the power switch 303.

Description is made on the operation of power gating of the semiconductor device 300 having the aforementioned configuration.

First, by the CPU core 301, timing for stopping the supply of the power supply voltage in a register of the power controller 302 is set. Then, an instruction of starting power gating is sent from the CPU core 301 to the power controller 302. Then, a register and the cache 304 included in the semiconductor device 300 starts data saving. Then, the power switch 303 stops the supply of a power supply voltage to the circuits other than the power controller 302 included in the semiconductor device 300. Then, an external interrupt signal is input to the power controller 302, whereby the supply of the power supply voltage to the circuit included in the semiconductor device 300 is started. Note that a counter may be provided to determine the timing of starting the supply of the power supply voltage not by the input of an external interrupt signal but by the power controller 302. Next, the register and the cache 304 start data recovery. After that, the instruction is executed again in the control unit 307.

Figure 10:
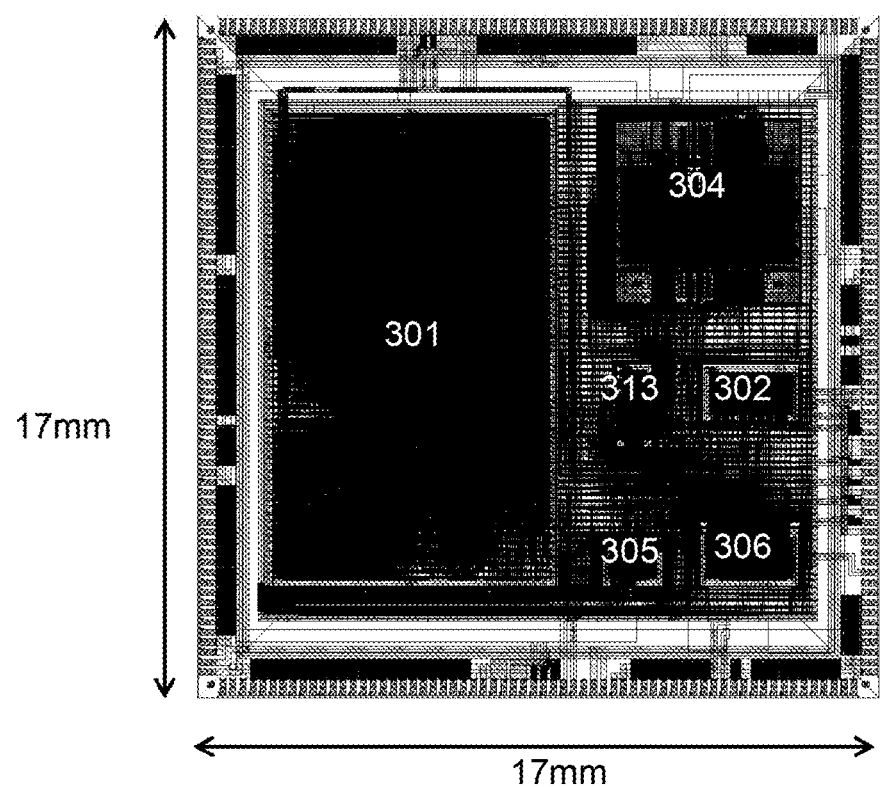
FIG. 10 illustrates a layout of a semiconductor device.
Figure 19:
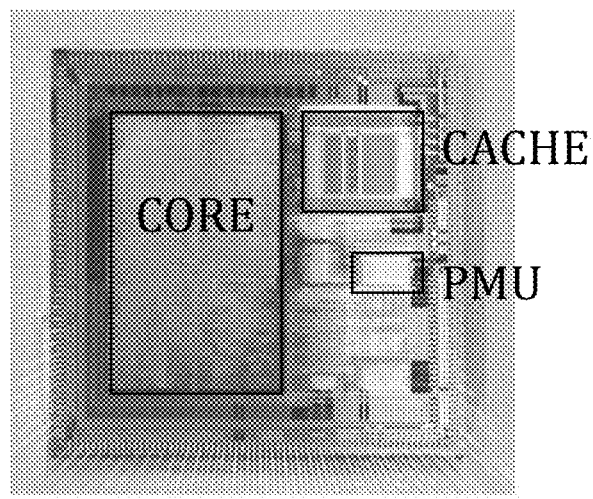
FIG. 19 is an image of an appearance of a semiconductor device.

FIG. 10 is a layout obtained by actually designing the semiconductor device 300 in FIG. 9. In the layout of FIG. 10, a cache controller 313 for controlling operation of the cache 304 is shown. In addition, FIG. 19 is a photograph of the appearance of the semiconductor device 300 which is actually fabricated.

Table 2 below shows the specifications of the designed semiconductor device 300.

TABLE 2

| Technology | Si | 0.35 μm (GI: 10 nm) |
|---|---|---|
| | OS | 0.8 μm (GI: 20 nm) |
| Number of transistors | | Si        CAAC-IGZO |
| | Core | 172000       1410 |
| | Cache | 200000       50000 |
| Operation frequency | | 15 MHz |
| Power supply voltage | Si | 2.5 V |
| | OS | 3.5 V |
| Instruction set | | MIPSI (OpenCores Plasma, 32-bit, RISC) |
| Pipeline | | 3 stages |
| Cache | | 2Way, 2 KB |
| Number of pins | | Approximately 150 |
| Wiring | | 2 layered metal |
| IOPAD | | 256 |
| HDL | | Verilog |

In the designed semiconductor device 300, the CPU core 301, the cache 304, and the bus interface 305 were included in different power domains.

Figure 11:
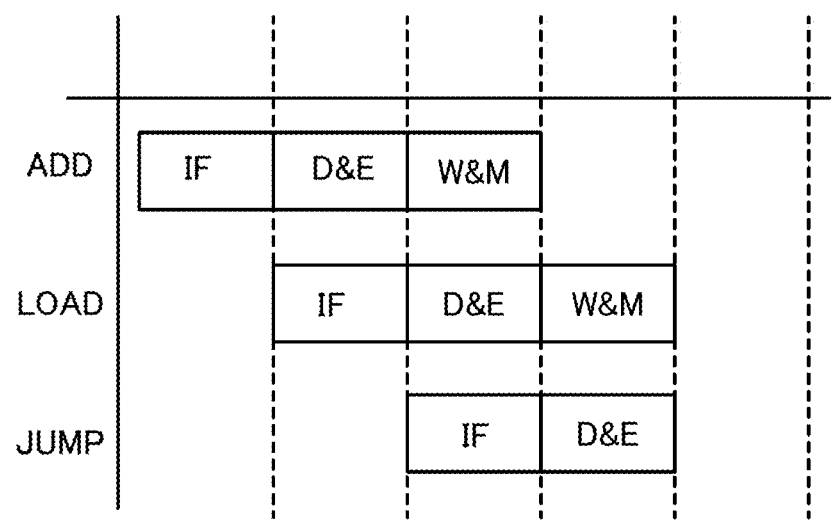
FIG. 11 schematically illustrates a pipeline process.

FIG. 11 schematically shows a flow of a pipeline process performed in the designed semiconductor device 300. FIG. 11 shows a three-stage pipeline process including an ADD instruction, a LOAD instruction, and a JUMP instruction. By each of the ADD instruction and the LOAD instruction, IF (Instruction Fetch), D&E (Decode and Execution), W&M (Write back and Memory access) are sequentially executed. By the JUMP instruction, IF and D&E are sequentially executed.

Figure 22A:
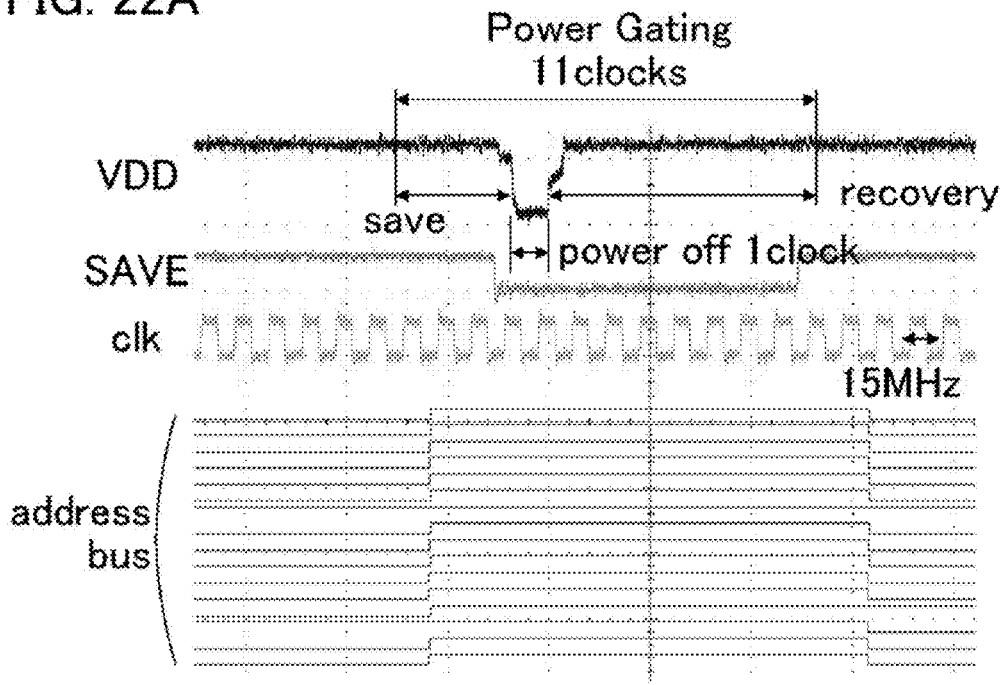
FIGS. 22A and 22B illustrate waveforms of signals in power gating.
Figure 22B:
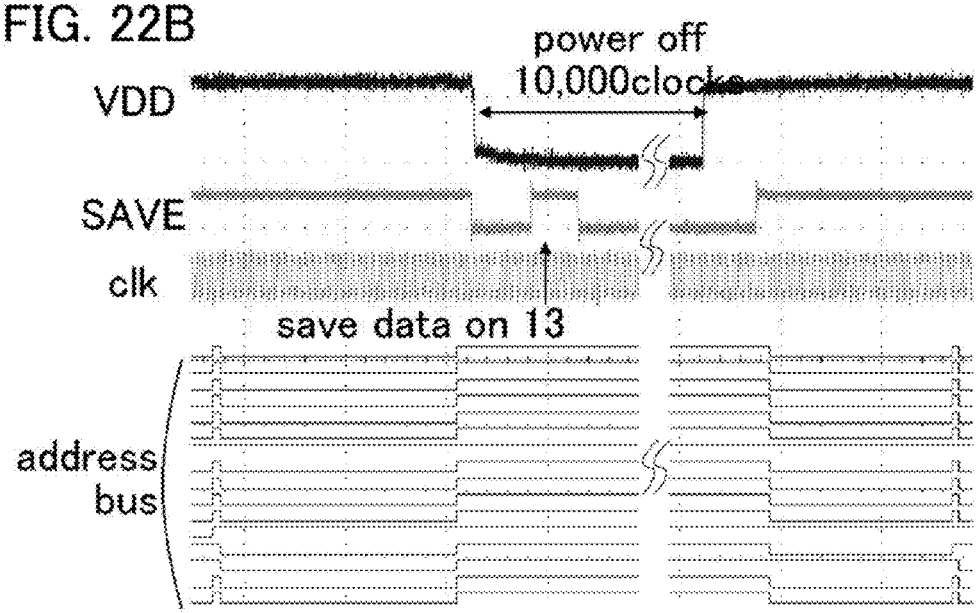

FIGS. 22A and 22B illustrate waveforms of signals in power gating of the fabricated semiconductor device 300. FIG. 22A illustrates data recovery from the second memory circuit 12 after a power-off period for 1 clocks. FIG. 22B illustrates data recovery from the third memory circuit 13 after a power-off period for 10000 clocks. From FIG. 22A, fine time granularity of 11 clocks was confirmed: a period required for data saving was 3 clocks, a power-off period was 1 clocks, and a period required for data recovery was 7 clocks. Note that whether power gating is actually performed is checked by perfect matching of the register values before and after the power gating.

Figure 23:
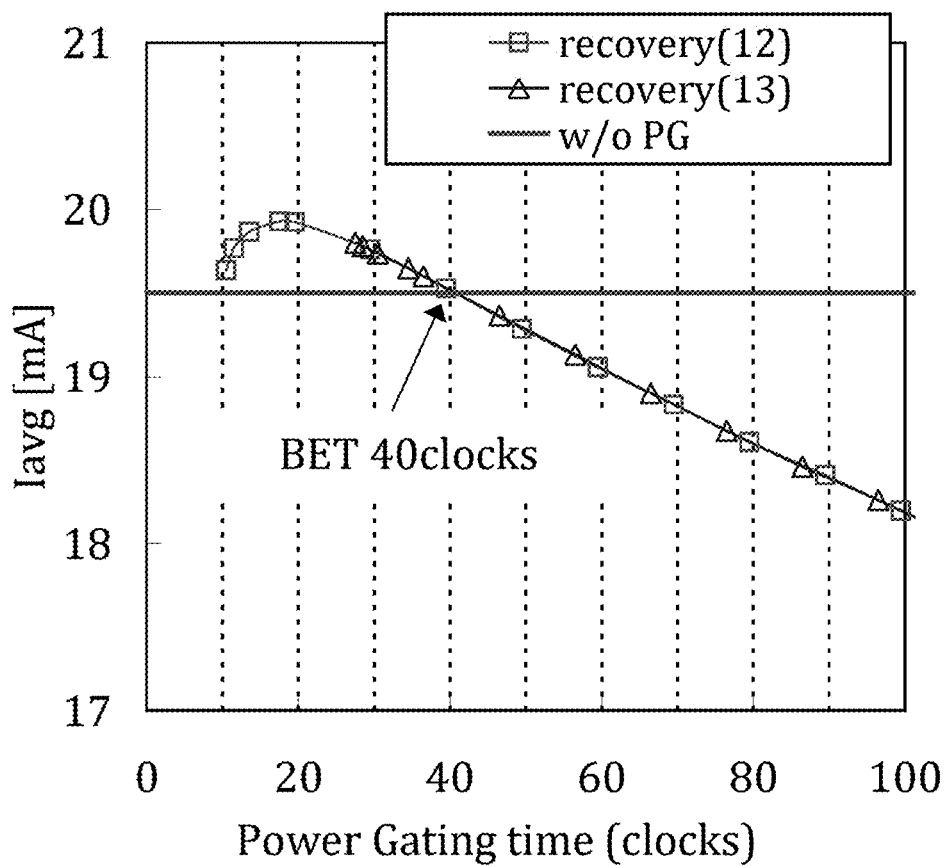
FIG. 23 shows results of evaluating power supply current in a semiconductor device.

FIG. 23 shows results of evaluating power supply current in the fabricated semiconductor device 300. The graph shows relationship between average power supply current and power gating time when a test program including 403 clocks and power gating is alternately performed. As in FIG. 23, break-even time (BET) of 40 clocks in terms of CORE-clock was obtained. This value is smaller than the BET (44-114 clocks) in power gating using the MTSR-R. Further, it is found that average power supply current in recovery from the second memory circuit 12 and recovery from the third memory circuit 13 are nearly the same and that the amount of power required for writing to the third memory circuit 13 is smaller. From specific measurement, the amount of power required for writing to the third memory circuit 13 was approximately 2.3 nJ/1410 FFs. This value is smaller than the amount of power required for writing to a 100-nm-STT-RAM (5 pJ/bit).

Table 5 below shows comparison with the memory device 10 in FIG. 3 (SR-R) and a register using DFF (normal Register). An increase in load capacitance due to the second memory circuit 12 and the third memory circuit 13 is very small, and the reduction in frequency and the increase in power was estimated by simulation to 5% and 4%, respectively.

TABLE 5

| | CLK max. Freq *1 | Active energy *1 | Area |
|---|---|---|---|
| normal Register (w/o SR) | 1.14 GHz | 2.24 pJ/clk | 1590 μm² |
| SR-R | 1.09 GHz | 2.32 pJ/clk | 2153 μm² |

*1 Simulation (Vdd = 2.5 V, Q-fanout = 4)

Figure 24:
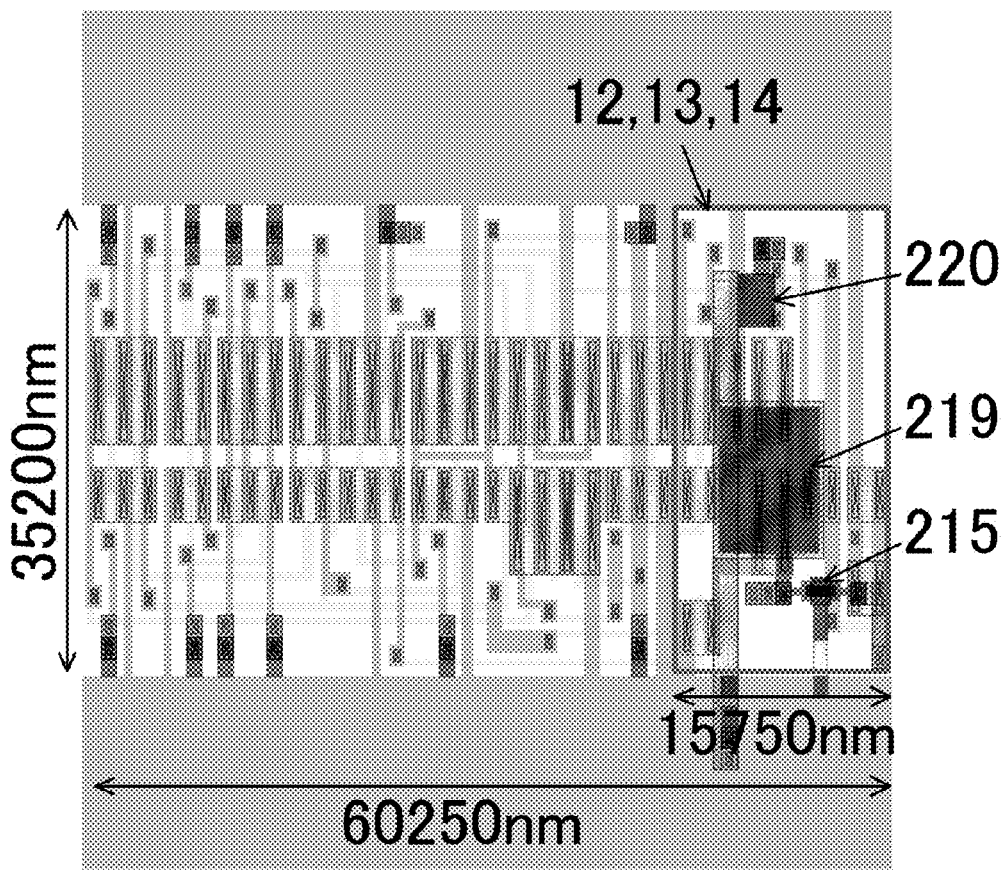
FIG. 24 shows a layout of a memory device.

FIG. 24 shows a layout of the memory device 10. As shown in FIG. 24, the memory device 10 has a structure in which a transistor 215 using CAAC-IGZO described later is stacked over a transistor using Si, the increase in area is thus limited in 35%. In terms of the fabricated semiconductor device 300, the reduction in frequency, the increase in power, and the increase in area were estimated 0.1%, 1%, and 2%, respectively, which were small values.

Figure 25:
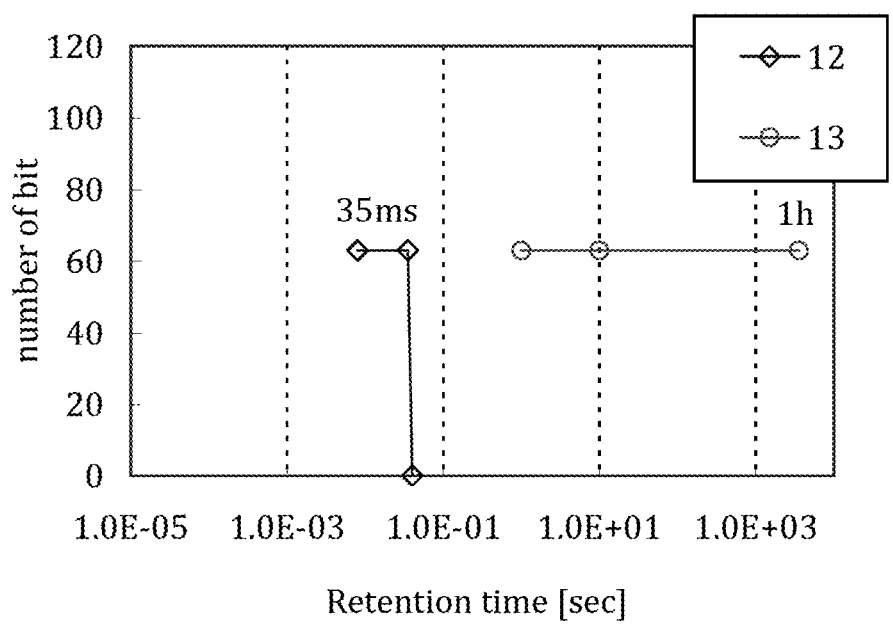
FIG. 25 shows results of evaluating data retention time.

FIG. 25 shows results of evaluating data retention time of the second memory circuit 12 and the third memory circuit 13. The value of 35 ms of the second memory circuit 12 was sufficient to save data to the third memory circuit 13. The value of 1 h of the third memory circuit 13 was sufficient to execute power gating. Refresh of retained data is theoretically possible as needed.

Figure 12:
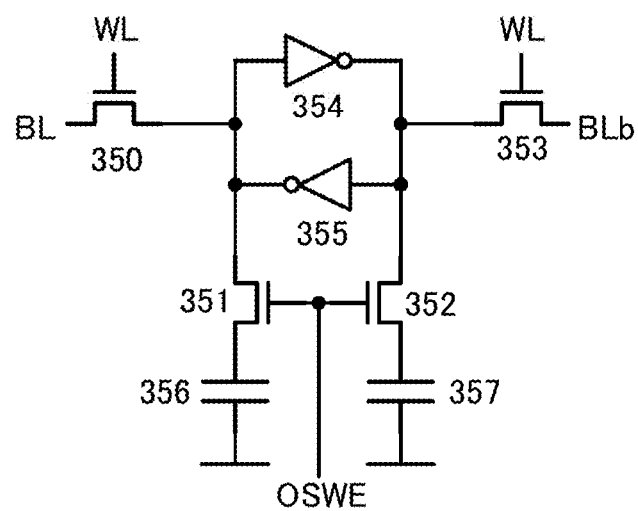
FIG. 12 illustrates a structure of a memory cell.

FIG. 12 shows a structure of a memory cell included in the cache 304 of the designed semiconductor device 300.

The memory cell in FIG. 12 includes n-channel transistors 350, 351, 352, and 353, inverters 354 and 355, and capacitors 356 and 357.

One of a source and a drain of the transistor 350 is connected to a wiring BL, and the other is connected to an input terminal of the inverter 354 and an output terminal of the inverter 355. A gate electrode of the transistor 350 is connected a wiring WL. One of a source and a drain of the transistor 353 is connected to a wiring BLb, and the other is connected to an output terminal of the inverter 354 and an input terminal of the inverter 355. A gate electrode of the transistor 353 is connected to the wiring WL.

One of a source and a drain of the transistor 351 is connected to the input terminal of the inverter 354 and the output terminal of the inverter 355, and the other is connected to one electrode of the capacitor 356. A gate electrode of the transistor 351 is connected to a wiring OSWE. One of a source and a drain of the transistor 352 is connected to the output terminal of the inverter 354 and the input terminal of the inverter 355, and the other is connected to one electrode of the capacitor 357. A gate electrode of the transistor 352 is connected to the wiring OSWE.

In the memory cell in FIG. 12, a transistor in which a channel formation region is formed in an oxide semiconductor film is each used as the transistor 351 and the transistor 352. By accumulating charge in the capacitors 356 and 357, data retained by the inverters 354 and 355 is saved in the capacitors 356 and 357.

Figure 13:
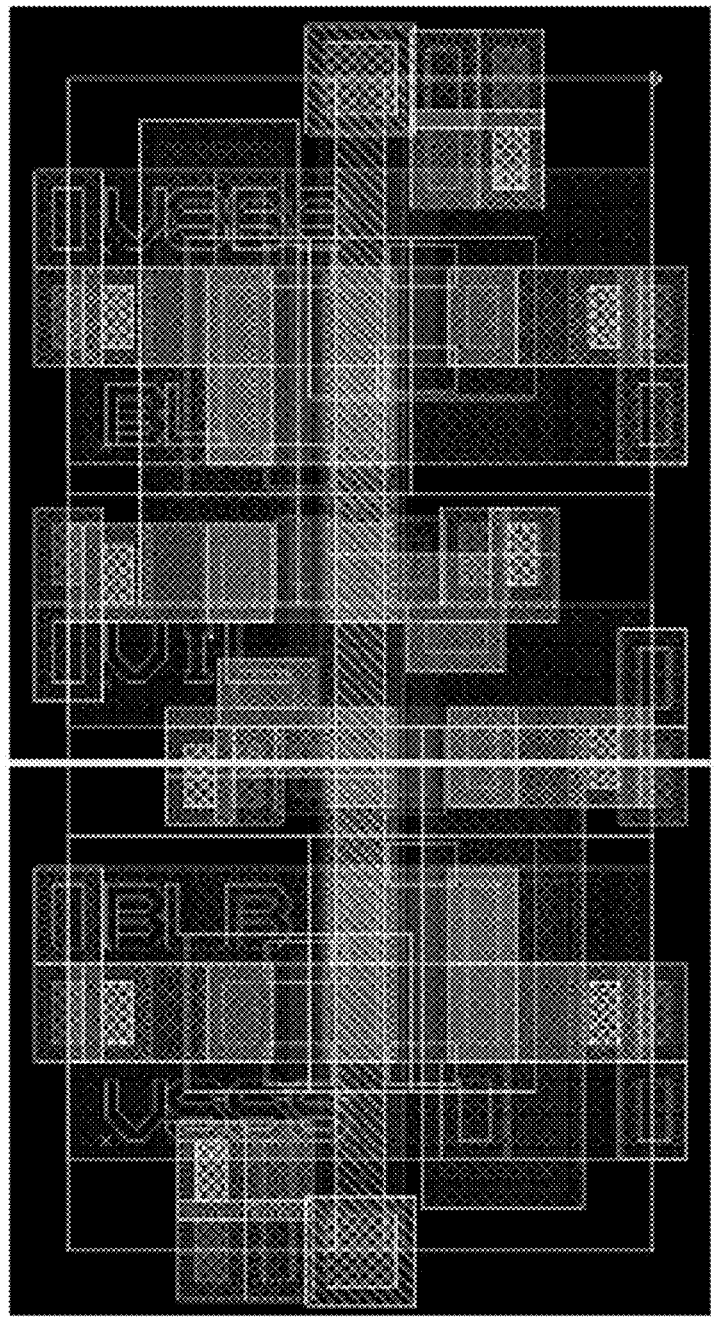
FIG. 13 shows a layout of a memory cell.

FIG. 13 shows a layout of the memory cell included in the cache 304 which is actually designed. Table 3 below shows the specifications of the designed cache 304.

TABLE 3

| Structure | Instruction/data integrated |
|---|---|
| Capacitance | 2 KB |
| Number of blocks | 256 |
| Associativity | 2-way set associative |
| Substitute mode | LR |
| Size of block | 1word (4 bytes) |
| Writing mode | Write back, write buffer 1 stage |
| Hit time | 1 clock |

Figure 14:
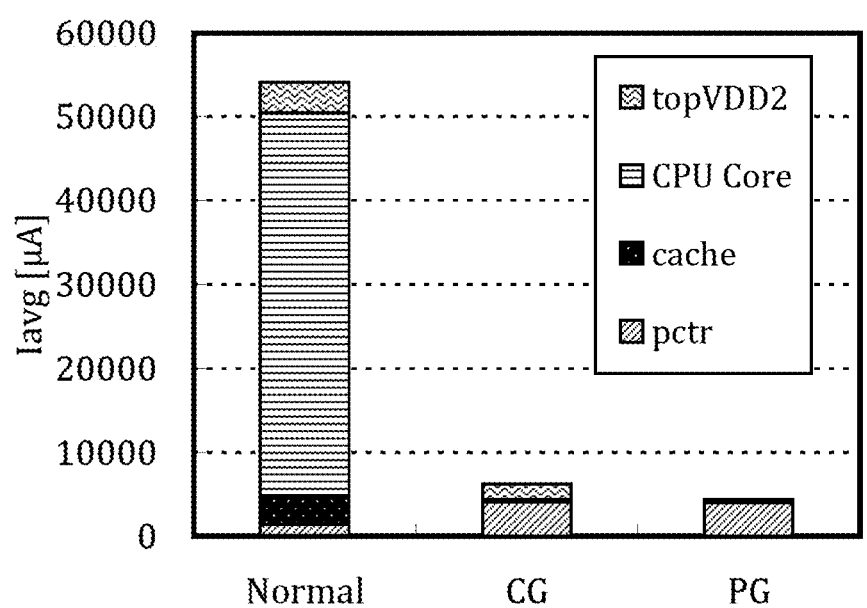
FIG. 14 shows values of a power supply current obtained by simulation.

FIG. 14 shows results of values of power supply current supplied to each circuit included in the designed semiconductor device, that is obtained by simulation. In the simulation, a driving frequency and a power supply voltage were set to 15.15 MHz and 2.5 V, respectively. Each power supply current Iavg (μA) supplied to a CPU core, a cache, a power controller (pctr), and a circuit (topVDD2) other than the CPU core, the cache, and the power controller (pctr), such as a buffer and isolator, was measured by simulation in a normal operation (Normal), in clock gating (CG), and in power gating (PG).

As shown in FIG. 14, each power supply current Iavg (μA) of the topVDD2, the CPU core, and the cache was drastically reduced in clock gating (CG) and in power gating (PG), compared in a normal operation (Normal). Note that power supply current Iavg (μA) of the power controller (pctr) is increased a little in a normal operation (Normal), compared in clock gating (CG) and in power gating (PG). However, when the effect of reduction in power supply current Iavg (μA) in the topVDD2, the CPU core, and the cache is taken into consideration, total power supply current Iavg (μA) is considerably reduced in clock gating (CG) and in power gating (PG). Further, as compared with the values in clock gating (CG) and in power gating (PG), the power supply current Iavg (μA) of the topVDD2 is smaller in power gating (PG).

This embodiment can be combined with any of the other embodiments as appropriate.

(Embodiment 6)

Figure 15A:
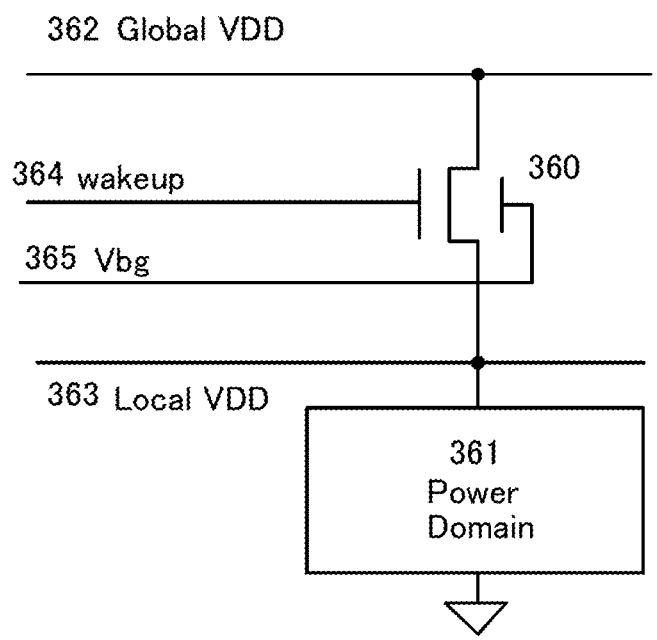
FIGS. 15A and 15B illustrate connection structure of a power domain and a power switch.

FIG. 15A shows a connection structure of a power domain and a power switch when a transistor in which a channel formation region is formed in an oxide semiconductor film is used as the power switch.

In FIG. 15A, a transistor 360 in which a channel formation region is formed in an oxide semiconductor film controls electrical connection between a wiring 362 and a wiring 363. The wiring 363 is connected to a power domain 361. The wiring 363 has a function of supplying a power supply potential VDD (Local VDD) to the power domain 361. The wiring 362 has a function of supplying a power supply potential VDD (Global VDD) to the wiring 363 connected to the power domain 361 and a wiring connected to a power domain other than the power domain 361.

The transistor 360 has a gate (back gate) to which a signal Vbg for controlling the threshold voltage of the transistor 360 is applied through a wiring 364, in addition to a gate (front gate) to which a signal "wakeup" for controlling switching of the transistor is applied through a wiring 365.

Figure 15B:
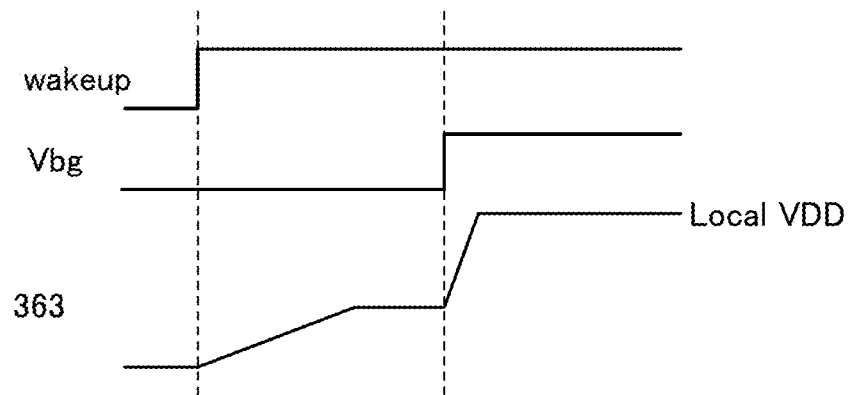

FIG. 15B is a timing chart of the potential of the signal wakeup, the potential of the signal Vbg, and the potential of the wiring 363.

As shown in FIG. 15B, when the potential of the signal wakeup is at a low level and the transistor 360 is in a non-conduction state, the potential of the signal Vbg is at a low level. With this structure, the threshold voltage of the transistor 360 shifts in the positive direction. Thus, the off-state current of the transistor 360 is reduced. Accordingly, in a period during which supply of the power supply voltage to the power domain is stopped, power consumption due to off-state current is suppressed.

When the potential of the signal wakeup changes from a low level to a high level, the transistor 360 is in the conduction state and supply of the power supply voltage to the power domain 361 starts. As shown in FIG. 15B, after the potential of the signal wakeup is changed to a high level, the potential of the signal Vbg is changed to a high level, whereby the threshold voltage of the transistor 360 shifts in the negative direction. Thus, the on-state current of the transistor 360 is increased. Time required for the wiring 363 to reach the power supply potential VDD (Local VDD) after the potential of the signal wakeup changes from a low level to a high level is shortened; thus, the overhead time is shortened.

In addition, the potential of the signal wakeup changes from a low level to a high level in the state where the potential of the signal Vbg is a low level; thus, large current (inrush current) is prevented from flowing into the power domain when the transistor 360 is in the conduction state.

This embodiment can be combined with any of the other embodiments as appropriate.

(Embodiment 7)

Figure 16:
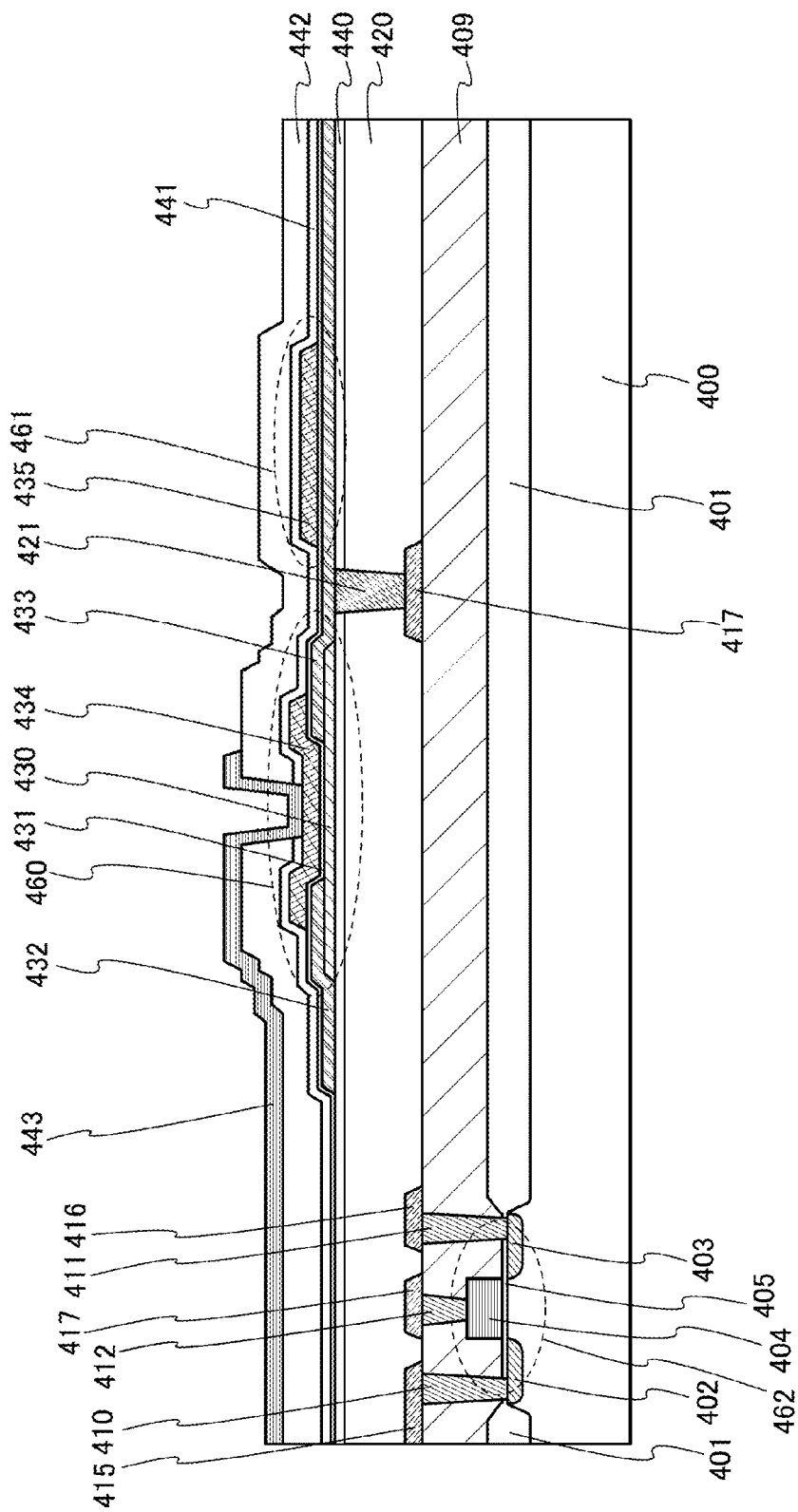
FIG. 16 illustrates a cross-sectional structure of a semiconductor device.

FIG. 16 shows an example of a cross-sectional view of a semiconductor device.

In this embodiment, the case is shown where the transistor 460 having a channel formation region in an oxide semiconductor film and the capacitor 461 are formed over the transistor 462 having a channel formation region in a single crystal silicon substrate.

Note that an active layer in the transistor 462 can be an amorphous, microcrystalline, polycrystalline, or signal crystal semiconductor film of silicon, germanium, or the like. Alternatively, the transistor 462 may include an active layer containing an oxide semiconductor. In the case where all of the transistors include an active layer containing an oxide semiconductor, the transistor 460 is not necessarily stacked over the transistor 462, and the transistors 460 and 462 may be formed in the same layer.

In the case where the transistor 462 is formed using a thin silicon film, any of the following can be used: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Examples of a semiconductor substrate 400 where the transistor 462 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). FIG. 16 illustrates an example in which a single crystal silicon substrate having n-type conductivity is used.

The transistor 462 is electrically isolated from other transistors by an element isolation insulating film 401. For formation of the element isolation insulating film 401, a selective oxidation method (local oxidation of silicon (LOCOS) method), a trench isolation method, or the like can be used.

Specifically, the transistor 462 includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps a channel formation region formed between the impurity regions 402 and 403 with the gate insulating film 405 provided therebetween.

An insulating film 409 is provided over the transistor 462. Openings are formed to penetrate the insulating film 409. A wiring 410 in contact with the impurity region 402, a wiring 411 in contact with the impurity region 403, and a wiring 412 electrically connected to the gate electrode 404 are formed in the openings.

The wiring 410 is electrically connected to a wiring 415 formed over the insulating film 409. The wiring 411 is electrically connected to a wiring 416 formed over the insulating film 409. The wiring 412 is electrically connected to a wiring 417 formed over the insulating film 409.

An insulating film 420 and an insulating film 440 are formed to be stacked in this order over the wirings 415 to 417. An opening is formed in the insulating films 420 and 440. A wiring 421 electrically connected to the wiring 417 is formed in the opening.

In FIG. 16, the transistor 460 and the capacitor 461 are formed over the insulating film 440.

The transistor 460 includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps the semiconductor film 430 between the conductive films 432 and 433. Note that the conductive film 433 is electrically connected to the wiring 421.

A conductive film 435 is provided over the gate insulating film 431 to overlap the conductive film 433. A portion where the conductive film 435 overlaps the conductive film 433 with the gate insulating film 431 placed therebetween functions as the capacitor 461.

Note that the case where the capacitor 461, together with the transistor 460, is provided over the insulating film 440 is illustrated in FIG. 16 as an example; alternatively, the capacitor 461 may be provided below the insulating film 440 along with the transistor 462.

An insulating film 441 and an insulating film 442 are formed to be stacked in this order over the transistor 460 and the capacitor 461. An opening is formed in the insulating films 441 and 442. A conductive film 443 that is in contact with the gate electrode 434 in the opening is provided over the insulating film 441.

Note that in FIG. 16, the transistor 460 includes the gate electrode 434 on at least one side of the semiconductor film 430. Alternatively, the transistor 460 may include a pair of gate electrodes provided with the semiconductor film 430 provided therebetween.

In the case where the transistor 460 has a pair of gate electrodes with the semiconductor film 430 provided therebetween, one of the gate electrodes may be supplied with a signal for controlling the conduction state and the non-conduction state of the transistor 460, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 16, the transistor 460 has a single-gate structure where one channel formation region corresponding to one gate electrode 434 is provided. However, the transistor 460 may have a multi-gate structure in which a plurality of electrically connected gate electrodes is provided so that a plurality of channel formation regions is included in one active layer.

Note that a highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. For this reason, a transistor having a channel formation region in a highly purified oxide semiconductor film has extremely small off-state current and high reliability.

Specifically, various experiments can prove a small off-state current of a transistor having a channel formation region in a highly purified oxide semiconductor. For example, even when an element has a channel width of $1\times10^6$ µm and a channel length of 10 µm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current normalized on the channel width of the transistor is lower than or equal to 100 zA/µm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of charge of the capacitor per unit hour. As a result, it was found that, in the case where the voltage between the source electrode and the drain electrode of the transistor is 3 V, a lower off-state current of several tens of yA/µm is obtained. Accordingly, the off-state current of the transistor in which the purified oxide semiconductor film is used as a channel formation region is considerably lower than that of a transistor in which silicon having crystallinity is used.

In the case where an oxide semiconductor film is used as the semiconductor film, at least indium (In) or zinc (Zn) is preferably included as an oxide semiconductor. As a stabilizer for reducing variation in electric characteristics of a transistor using the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=$\frac{1}{3}$:$\frac{1}{3}$:$\frac{1}{3}$) or In:Ga:Zn=2:2:1 (=$\frac{2}{5}$:$\frac{2}{5}$:$\frac{1}{5}$), or any of oxides whose composition is in the neighborhood of the above compositions can be used. Alternatively, an In—Sn—Zn-based oxide with an atomic ratio of In:Sn:Zn=1:1:1 (=$\frac{1}{3}$:$\frac{1}{3}$:$\frac{1}{3}$), In:Sn:Zn=2:1:3 (=$\frac{1}{3}$:$\frac{1}{6}$:$\frac{1}{2}$), or In:Sn:Zn=2:1:5 (=$\frac{1}{4}$:$\frac{1}{8}$:$\frac{5}{8}$), or any of oxides whose composition is in the neighborhood of the above compositions may be used.

For example, with an In—Sn—Zn-based oxide, high mobility can be realized relatively easily. However, even with an In—Ga—Zn-based oxide, mobility can be increased by reducing the defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis (f scan) is performed under conditions where the sample is rotated around a normal vector of a sample surface as an axis (f axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For example, the CAAC-OS film is formed by a sputtering method with a polycrystalline metal oxide sputtering target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like or pellet-like sputtered particle reaches a substrate in the state of maintaining its crystal state, whereby the CAAC-OS film can be formed.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate surface, so that a flat plane of the sputtered particles is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based oxide target is described below.

The In—Ga—Zn-based oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed at a temperature from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes $Na^+$ when an insulating film in contact with the oxide semiconductor film is an oxide and Na diffuses into the insulating film. Further, in the oxide semiconductor film, Na cuts or enters a bond between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occur. Specifically, the Na concentration according to secondary ion mass spectrometry is reduced to preferably less than or equal to $5\times10^{16}/cm^3$, further preferably less than or equal to $1\times10^{16}/cm^3$, still further preferably less than or equal to $1\times10^{15}/cm^3$. In a similar manner, the measurement value of Li concentration is preferably less than or equal to $5\times10^{15}/cm^3$, more preferably less than or equal to $1\times10^{15}/cm^3$. In a similar manner, the measurement value of K concentration is preferably less than or equal to $5\times10^{15}/cm^3$, more preferably less than or equal to $1\times10^{15}/cm^3$.

In the case where a metal oxide containing indium is used, silicon or carbon having higher bond energy with oxygen than indium might cut the bond between indium and oxygen, so that an oxygen vacancy is formed. Accordingly, when silicon or carbon is contained in the oxide semiconductor film, the electric characteristics of the transistor are likely to deteriorate as in the case of using an alkali metal or an alkaline earth metal. Thus, the concentration of silicon and the concentration of carbon in the oxide semiconductor film are preferably low. Specifically, the carbon (C) concentration or the silicon (Si) concentration measured by secondary ion mass spectrometry is preferably less than or equal to $1\times10^{18}/cm^3$. In that case, the deterioration of the electric characteristics of the transistor can be prevented, so that the reliability of the semiconductor device can be improved.

A metal in the source electrode and the drain electrode might extract oxygen from the oxide semiconductor film depending on a conductive material used for the source electrode and the drain electrode. In such a case, a region of the oxide semiconductor film in contact with the source electrode or the drain electrode becomes an n-type region due to the formation of an oxygen vacancy.

The n-type region serves as a source region or a drain region, resulting in a decrease in the contract resistance between the oxide semiconductor film and the source electrode or the drain electrode. Accordingly, the formation of the n-type region increases the mobility and on-state current of the transistor.

Note that the extraction of oxygen by a metal in the source electrode and the drain electrode is probably caused when the source electrode and the drain electrode are formed by a sputtering method or when heat treatment is performed after the formation of the source electrode and the drain electrode.

The n-type region is more likely to be formed by forming the source electrode and the drain electrode with use of a conductive material which is easily bonded to oxygen. Examples of such a conductive material include Al, Cr, Cu, Ta, Ti, Mo, and W.

The oxide semiconductor film is not limited to a single-layer metal oxide film and may have a layered structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is distant from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of metal oxide semiconductor films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to high vacuum (about $1\times10^{-4}$ Pa to $5\times10^{-7}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen, and thus has a function of suppressing generation of oxygen vacancies in the oxide film. That is, oxygen vacancies are less likely to be generated in the first metal oxide film or the third metal oxide film than in the second metal oxide film.

Specifically, when both the second metal oxide film and the first metal oxide film or the third metal oxide film are an In-M-Zn-based oxide, the atomic ratio of the first metal oxide film or the third metal oxide film, In:M:Zn=$x_1$:$y_1$:$z_1$, and the atomic ratio of the second metal oxide film, In:M:Zn=$x_2$:$y_2$:$z_2$, may be determined so that $y_1/x_1$ is larger than $y_2/x_2$. Note that the element M is a metal element whose bonding strength to oxygen is larger than that of In, and Al, Ti, Ga, Y, Zr, Sn, La, Ce, Nd, and Hf can be given as examples. Preferably, the atomic ratio is determined so that $y_1/x_1$ is 1.5 times or more as large as $y_2/x_2$. Further preferably, the atomic ratio is determined so that $y_1/x_1$ is 2 times or more as large as $y_2/x_2$. Still further preferably, the atomic ratio is determined so that $y_1/x_1$ is 3 times or more as large as $y_2/x_2$. Further, it is preferable that $y_2$ be greater than or equal to $x_2$ in the second metal oxide film, in which case the transistor can have stable electrical characteristics. Note that $y_2$ is preferably equal to $x_2$ or less than 3 times $x_2$ because the field-effect mobility of the transistor is lowered if $y_2$ is 3 or more times $x_2$.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film to the third metal oxide film can be amorphous or crystalline. Note that the second metal oxide film in which a channel region is formed preferably has a crystalline structure, in which case the transistor can have stable electrical characteristics.

Note that a channel formation region refers to a region of a semiconductor film of a transistor, which overlaps with a gate electrode and which is between a source electrode and a drain electrode. Further, a channel region refers to a region through which current mainly flows in the channel formation region.

transistor are further increased and higher-speed operation of the semiconductor device is achieved.

Table 4 below shows each specification of a memory circuit using a transistor including a CAAC-OS film including an In—Ga—Zn-based oxide (CAAC-IGZO), a memory circuit using an MRAM, a memory circuit using an ReRAM (resistance random access memory), and a memory circuit using a FeRAM (ferroelectric random access memory).

TABLE 4

| | CAAC-IGZO | MRAM | ReRAM | FeRAM |
|---|---|---|---|---|
| write voltage | 2.5 V | 3.3 V | −1.5 V to +2 V | 1.5 V |
| power current | 0.1 A | 9 A | 170 A | unreleased |
| write time | 10 ns | 4 ns | 10 ns | 50 ns |
| element size | channel length = 60 nm | 50 nmφ | 500 nm × 500 nm | 0.8 μm × 0.8 μm |
| driving method | voltage driving | current driving | current driving | current driving |
| number of terminals | 4 | 2 | 2 | 2 |
| equivalent circuit | 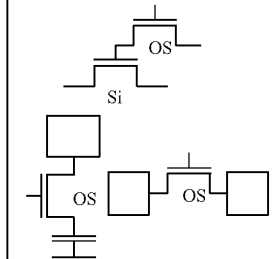 | 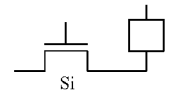 | 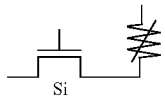 | 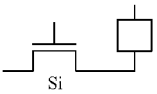 |

For example, in the case where an In—Ga—Zn-based oxide film formed by a sputtering method is used as each of the first metal oxide film and the third metal oxide film, the first metal oxide film and the third metal oxide film can be deposited with use of an In—Ga—Zn-based oxide target (In:Ga:Zn=1:3:2 [atomic ratio]). The deposition conditions can be as follows: deposition gas is argon (flow rate: 30 sccm) and oxygen (flow rate: 15 sccm); pressure, 0.4 Pa; substrate temperature, 200° C.; and DC power, 0.5 kW.

Further, in the case where the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows: deposition gas is argon (flow rate: 30 sccm) and oxygen (flow rate: 15 sccm); pressure is 0.4 Pa; substrate temperature is 300° C.; and DC power is 0.5 kW.

Although the first to third oxide semiconductor layers can be formed by a sputtering method, they may be formed by another method, e.g., a thermal CVD method. A metal organic chemical vapor deposition (MOCVD) method or an atomic layer deposition (ALD) method may be employed as an example of a thermal CVD method.

Note that the edge portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and on-state current of the transistor and achieves high-speed operation of a semiconductor device using the transistor. Furthermore, in the case where the semiconductor film including the stacked metal oxide films is used in the transistor, the n-type semiconductor region particularly preferably reaches the second metal oxide film part of which is to be a channel region, in which case the mobility and on-state current of the transistor are further increased and higher-speed operation of the semiconductor device is achieved.

As shown in Table 4, power required for data writing is smaller in the memory circuit using a transistor including a CAAC-OS film including an In—Ga—Zn-based oxide (CAAC-IGZO) than in the other memory circuits. Thus, a memory device using a transistor in which a channel formation region is formed in an oxide semiconductor film such as a CAAC-OS film including an In—Ga—Zn-based oxide in a memory circuit is preferable to reduce the overhead power of a semiconductor device.

This embodiment can be combined with any of the other embodiments as appropriate.

(Embodiment 8)

Figure 17A:
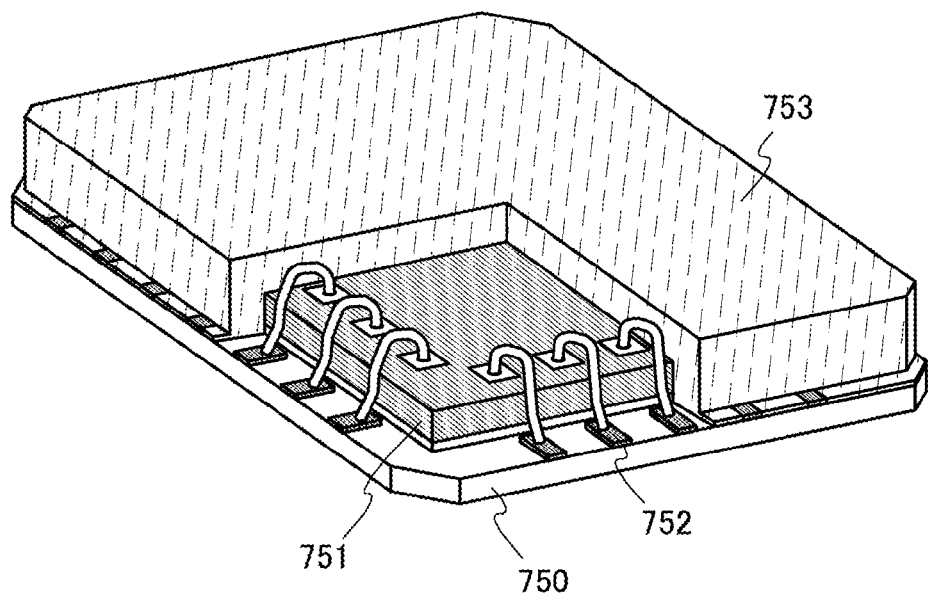
FIGS. 17A and 17B illustrate structures of a chip and a module.

FIG. 17A is a perspective view illustrating a cross-sectional structure of a package using a lead frame interposer.

In the package illustrated in FIG. 17A, a chip 751 corresponding to the semiconductor device of one embodiment of the present invention is connected to a terminal 752 over an interposer 750 by a wire bonding method. The terminal 752 is placed on a surface of the interposer 750 on which the chip 751 is mounted. The chip 751 can be sealed by a mold resin 753, in which case the chip 751 is sealed so that part of each of the terminals 752 is exposed.

Figure 17B:
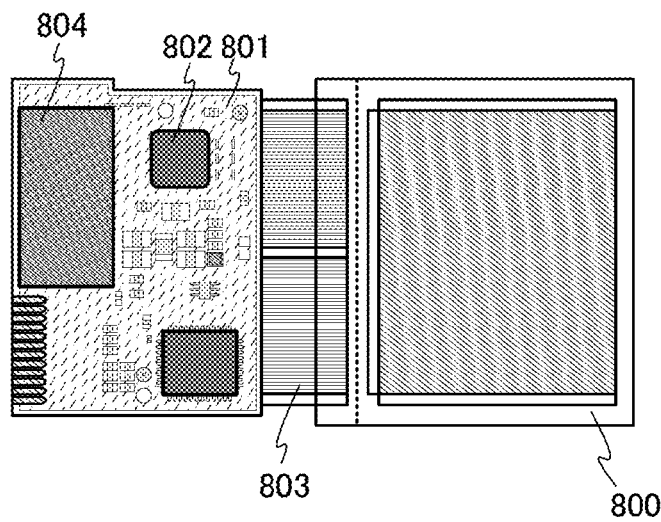

FIG. 17B illustrates the structure of a module of an electronic device in which the package is mounted on a circuit board.

In the module of a mobile phone illustrated in FIG. 17B, a package 802 and a battery 804 are mounted on a printed wiring board 801. In addition, the printed wiring board 801 is mounted on a panel 800 including a display element, by an FPC 803.

This embodiment can be implemented in an appropriate combination with any of the other embodiments described in this specification.

(Embodiment 9)

The semiconductor device or the programmable logic device in one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device or the programmable logic device in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 18A to 18F.

Figure 18A:
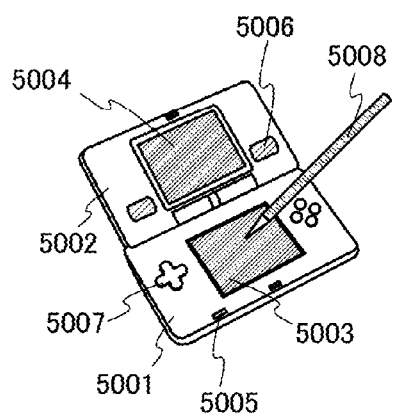
FIGS. 18A to 18F illustrate electronic devices.

FIG. 18A illustrates a portable game machine, which includes a housing 5001, a housing 5002, a display portion 5003, a display portion 5004, a microphone 5005, speakers 5006, a control key 5007, a stylus 5008, and the like. Note that although the portable game machine in FIG. 18A has the two display portions 5003 and 5004, the number of display portions included in the portable game machine is not limited thereto.

Figure 18B:
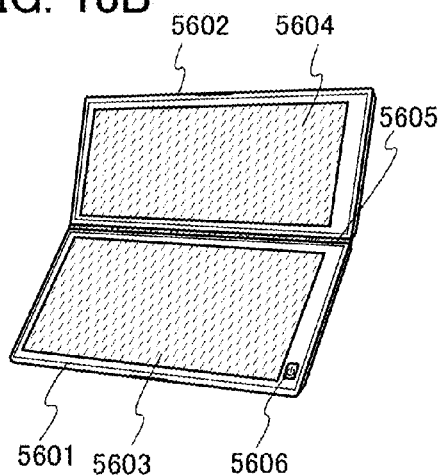

FIG. 18B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel area of a display device.

Figure 18C:
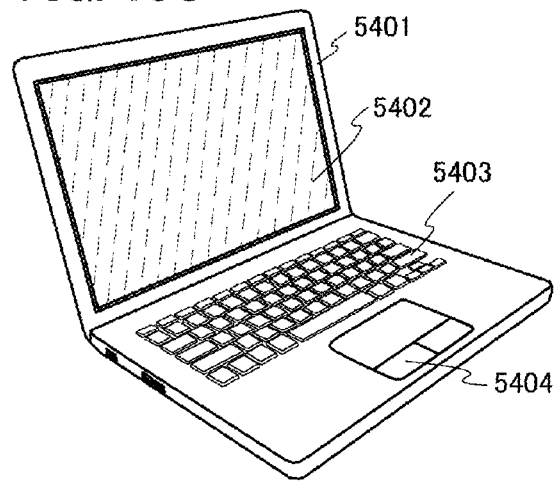

FIG. 18C illustrates a laptop personal computer, which includes a housing 5401, a display portion 5402, a keyboard 5403, a pointing device 5404, and the like.

Figure 18D:
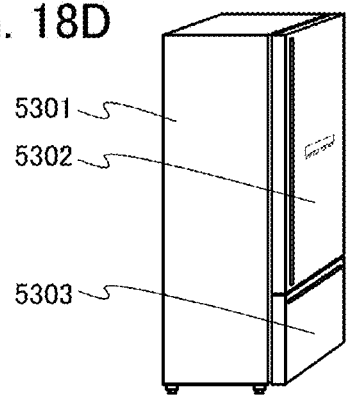

FIG. 18D illustrates the electric refrigerator-freezer including a housing 5301, a door for a refrigerator 5302, a door for a freezer 5303, and the like.

Figure 18E:
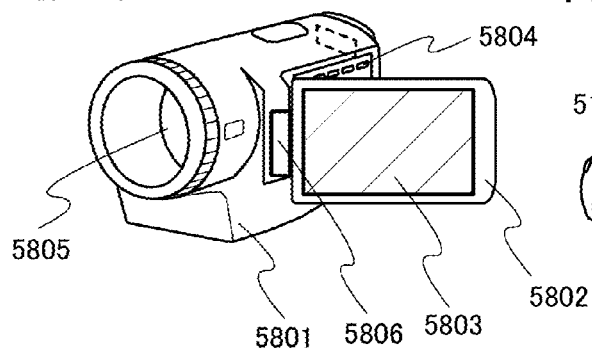

FIG. 18E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 18F:
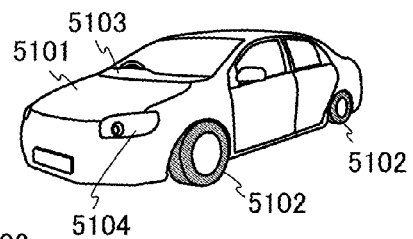

FIG. 18F illustrates a motor vehicle, which includes a car body 5101, wheels 5102, a dashboard 5103, lights 5104, and the like.

This embodiment can be implemented in an appropriate combination with any of the other embodiments described in this specification.

(Embodiment 10)

Next, the results of measuring the off-state current of a transistor in which a channel formation region is formed in an oxide semiconductor film will be described.

Figure 40:
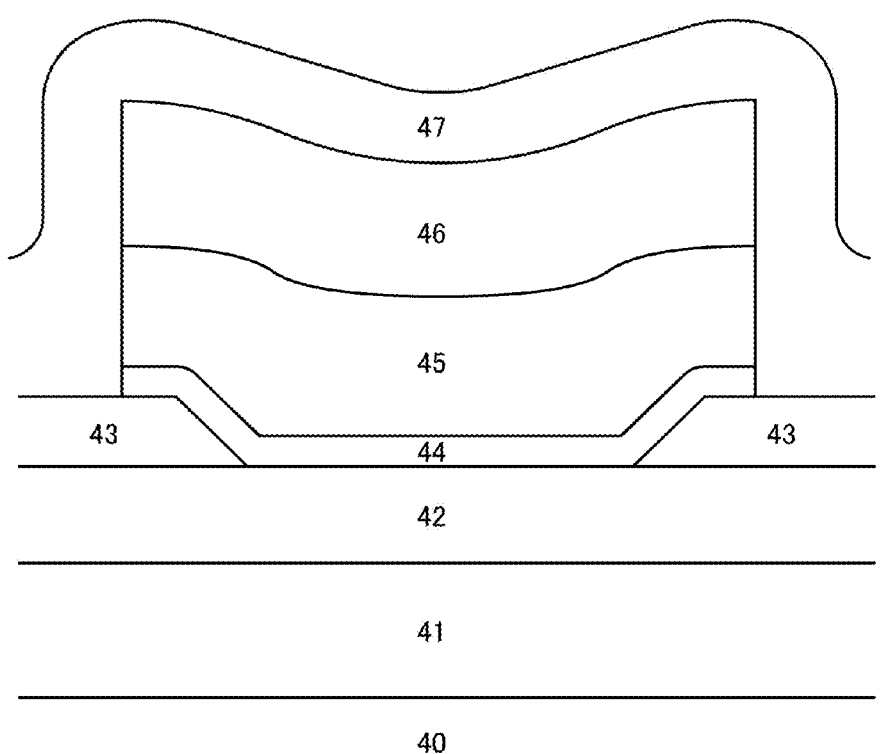
FIG. 40 illustrates a cross-sectional structure of a transistor.

For the measurement of the off-state current, a transistor having a cross-sectional structure in FIG. 40 was used. Specifically, the transistor shown in FIG. 40 was located over an insulating film 40. The transistor shown in FIG. 40 included a first metal oxide film 41 over the insulating film 40, a second metal oxide film 42 over the first metal oxide film 41, a pair of conductive films 43 serving as a source electrode and a drain electrode over the second metal oxide film 42, a third metal oxide film 44 over the second metal oxide film 42 and the pair of conductive films 43, a gate insulating film 45 over the third metal oxide film 44, and a gate electrode 46 overlapping the first metal oxide film 41, the second metal oxide film 42, and the third metal oxide film 44 with the gate insulating film 45 provided therebetween. In addition, the transistor in FIG. 40 was covered by an insulating film 47.

A specific manufacturing method of the transistor in FIG. 40 will be described. First, a 300-nm-thick silicon oxynitride film was formed by a PECVD method over a silicon substrate covered by a 100-nm-thick thermal oxide film. Then, the silicon oxynitride film was polished by a chemical mechanical polishing (CMP) method to form the insulating film 40. The amount of polishing of the silicon oxynitride film was approximately 12 nm. Next, heat treatment was performed at 450° C. in a vacuum atmosphere for an hour, and then, oxygen was added to the insulating film 40 by an ion implantation method. The conditions of the ion implantation were set as follows: acceleration voltage was 60 kV; dosage, $2.0 \times 10^{16}$ ions/cm$^2$; tilt angle, 7°; and twist angle, 72°.

Then, a first metal oxide film and a second metal oxide film were successively formed over the insulating film 40 without exposure to the air. As the first metal oxide film, a 20-nm-thick In—Ga—Zn-based oxide film was deposited by a sputtering method with the use of an oxide target containing In, Ga, and Zn at an atomic ratio of 1:3:2. Deposition conditions were as follows: atmosphere was argon and oxygen (argon: oxygen=30 sccm:15 sccm); pressure, 0.4 Pa; electric power (DC), 0.5 kW; substrate temperature, 200° C.; and distance between the substrate and the target, 60 mm. A 15-nm-thick In—Ga—Zn-based oxide film was deposited as the second metal oxide film, by a sputtering method with the use of an oxide target containing In, Ga, and Zn at an atomic ratio of 1:1:1. Deposition conditions were as follows: atmosphere was argon and oxygen (argon: oxygen=30 sccm: 15 sccm); pressure, 0.4 Pa; electric power (DC), 0.5 kW; substrate temperature, 300° C.; and distance between the substrate and the target, 60 mm.

Next, heat treatment was performed at 450° C. in a nitrogen atmosphere for an hour and heat treatment was subsequently performed at 450° C. in an oxygen atmosphere for an hour in the same treatment chamber. The first metal oxide film and the second metal oxide film were each processed into an island shape by etching to form the first metal oxide film 41 (thickness: approximately 20 nm) and the second metal oxide film 42 (thickness: approximately 15 nm). Note that for the etching, an inductively-coupled plasma (ICP) etching method was used. Etching conditions were set as follows: substrate temperature was 70° C.; etching gas, a mixed gas of boron trichloride and chlorine (BCl$_3$: Cl$_2$=60 sccm: 20 sccm); electric power, 450 W; bias power, 100 W; pressure, 1.9 Pa; and process time, 89 seconds.

A 100-nm-thick tungsten film was formed over the first metal oxide film 41 and the second metal oxide film 42. The tungsten film was processed by etching to form the pair of conductive films 43 serving as a source electrode and a drain electrode.

The tungsten film was deposited by a sputtering method. Deposition conditions were set as follows: atmosphere was argon (flow rate: 80 sccm); pressure, 0.8 Pa; electric power (DC), 1 kW; substrate temperature, 200° C.; and distance between the substrate and the target, 60 mm.

Specifically, the etching of the tungsten film was performed as follows. First etching was performed with conditions set as follows: substrate temperature was 40° C.; etching gas, a mixed gas of chlorine, carbon tetrafluoride, and oxygen ($Cl_2$:$CF_4$:$O_2$=45 sccm:55 sccm:55 sccm); electric power, 3000 W; bias power, 110 W; pressure, 0.67 Pa; and process time, 13 seconds. Then, ashing is performed on a resist mask in the following conditions: substrate temperature was 40° C.; etching gas, oxygen ($O_2$=100 sccm); electric power, 2000 W; bias power, 0 W; pressure, 3.00 Pa; and process time, 15 seconds. By the ashing, the resist mask used in the first etching was partially removed and receded. Then, second etching was performed with conditions set as follows: substrate temperature was 40° C.; etching gas, a mixed gas of chlorine, carbon tetrafluoride, and oxygen ($Cl_2$: $CF_4$: $O_2$=45 sccm: 55 sccm: 55 sccm); electric power, 3000 W; bias power, 110 W; pressure, 0.67 Pa; and process time, 4 seconds. In this second etching, the receded resist mask was used.

By the etching in the above-described conditions, end portions of the pair of conductive films 43 were tapered.

Next, a third metal oxide film was formed over the pair of conductive films 43. A 5-nm-thick In—Ga—Zn-based oxide film was deposited as the third metal oxide film, by a sputtering method with the use of an oxide target containing In, Ga, and Zn at an atomic ratio of 1:3:2. Deposition conditions were set as follows: atmosphere was argon and oxygen (argon: oxygen=30 sccm: 15 sccm); pressure 0.4 Pa; electric power (DC), 0.5 kW; substrate temperature, 200° C.; and distance between the substrate and the target, 60 mm.

Next, as an insulating film to be the gate insulating film 45, a 20-nm-thick silicon oxynitride film was formed over the third metal oxide film by a CVD method. The substrate temperature was 350° C. and the pressure was 200 Pa.

Next, a conductive film to be the gate electrode 46 was formed over the insulating film to be the gate insulating film 45. As the conductive film, a 135-nm-thick tungsten film and a 30-nm-thick tantalum nitride film over the tungsten film were formed. Deposition conditions of the tantalum nitride film were as follows: atmosphere was argon and oxygen (argon: oxygen=50 sccm: 10 sccm); pressure, 0.6 Pa; electric power (DC), 1.0 kW; substrate temperature, room temperature (approximately 27° C.); and distance between the substrate and the target, 60 mm. Deposition conditions of the tungsten film were as follows: atmosphere was argon (argon=100 sccm); pressure, 2.0 Pa; electric power (DC), 4.0 kW; substrate temperature, approximately 200° C.; and distance between the substrate and the target, 60 mm. Note that heated argon (argon=10 sccm) was further supplied to the rear surface of the substrate when the tungsten film was formed.

Then, the conductive film to be the gate electrode 46 was processed by etching, and the gate electrode 46 was thus formed. Specifically, the etching of the conductive film was performed as follows. First etching was performed with conditions set as follows: substrate temperature was 40° C.; etching gas, a mixed gas of chlorine, carbon tetrafluoride, and oxygen ($Cl_2$: $CF_4$: $O_2$=45 sccm: 55 sccm: 55 sccm); electric power, 3000 W; bias power, 110 W; pressure, 0.67 Pa; and process time, 12 seconds. Then, second etching was performed with conditions set as follows: substrate temperature was 40° C.; etching gas, chlorine ($Cl_2$=100 sccm); electric power, 2000 W; bias power, 50 W; pressure, 0.67 Pa; and process time, 10 seconds.

Next, the insulating film to be the gate insulating film 45 and the third metal oxide film were processed by etching with the use of the gate electrode 46 and the pair of conductive films 43 as masks. Thus, the gate insulating film 45 and the third metal oxide film 44 were formed. Note that for the etching, an inductively-coupled plasma etching method was used. Etching conditions were set as follows: substrate temperature was 70° C.; etching gas, boron trichloride ($BCl_3$=80 sccm); electric power, 450 W; bias power, 100 W; pressure, 1.0 Pa; and process time, 36 seconds.

Next, the insulating film 47 in which a 70-nm-thick aluminum oxide film and a 300-nm-thick silicon oxynitride film over the aluminum oxide film were formed so as to cover the transistor. The aluminum oxide film was formed by a sputtering method. The silicon oxynitride film was formed by a CVD method. The deposition conditions of the aluminum oxide film were as follows: atmosphere was argon and oxygen (argon:oxygen=25 sccm:25 sccm); pressure, 0.4 Pa; electric power (RF), 2.5 kW; substrate temperature, 250° C.; and distance between the substrate and the target, 60 mm.

Next, heat treatment was performed at 400° C. under an oxygen atmosphere for an hour.

Then, an opening reaching the pair of conductive films was formed in the insulating film 47 by etching. For the etching, an inductively-coupled plasma etching method was used.

Specifically, the etching of the silicon oxynitride film was performed as follows. First etching was performed with conditions set as follows: substrate temperature was 70° C.; etching gas, a mixed gas of trifluoromethane and helium ($CHF_3$: He=50 sccm:100 sccm); electric power, 475 W; bias power, 300 W; pressure, 5.5 Pa; and process time, 3 seconds. Then, second etching was performed with conditions set as follows: substrate temperature was 70° C.; etching gas, a mixed gas of trifluoromethane and helium ($CHF_3$: He=7.5 sccm: 142.5 sccm); electric power, 475 W; bias power, 300 W; pressure, 5.5 Pa; and process time, 61 seconds. Then, third etching was performed with conditions set as follows: substrate temperature was 70° C.; etching gas, a mixed gas of trifluoromethane and helium ($CHF_3$: He=50 sccm: 100 sccm); electric power, 150 W; bias power, 475 W; pressure, 5.5 Pa; and process time, 3 seconds. Then, fourth etching was performed with conditions set as follows: substrate temperature was 70° C.; etching gas, a mixed gas of trifluoromethane and helium ($CHF_3$: He=7.5 sccm: 142.5 sccm); electric power, 475 W; bias power, 150 W; pressure, 5.5 Pa; and process time, 36 seconds.

In addition, the etching conditions for the aluminum oxide film were as follows: substrate temperature was 70° C.; etching gas, boron trichloride ($BCl_3$=80 sccm); electric power, 450 W; bias power, 100 W; pressure, 1.9 Pa; and process time, 185 seconds.

Next, in the opening and over the insulating film 47, a conductive film in which a 50-nm-thick titanium film, a 200-nm-thick aluminum film, and a 50-nm-thick titanium film were stacked in this order was formed by a sputtering method. Deposition conditions of the uppermost titanium film and the lowermost titanium film were set as follows: atmosphere was argon (flow rate: 20 sccm); pressure, 0.1 Pa; electric power (DC), 12 kW; substrate temperature, room temperature (27° C.); distance between the substrate and the target, 400 mm. Deposition conditions of the aluminum film were set as follows: atmosphere was argon (flow rate: 50 sccm); pressure, 0.4 Pa; electric power (DC), 1 kW; substrate temperature, room temperature (27° C.); distance between the substrate and the target, 60 mm.

Next, the shapes of the conductive film in the opening and over the insulating film 47 was processed by etching to form a wiring. For the etching, an inductively-coupled plasma etching method was used. First etching was performed with conditions set as follows: substrate temperature was 70° C.; etching gas, a mixed gas of boron trichloride and chlorine ($BCl_3$: $Cl_2$=60 sccm: 20 sccm); electric power, 450 W; bias power, 100 W; pressure, 1.9 Pa; and process time, approximately 100 seconds. Then, second etching was performed with conditions set as follows: substrate temperature was 70° C.; etching gas, a mixed gas of carbon tetrafluoride ($CF_4$=80 sccm); electric power, 500 W; bias power, 50 W; pressure, 2.0 Pa; and process time, approximately 15 seconds.

Then, a 1.6-μm-thick polyimide film was formed by a coating method, and heat treatment was performed at 300° C. under an air atmosphere for approximately one hour.

Through the above process, the transistor of this example was manufactured.

Figure 41:
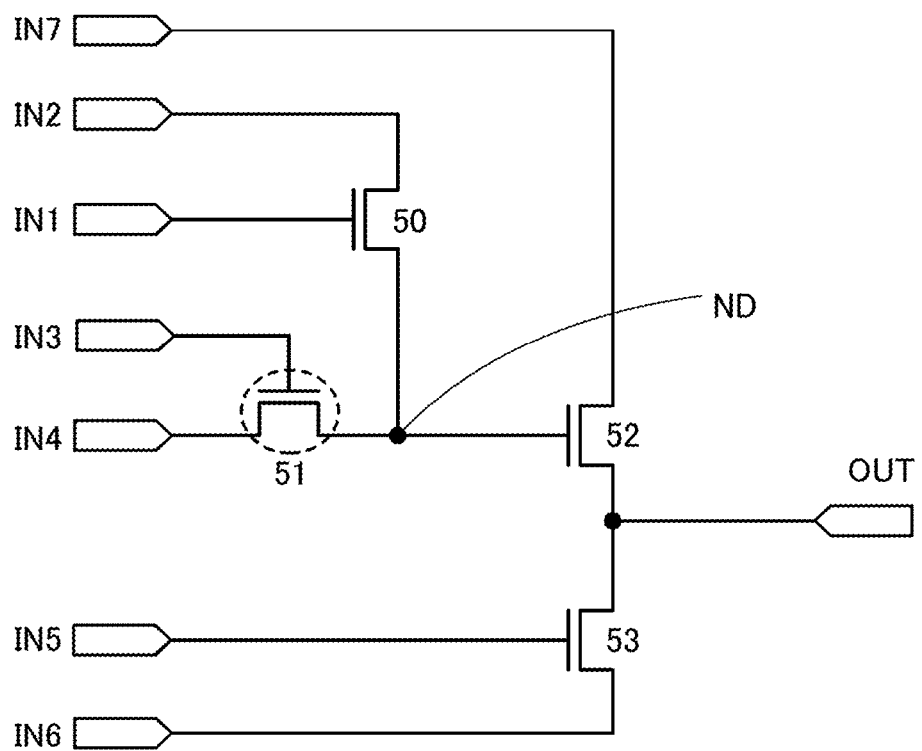
FIG. 41 is a circuit diagram of an evaluation circuit.

An evaluation circuit used for measuring the off-state current is shown in FIG. 41. The evaluation circuit shown in FIG. 41 includes transistors 50, 51, 52, and 53. A gate of the transistor 50 is connected to an input terminal IN1, one of a source and a drain of the transistor 50 is connected to an input terminal IN2, and the other of the source and the drain of the transistor 50 is connected to a gate of the transistor 52 (node ND). A gate of the transistor 51 is connected to an input terminal IN3, one of a source and a drain of the transistor 51 is connected to an input terminal IN4, and the other of the source and the drain of the transistor 51 is connected to the gate of the transistor 52 (node ND). One of a source and a drain of the transistor 52 is connected to an input terminal IN7, and the other of the source and the drain of the transistor 52 is connected to an output terminal OUT. A gate of the transistor 53 is connected to an input terminal IN5, one of a source and a drain of the transistor 53 is connected to an input terminal IN6, and the other of the source and the drain of the transistor 53 is connected to the output terminal OUT.

The channel length, the channel width, and the Lov length of the transistor 51 were 0.8 μm, 10 cm, and 0.3 μm, respectively. Note that Lov length denotes a length in the channel length direction where the conductive film 43 and the gate electrode 46 are overlap with each other. The channel length direction denotes a direction in which carriers move at the shortest distance between the pair of conductive films 43. The channel length, the channel width, and the Lov length of the transistors 52 and 53 were 3 μm, 100 μm, and 0.3 μm, respectively. The channel length, the channel width, and the Lov length of the transistor 50 were 10 μm, 10 μm, and 0.3 μm, respectively.

FIG. 42 is a timing chart of potentials applied to the input terminals IN1, IN2, IN5, IN6, and IN7 in measurement and data holding. Note that both in measurement and data holding, potentials of −3 V and 1 V continued to be applied to the input terminals IN3 and IN4, respectively. Table 9 shows high level potentials (Hi) and low level potentials (Lo) applied to the input terminals IN1, IN2, IN5, IN6, and IN7.

TABLE 9

|     | Hi    | Lo    |
| --- | ----- | ----- |
| IN1 | 5 V   | −3 V  |
| IN2 | 2 V   | 1 V   |
| IN5 | −1 V  | 1.5 V |
| IN6 | −2 V  | 1.5 V |
| IN7 | 3 V   | 1.5 V |

As shown in the timing chart of FIG. 42, a high-level potential was applied to the input terminals IN1, IN2 and IN7, and a low-level potential was applied to the input terminals IN5 and IN6 in a period T1. By this operation, a potential of 2V including data applied from the input terminal IN2 was applied to the node ND. Then, in a period T2, a low-level potential was applied to the input terminals IN1, IN2, and IN7, and a high-level potential was applied to the input terminals IN5 and IN6. By this operation, the node ND was put in a floating state and thus the potential was held in the node ND. Next, in the period T3, a high-level potential was applied to the input terminals IN1, IN2 and IN7, and a low-level potential was applied to the input terminals IN5 and IN6. By this operation, as in the period T1, a potential of 2 V including data applied from the input terminal IN2 was applied to the node ND.

Note that by applying a potential including data to the node ND in each of the periods T1 and T3, variation of the potentials of the node ND caused by variation in electric characteristics of the transistor 50 is prevented.

In the next period T4, a low-level potential was applied to the input terminals IN1, IN2, and IN7, and a high-level potential was applied to the input terminals IN5 and IN6. By this operation, the node ND was put in the floating state and thus the potential was held in the node ND.

In the next period T5, low-level potentials were applied to the input terminals IN1, IN2, IN5, and IN6, and a high-level potential was applied to the input terminal IN7. By this operation, the transistors 52 and 53 serve as source follower circuits. Thus, as the potential of the node ND is higher, the drain current of the transistor 52 becomes large and thus the potential of the output terminal OUT becomes close to the potential applied to the input terminal IN7. As the potential of the node ND is lower, the drain current of the transistor 52 becomes small and thus the potential of the output terminal OUT becomes close to the potential applied to the input terminal IN6. In other words, when the off-state current of the transistor 51 is small and leakage of charge from the node ND is small, the potential of the output terminal OUT is high. When the off-state current of the transistor 51 is large and leakage of charge from the node ND is large, the potential of the output terminal OUT is low.

In the next period T6, a low-level potential was applied to the input terminals IN1, IN2, and IN7, and a high-level potential was applied to the input terminals IN5 and IN6. By this operation, the node ND was put in the floating state and thus the potential was held in the node ND.

After the period T6 was terminated, the periods T5 and T6 were repeated.

Note that the lengths of the periods T1, T2, T3, T4, and T5 were 10 seconds, 15 seconds, 10 seconds, 20 seconds, and 10 seconds, respectively. Between the periods T1 and T2, a period during which the potentials of the input terminals IN1 and IN2 were at a low level and a high level, respectively, was provided for 5 seconds. Between the periods T2 and T3, a period during which the potentials of the input terminals IN1 and IN2 were at a low level and a high level, respectively, was provided for 5 seconds. Between the periods T3 and T4, a period during which the potentials of the input terminals IN1 and IN2 were at a low level and a high level, respectively, was provided for 5 seconds. The length of the period T6 was 5 minutes. In other words, in data holding, the potential of the output terminal OUT in the period T5 was measured at 5-minutes intervals.

As described above, change in potentials of the node ND is estimated from change in measured potentials of the output terminal OUT. Further, the off-state current of the transistor 51 is estimated from change in potentials of the node ND.

The amount of charge accumulated in the node ND ($Q_N$ [C]) is a product of the capacitance that can be accumulated in the node ND ($C_N$ [F]) and the potential of the node ND ($V_N$ [V]), i.e., $Q_N = C_N \cdot V_N$. A value obtained by dividing the change in the amount of charge accumulated in the node ND ($\Delta Q_N$ [C]) by change in time ($\Delta t$ [seconds]) is leakage current ($I_{Nleak}$ [A]) of the node ND.

Thus, the relationship between leakage current ($I_{Nleak}$ [A]) of the node ND and change in potentials of the node ND ($\Delta V_N$ [V]) with respect to change in time ($\Delta t$ [seconds]) is expressed by Equation 3 using capacitance that can be accumulated in the node ND ($C_N$ [F]).

$$I_{Nleak} = C_N \times \Delta V_N / \Delta t \qquad \text{(Equation 3)}$$

The potential of the output terminal OUT was measured in accordance with the following sequence. First, while the substrate temperature was kept at 150° C. for 10 hours, data writing to the node ND (operation performed in the periods T1 to T3) was performed hourly (10 times in total). Then, while the substrate temperature was kept at 125° C. for 10 hours, data writing to the node ND was performed hourly (10 times in total). Then, while the substrate temperature was kept at 85° C. for 24 hours, data writing to the node ND was performed every six hours (4 times in total). Then, while the substrate temperature was kept at 85° C. for 36 hours, data writing to the node ND was performed every 12 hours (3 times in total). Then, the substrate temperature was kept at 60° C. for 60 hours, and data writing to the node ND was performed just one time at the beginning. During data holding, the potential of the output terminal OUT in the period T5 was measured at 5-minutes intervals as described above.

Figure 38:
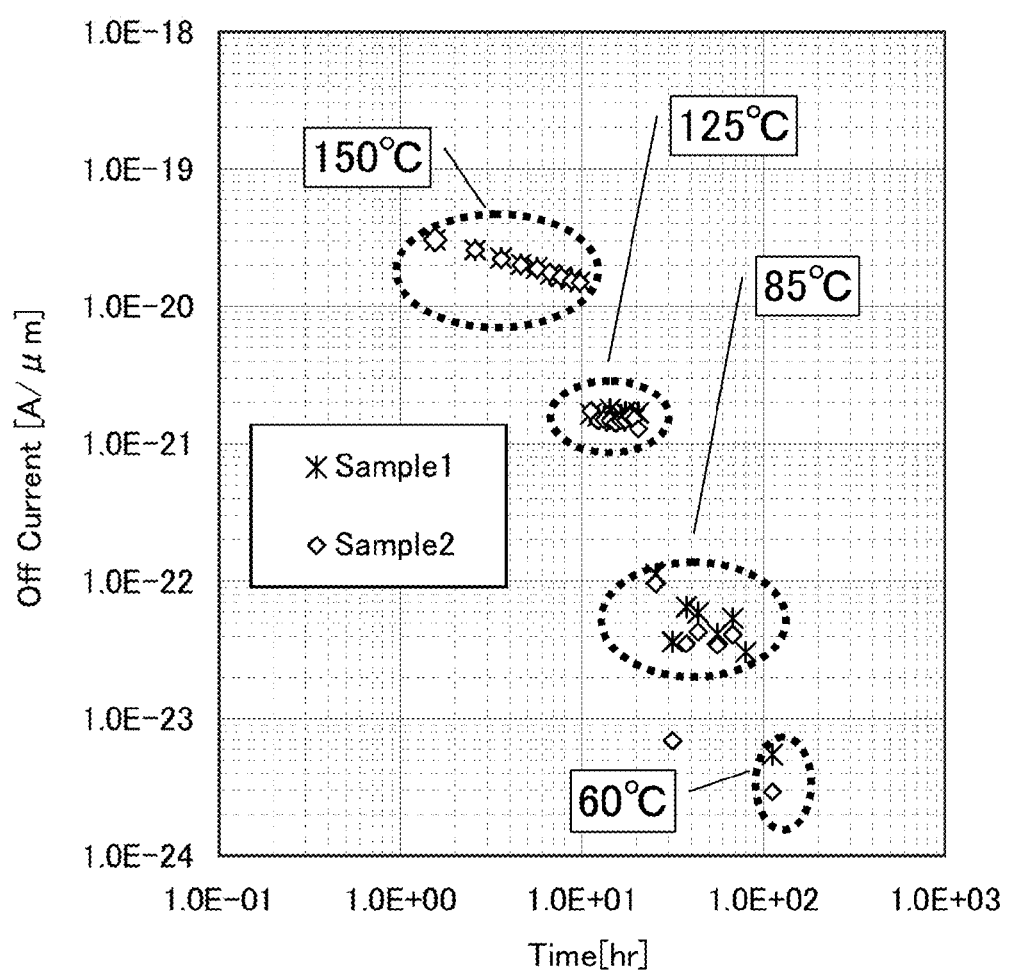
FIG. 38 shows measurement values of off-state current.

Further, two evaluation circuits (Sample 1 and Sample 2) were prepared for the measurement. FIG. 38 shows values of off-state current estimated from change in measured potentials of the output terminal OUT in Sample 1 and Sample 2. As shown in FIG. 38, the off-state current of the transistor 51 was found to be reduced as time passed. The reason why the off-state current was estimated to be reduced as time passed is described. Just after a potential is applied to the node ND, the movement of charge trapped by a shallow trap level included in the gate insulating film of the transistor 51 contributes to change in potentials of the node ND. For this reason, as time passed, the number of trap levels which have not trapped charge was decreased and thus the amount of charge which moved was reduced. Accordingly, the off-state current was estimated to be small. In other words, as time passes, a more accurate value of off-state current which is less influenced by the movement of charge trapped by a trap level can be obtained.

Specifically, from change in potentials of the output terminal OUT that was measured when the substrate temperature was 85° C., the off-state current of the transistor 51 was estimated to be 30 yA/μm to 40 yA/μm. In addition, from change in potentials of the output terminal OUT that were measured when the substrate temperature was 60° C., the off-state current of the transistor 51 was estimated to be 3 yA/μm to 5 yA/μm.

Figure 39:
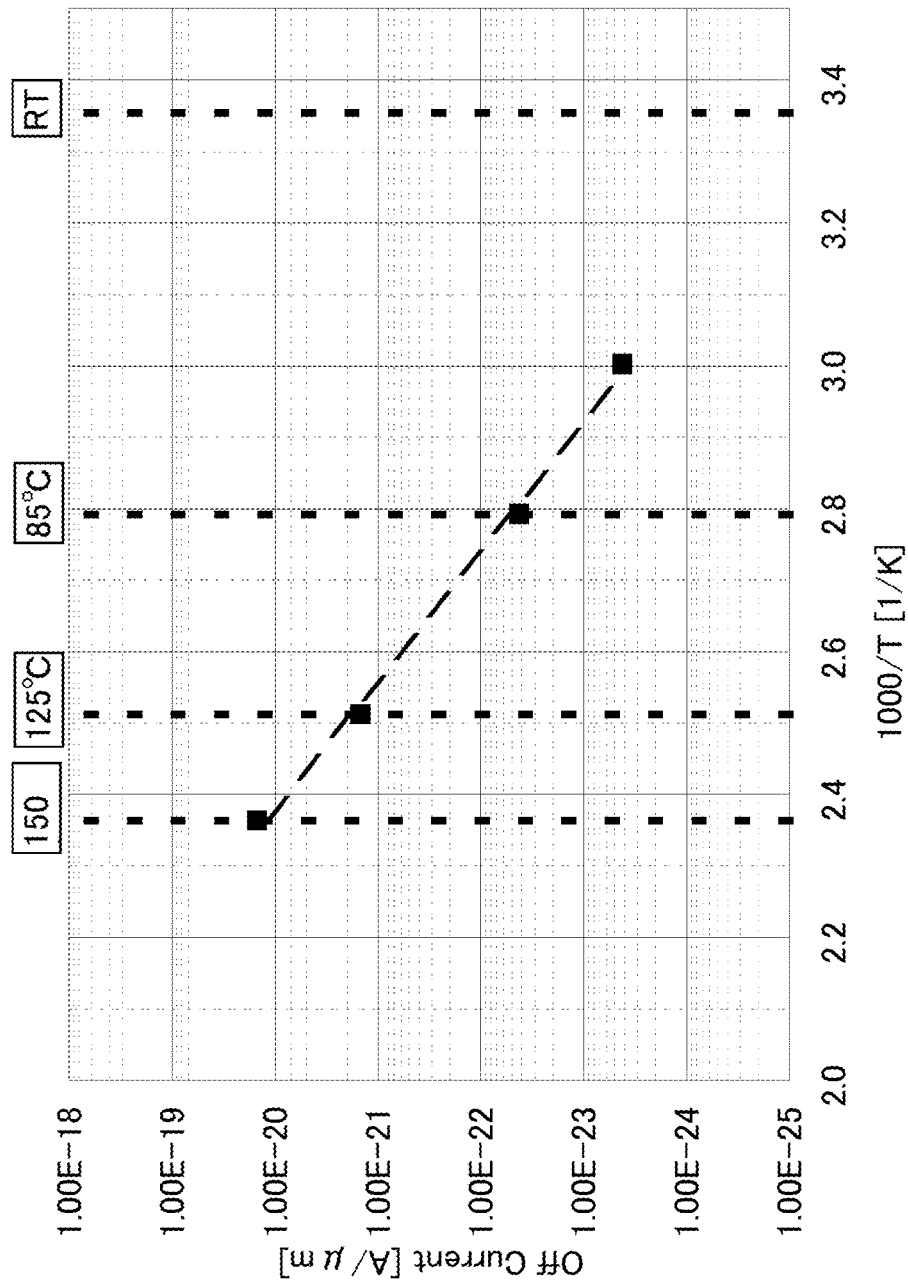
FIG. 39 shows an Arrhenius plot of off-state current.

Next, an Arrhenius plot of off-state current in FIG. 38 is shown in FIG. 39. The horizontal axis represents values obtained by magnifying the inverse of the substrate temperature by 1,000 times, and the vertical axis represents off-state current on a logarithmic scale. The relationship between off-state current and temperature obtained by the measurement is represented by the straight line graph as shown in FIG. 39. The activation energy was found to be nearly constant.

Embodiment 11)

Figure 37:
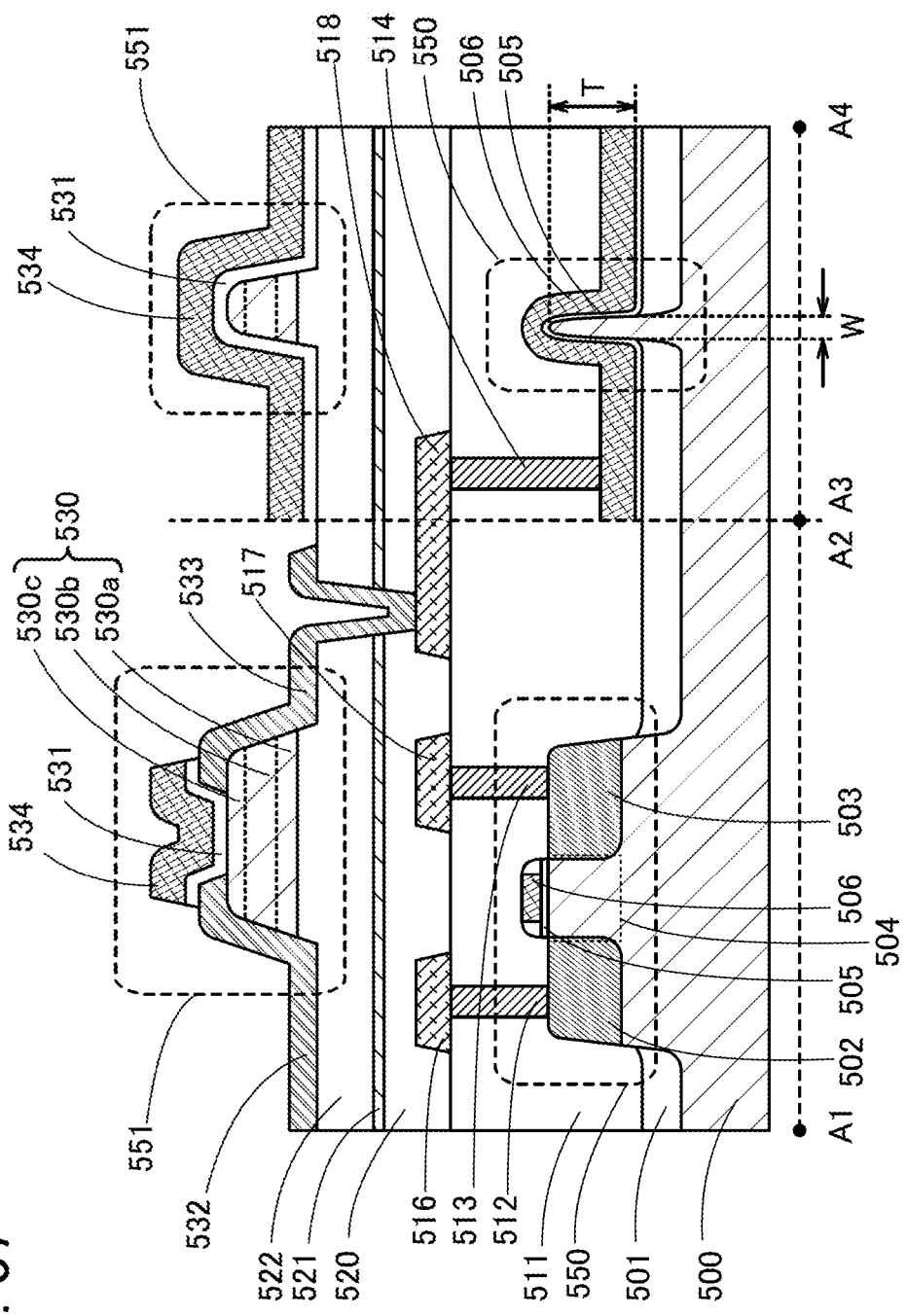
FIG. 37 shows a cross-sectional structure of a semiconductor device.

FIG. 37 illustrates a cross-sectional structure of a semiconductor device according to one embodiment of the present invention, as an example. A region along dashed line A1-A2 shows structures of transistors 550 and 551 in the channel length direction, and a region along dashed line A3-A4 shows structures of the transistors 550 and 551 in the channel width direction. Note that in one embodiment of the present invention, the channel length direction of the transistor 550 does not necessarily correspond to the channel length direction of the transistor 551.

The channel length direction denotes a direction in which carriers move at the shortest distance between a pair of impurity regions serving as a source region and a drain region. The channel width direction denotes a direction perpendicular to the channel length direction.

The case is shown in FIG. 37 where the transistor 551 having a channel formation region in an oxide semiconductor film is formed over the transistor 550 having a channel formation region in a single crystal silicon substrate.

The transistor 550 may include a channel formation region in a semiconductor film or a semiconductor substrate of silicon, germanium, or the like in an amorphous, microcrystalline, polycrystalline, or signal crystal state. Alternatively, the transistor 550 may include a channel formation region in an oxide semiconductor film or an oxide semiconductor substrate. In the case where channel formation regions of all the transistors are included in an oxide semiconductor film or an oxide semiconductor substrate, the transistor 551 is not necessarily stacked over the transistor 550, and the transistors 551 and 550 may be formed in the same layer.

In the case where the transistor 550 is formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

As a substrate 500 provided with the transistor 550, a silicon substrate, a germanium substrate, a silicon germanium substrate, or the like is used. An example in which a single crystal silicon substrate is used as the substrate 500 is illustrated in FIG. 37.

The transistor 550 is electrically isolated from other elements by an element isolation method. As the element isolation method, a trench isolation method (a shallow trench isolation (STI) method) or the like is used. In FIG. 37, an example in which the trench isolation method is used to electrically isolate the transistor 550 is shown. Specifically, FIG. 37 shows an example in which the transistor 550 is isolated using an element isolation region 501. The element isolation region 501 is formed in the following manner: a trench which is formed in the substrate 500 by etching or the like is filled with an insulator including silicon oxide or the like, and then, the insulator is partially removed by etching or the like.

In a projection of the substrate 500 that exists in a region other than the trench, an impurity region 502 and an impurity region 503 of the transistor 550 and a channel formation region 504 sandwiched between the impurity regions 502 and 503 are provided. Further, the transistor 550 includes an insulating film 505 covering the channel formation region 504 and a gate electrode 506 that overlaps the channel formation region 504 with the insulating film 505 provided therebetween.

Since in the transistor 550, the gate electrode 506 overlaps the side part and the upper part of the projection in the channel formation region 504 with the insulating film 505 provided therebetween, carriers flow in a wide region including the side part and the upper part of the channel formation region 504. Therefore, an area over the substrate occupied by the transistor 550 is reduced, and the number of transferred carriers in the transistor 550 is increased. As a result, the on-state current of the transistor 550 is increased and the field-effect mobility of the transistor 550 is increased. Suppose the width in the channel width direction of the projection in the channel formation region 504 (the surrounded channel width) is W, and the thickness of the projection in the channel formation region 504 is T. When the aspect ratio that corresponds to the ratio of the thickness T to the channel width W is high, a region where carrier flows becomes wider. Thus, the on-state current of the transistor 550 is further increased and the field-effect mobility of the transistor 550 is further increased.

Note that when the transistor 550 is formed using a bulk semiconductor substrate, the aspect ratio is desirably 0.5 or more, more desirably 1 or more.

An insulating film 511 is provided over the transistor 550. Openings are formed in the insulating film 511. A conductive film 512, a conductive film 513, and a conductive film 514 that are electrically connected to the impurity region 502, the impurity region 503, and the gate electrode 506, respectively, are formed in the openings.

The conductive film 512 is electrically connected to a conductive film 516 formed over the insulating film 511. The conductive film 513 is electrically connected to a conductive film 517 formed over the insulating film 511. The conductive film 514 is electrically connected to a conductive film 518 formed over the insulating film 511.

An insulating film 520 is provided over the conductive films 516 to 518. An insulating film 521 having a blocking effect of preventing diffusion of oxygen, hydrogen, and water is provided over the insulating film 520. As the insulating film 521 has higher density and becomes denser or has a fewer dangling bonds and becomes more chemically stable, the insulating film has a higher blocking effect. The insulating film 521 that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. As the insulating film 521 that has an effect of blocking diffusion of hydrogen and water can be formed using, for example, silicon nitride or silicon nitride oxide.

An insulating film 522 is provided over the insulating film 521. The transistor 551 is provided over the insulating film 522.

The transistor 551 includes, over the insulating film 522, a semiconductor film 530 including an oxide semiconductor, a conductive film 532 and a conductive film 533 serving as a source electrode and a drain electrode and being electrically connected to the semiconductor film 530, a gate insulating film 531 covering the semiconductor film 530, and a gate electrode 534 overlapping the semiconductor film 530 with the gate insulating film 531 provided therebetween. Note that an opening is provided in the insulating films 520 to 522. The conductive film 533 is connected to the conductive film 518 in the opening.

Note that in FIG. 37, the transistor 551 includes the gate electrode 534 on at least one side of the semiconductor film 530. A gate electrode overlapping the semiconductor film 530 with the insulating film 522 provided therebetween may be further included.

In the case where the transistor 551 has a pair of gate electrodes, one of the gate electrodes may be supplied with a signal for controlling the conduction state and the non-conduction state of the transistor 551, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 37, the transistor 551 has a single-gate structure where one channel formation region corresponding to the gate electrode 534 is provided. However, the transistor 551 may have a multi-gate structure in which a plurality of gate electrodes electrically connected to each other are provided and thus a plurality of channel formation regions are included in one active layer.

FIG. 37 illustrates an example in which the semiconductor film 530 included in the transistor 551 includes oxide semiconductor films 530a to 530c that are stacked in this order over the insulating film 522. However, one embodiment of the present invention may have a structure in which the semiconductor film 530 included in the transistor 551 is a single metal oxide film.

EXAMPLE 1

In this example, a configuration of a prototyped processor according to one embodiment of the present invention, will be described.

Figure 26:
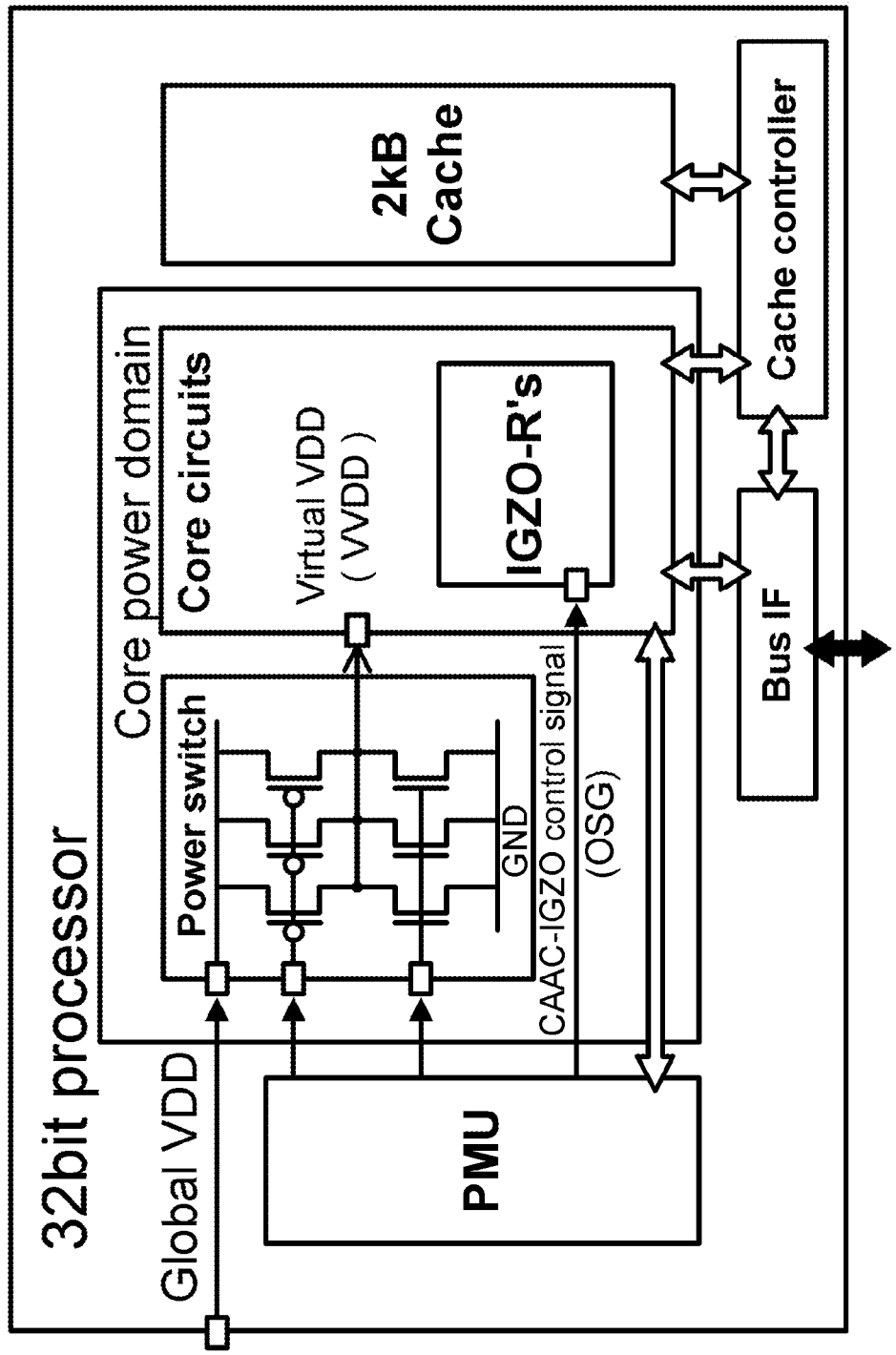
FIG. 26 is a block diagram of a prototyped processor.

FIG. 26 is a block diagram of the prototyped processor. The processor includes a core power domain (Core power domain) including a 32-bit MIPS I core (Core circuits) having a three-stage pipeline and a power-off switch (Power switch), a power management unit (PMU), a cache having a memory capacity of 2 kB (2 kB Cache), a cache controller, and a bus interface (Bus IF).

As for the number of transistors included in the processor except the cache, the number of transistors in which Si was used in a channel formation region (such a transistor is hereinafter referred to as Si FET) was 170,000 and the number of transistors in which CAAC-IGZO was used in a channel formation region (such a transistor is hereinafter referred to as CAAC-IGZO FET) was 14,000. The CAAC-IGZO FETs were used for all of the registers and caches included in the core. All of the memory devices in the processor were configured to hold data in a period during which supply of power supply voltage was stopped.

In the prototyped processor, each specific instruction for power gating (PG) and clock gating (CG) was added to an instruction set for controlling the operation of the processor. The PMU controlled PG and CG in accordance with the specific instructions. Two control modes were prepared for recovery from PG and CG One of the control modes was an automatic recovery after counting up to a given count number, and the other was recovery by interruption.

For the power-off switch (Power switch), a p-channel Si FET connected to a power supply potential VDD was used.

For easy evaluation, the power-off switch was configured so that time for saving, recovery, power-off, and clock stop can be set finely. An n-channel Si FET for dropping VVDD (Virtual VDD) that is supplied to the core circuits (Core circuits) through the power-off switch to 0 V is used for the power-off switch so that VVDD can be controlled by the PMU.

Figure 27:
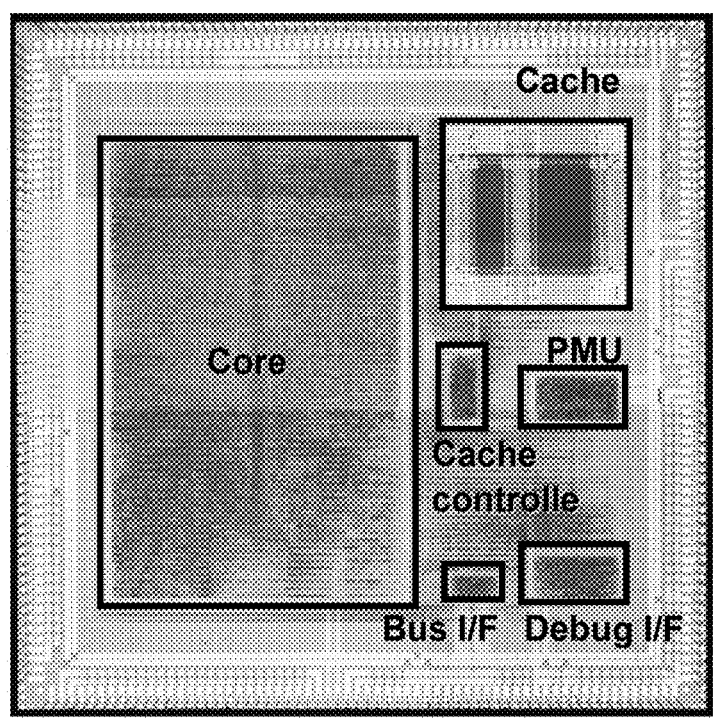
FIG. 27 shows an appearance of the prototyped processor.

FIG. 27 is the appearance of the prototyped processor. The Si FET and the CAAC-IGZO FET in the processor were fabricated by a 0.35-µm process and a 0.18-µm process, respectively. Table 6 shows the features of the processor.

TABLE 6

| | ISA | | MIPS 1 (32-bit, RISC) |
|---|---|---|---|
| | Pipeline | | 3 stages |
| | Cache | | 2 way, 2 kB |
| | Technology | Si: 0.35 µm | CAAC-IGZO: 0.18 µm |
| Number of | Core | Si: 116,200 | CAAC-IGZO: 1,410 |
| transistors | Cache | Si: 200,000 | CAAC-IGZO: 50,000 |
| | Others | Si: 55,100 | — |
| | Power supply voltage | Si: 2.5 V/0 V | CAAC-IGZO: 3.5 V/−1 V |
| | Clock frequency | | 15 MHz |

FIGS. 28 to 31 show the sequence of power gating in the memory device using the CAAC-IGZO FET (IGZO-R).

The IGZO-R includes a general flip-flop (Flip-flop) and a state retention circuit (State retention circuit). The state retention circuit includes a primary retention circuit (SRC1) including the Si FET and a capacitor Cs1 and a secondary retention circuit (SRC2) including the CAAC-IGZO FET and a capacitor Cs2.

Figure 32:
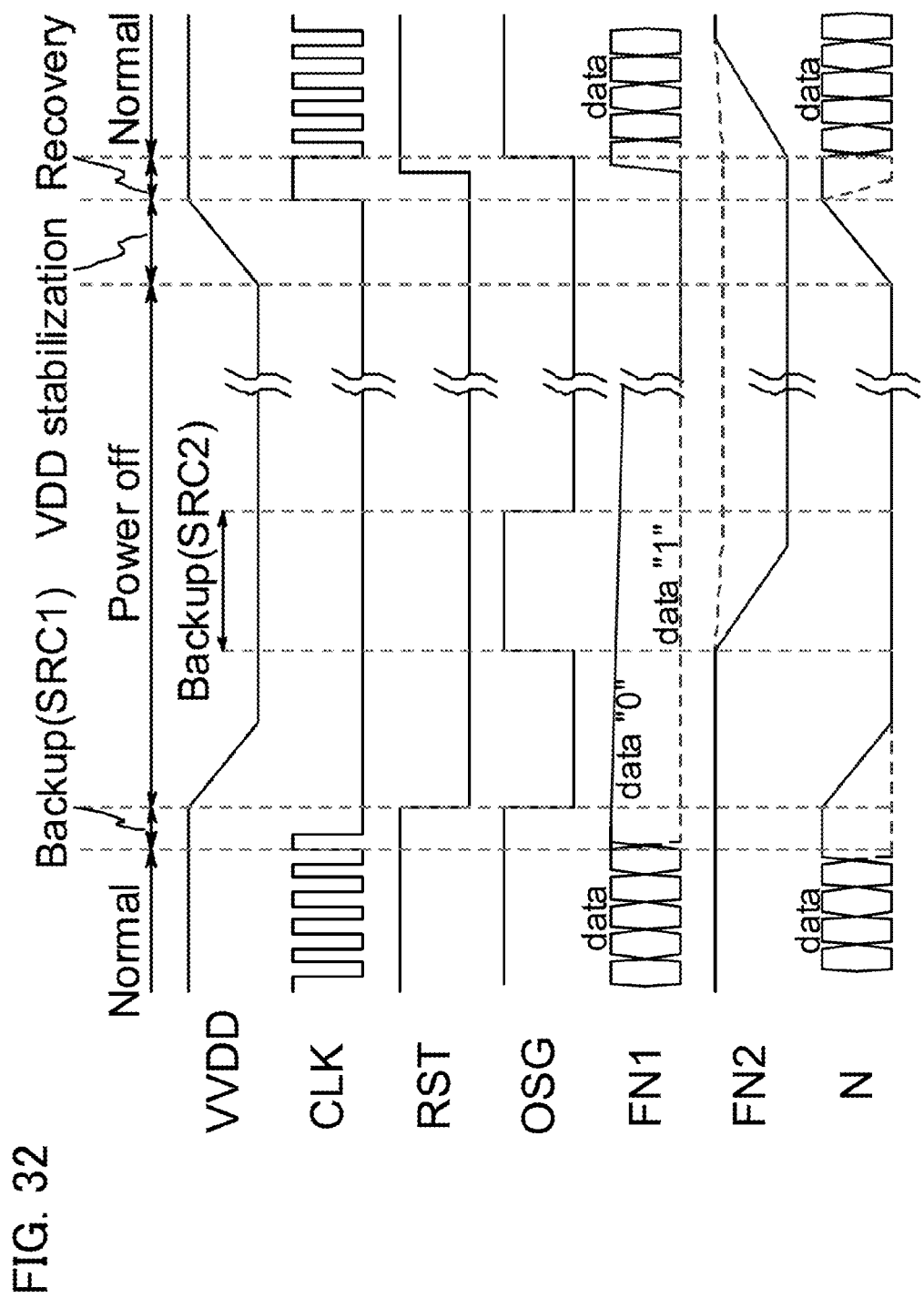
FIG. 32 is a timing chart of an IGZO-R.

FIG. 32 is a timing chart of the IGZO-R. The IGZO-R can be used as a general flip-flop in a normal operation. The potential of a signal RST is at a high level and the capacitor Cs1 is charged and discharged all the time in accordance with data of the flip-flop. The capacitor Cs1 is a load that does not exist in a general flip-flop and is thought to cause extra energy consumption and operation speed degradation. However, in the actual measurement, there was little influence on performance of the processor as described below.

The potential of a signal OSG is at a high level in a normal operation, and the capacitor Cs2 is charged through the diode-connected Si FET.

The SRC1 includes the Si FET and data is written to the capacitor Cs1 all the time in a normal operation. Thus, in data saving operation, data saving is completed by setting the potential of the signal RST at a low level, and just after the data saving, supply of the power supply voltage to the IGZO-R is stopped. In other words, time from data saving to stop of supply of the power supply voltage is theoretically possible to be 0 clock in the IGZO-R.

However, in the actual processor, it takes time of 1.5 clocks until power-off after the core executes the PG instruction. This is because it takes time of 1 clocks to start a PG control circuit in the PMU. In addition, this is because a clock edge of the PMU is reverse of that of the core and adjustment by 0.5 clocks is required before and after PG FIG. 32 is a timing chart of the case of saving data "0" (solid line) and the case of saving data "1" (dotted line).

In short PG data is retained by the SRC1 and then recovery operation is performed. On the other hand, in long data holding, data is saved in the SRC2 before the data in the SRC1 is lost. The potential of the signal OSG is set at a high level during a given period while VVDD is 0 V, so that data is saved in the SRC2. The capacitor Cs2 is charged in advance and is discharged in accordance with the data input to the SRC2. Thus, data is saved in the SRC2 even in the state where supply of the power supply voltage to the IGZO-R is stopped.

According to the measurement results, data retention periods in the SRC1 and the SRC2 were 12.8 msec and over a day, respectively. In the case where longer power gating for over a day is needed, refresh operation of data can be performed.

Figure 28:
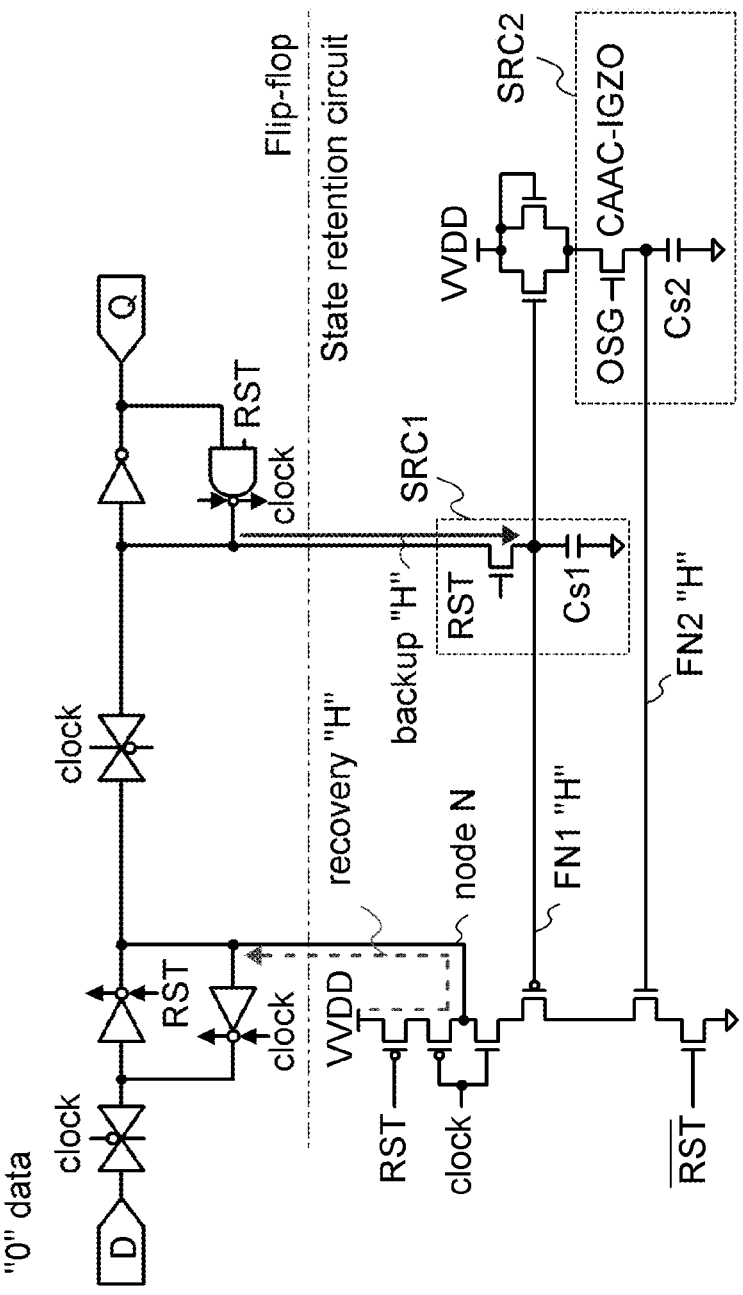
FIG. 28 shows the sequence of power gating in a memory device (IGZO-R).
Figure 29:
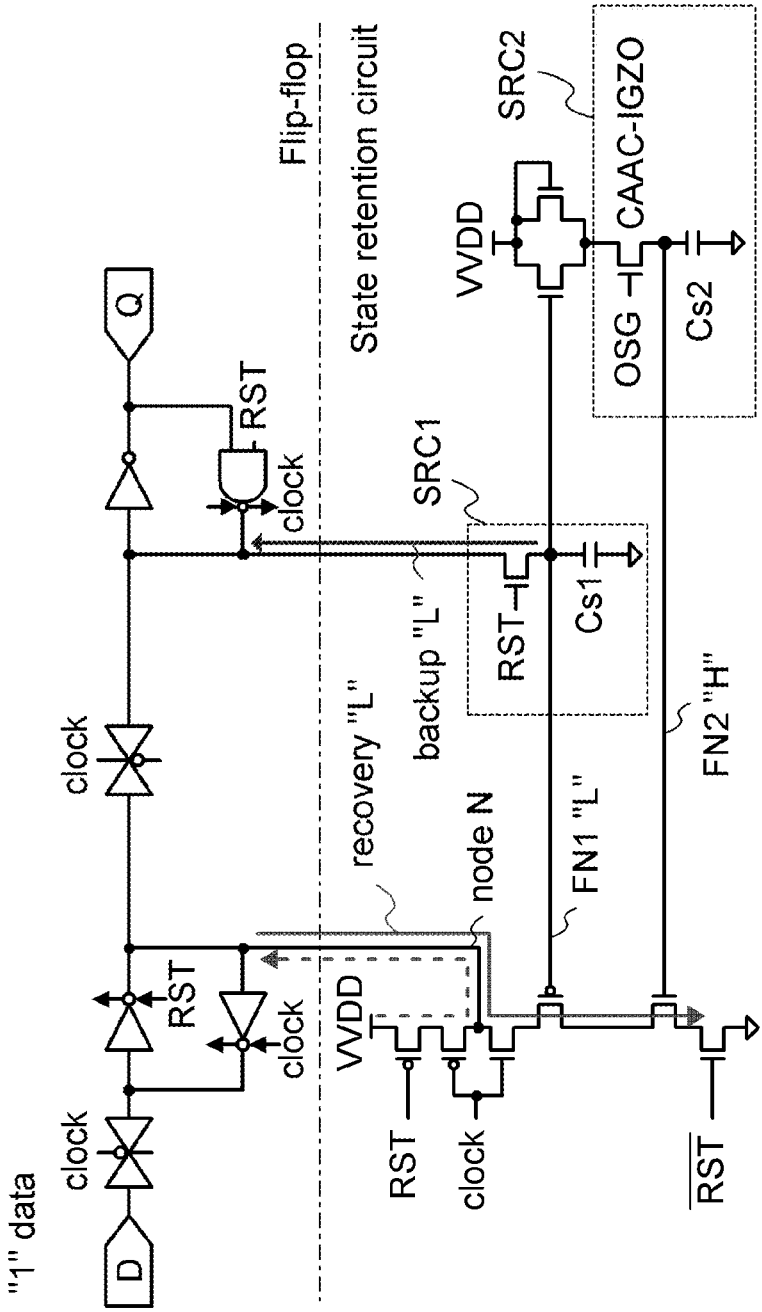
FIG. 29 shows the sequence of power gating in the memory device (IGZO-R).
Figure 30:
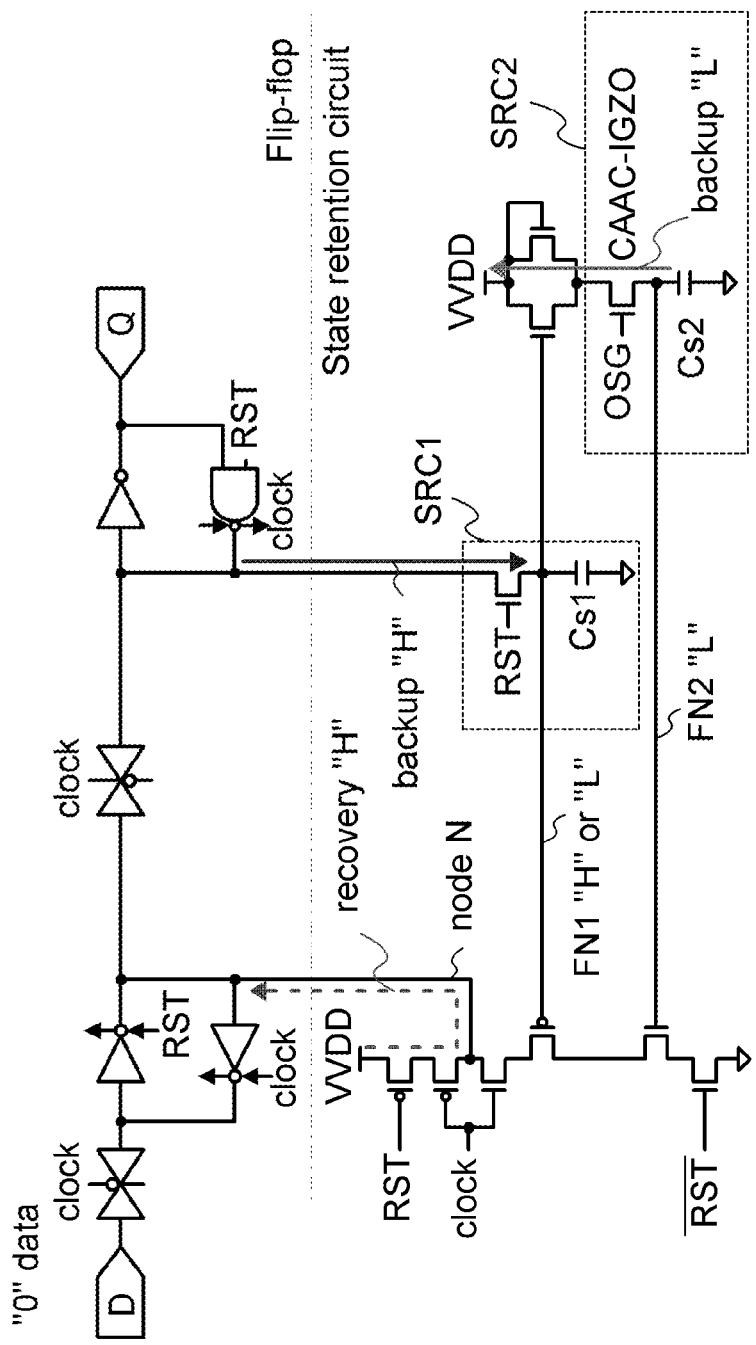
FIG. 30 shows the sequence of power gating in the memory device (IGZO-R).
Figure 31:
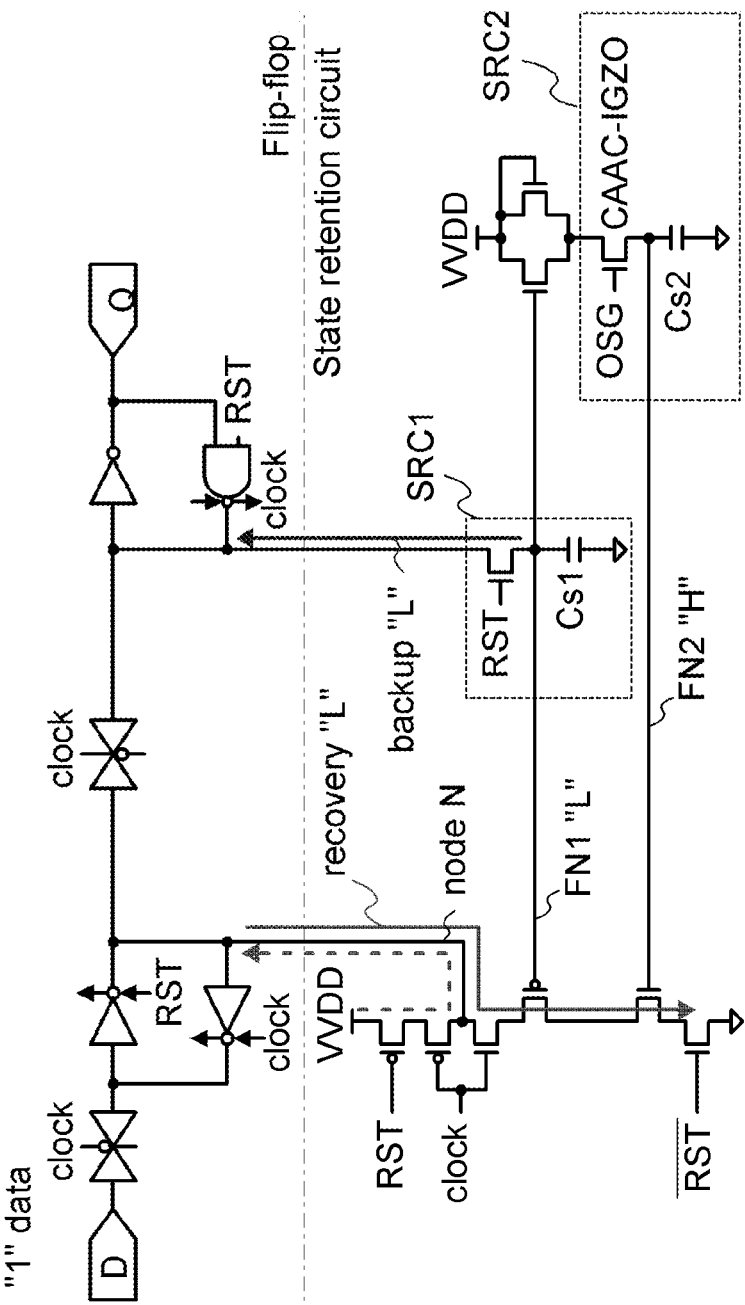
FIG. 31 shows the sequence of power gating in the memory device (IGZO-R).

In recovery operation, supply of the power supply voltage to the core was started first and VVDD was stabilized. At the same time, the potentials of the clock signal CLK and the signal RST were each set at a high level and VVDD was applied to the node N as shown by the dotted lines in FIGS. 28 to 31. Next, the potential of the clock signal CLK was set at a high level. Thus, the potential of the node N was determined depending on the conduction state of the p-channel Si FET connected to the capacitor Cs1 and the conduction state of the n-channel Si FET connected to the capacitor Cs2 shown in FIGS. 28 to 31. Specifically, in the case where data "0" was held by the SRC1 or the SRC2, at least one of the two Si FETs were always OFF and the potential of the node N was kept at a high level as shown in FIGS. 28 and 30. On the other hand, in the case where data "1" was held by the SRC1 or the SRC2, both of the two Si FETs were turned on and the node N was discharged to be a low level as shown by the solid lines in FIGS. 29 and 31. Then, the signal RST was set at a high level and accurate data was latched to the flip-flop.

The processor according to one embodiment of the present invention has the following advantages on overhead of energy in PG The first advantage is that energy required for data saving is small. This is because in data saving in the IGZO-R, both the SRC1 and the SRC2 require power only for charging and discharging the capacitor. The second advantage is that it takes time only of 1.5 clocks until supply of the power supply voltage is stopped and accordingly energy due to leakage current flowing through the whole processor for this period of time is also small. The third advantage is that energy consumption is zero while supply of the power supply voltage is stopped. This is because both the SRC1 and the SRC2 require no power for data holding. From these advantages, overhead of energy in PG in the whole processor is expected to be small.

In addition, the processor according to one embodiment of the present invention is designed just by addition of a wiring for supplying the signal OSG to a general flip-flop, and addition of a wiring to which a power supply potential is always supplied is unnecessary. By adding just one wiring to which the signal OSG is supplied from the PMU, a register in each circuit is easily replaced with the IGZO-R. Therefore, the IGZO-R is favorable in terms of complexity of designing and the influence on chip area, and a general design procedure can be employed.

Figure 33:
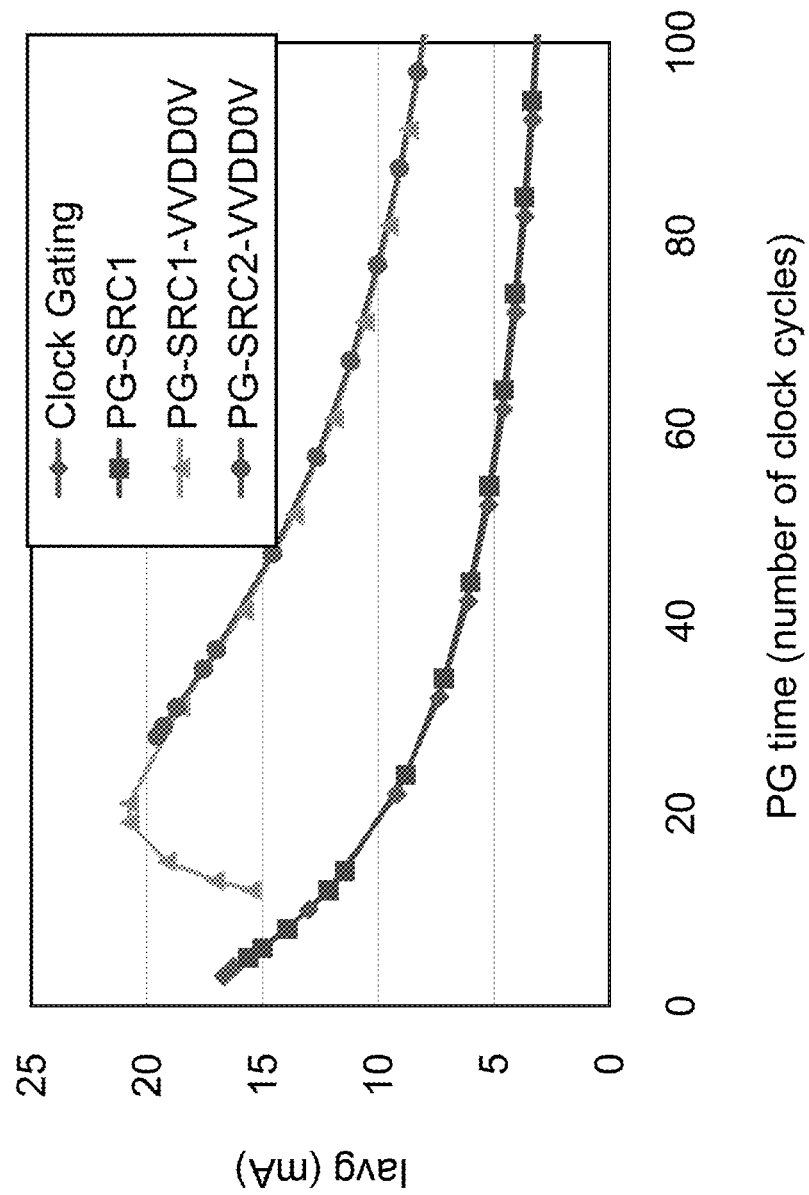
FIG. 33 shows measurement results of average power supply current in a core.
Figure 34:
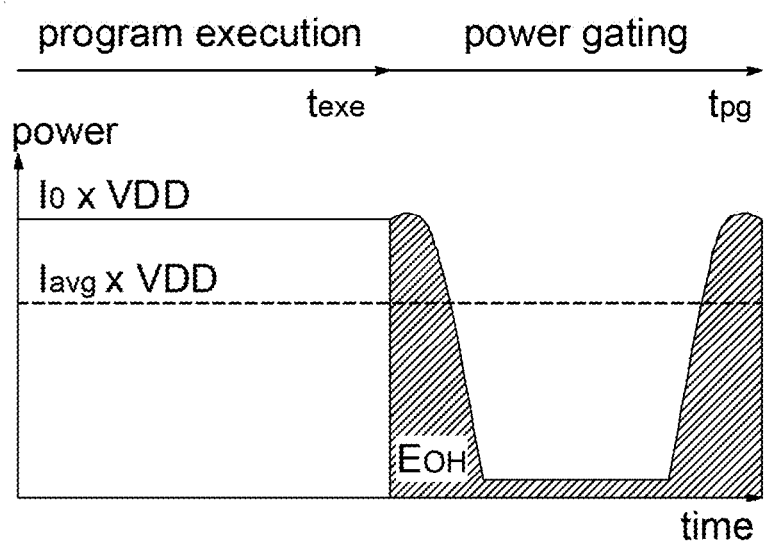
FIG. 34 shows operation state of a core in measurement of average power supply current.

FIG. 33 shows measurement results of average power supply current in the core. The measurement was performed at 15 MHz with PG time varied. As shown in FIG. 34, program execution and PG were repeated. The program includes an NOP instruction, a Jump instruction, and a PG instruction and requires a time of 9 clocks. FIG. 33 shows values obtained by the measurement of current (PG-SRC1) in data recovery from the SRC1 and current (PG-SRC2-VVDD0V) in data recovery from the SRC2.

Note that data saving to the SRC2 needs to be performed at VVDD of 0V. Thus, operation for forcibly dropping VVDD to 0 V was performed when supply of the power supply voltage to the IGZO-R was stopped before current in data recovery from the SRC1 was measured. The value of the current (PG-SRC2-VVDD0V) in data recovery from the SRC2 is larger than the value of the current (PG-SRC1) in data recovery from the SRC1. This is presumably because charge accumulated in the whole capacitance of the processor (hereinafter, referred to as chip capacitance) was discharged in a short time.

To accurately estimate energy required for data saving to the SRC2, current (PG-SRC1-VVDD0V) in data recovery from the SRC1 at the time when VVDD was forcibly dropped to 0 V when supply of the power supply voltage to the IGZO-R was stopped was also measured. As shown in FIG. 33, values of the current when VVDD was forcibly dropped to 0 V (PG-SRC1-VVDD0V) in data recovery from the SRC1 substantially overlap values of the current (PG-SRC2-VVDD0V) in data recovery from the SRC2. From this result, little current was found to be consumed for data saving to the SRC2. Note that measurement results of current in CG (Clock Gating) are also shown in FIG. 33.

The overhead $E_{OH}$ of energy in PG (hereinafter, referred to as energy overhead) is expressed by the following Equation (1) where execution time of the program is denoted by $t_{exe}$, PG time is denoted by $t_{pg}$, measured average current is denoted by $I_{avg}$, and average current is denoted by $I_0$ in program execution as in FIG. 34.

$$E_{OH}=(I_{avg}\times(t_{exe}+t_{pg})-I_0\times t_{exe})\times VDD \quad \text{(Equation 1)}$$

According to the block diagram of FIG. 26, to obtain the whole energy overhead of the core, energy consumed for inverting the signal OSG and energy consumed in the power-off switch (Power switch) need to be added to the energy overhead $E_{OH}$ in Equation 1.

Figure 35:
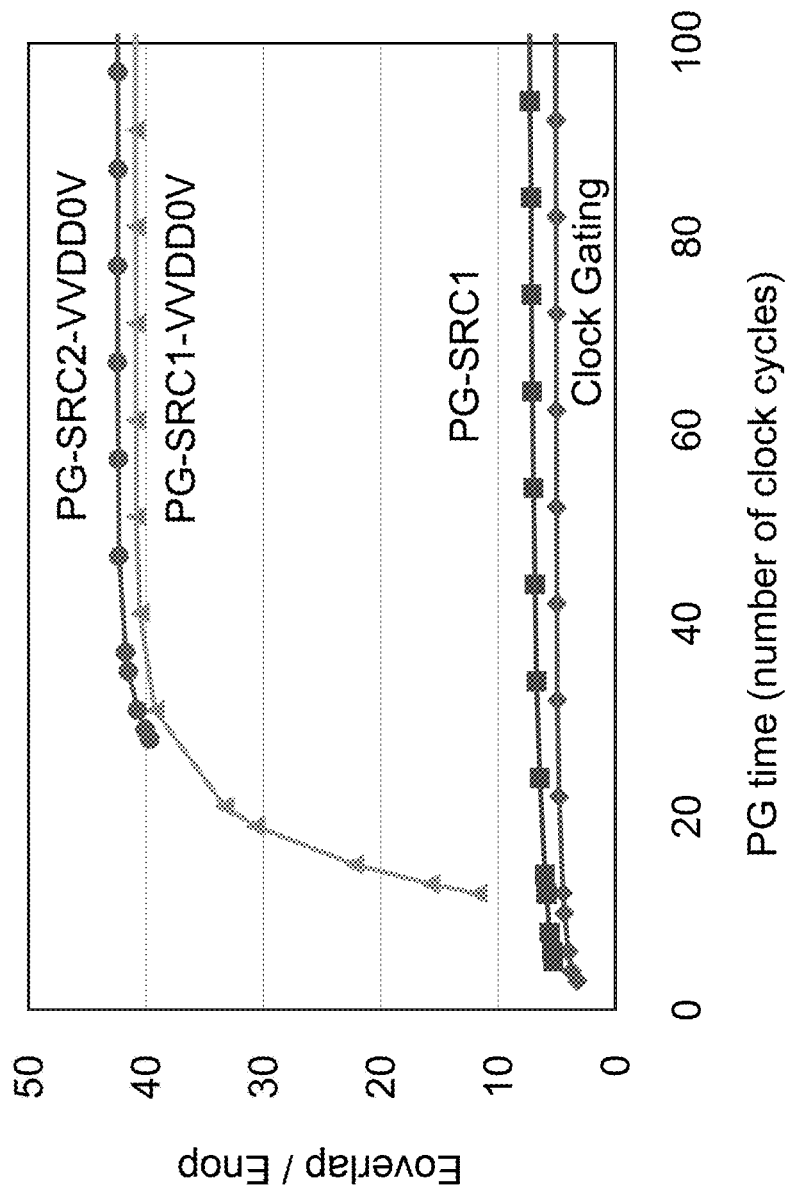
FIG. 35 shows the whole overhead energy of the core.

FIG. 35 shows the whole energy overhead of the core obtained by adding measurement values of energy consumed by inverting the signal OSG and measurement values of energy consumed in the power-off switch (Power switch) to the energy overhead $E_{OH}$. The vertical direction shows values normalized by energy $E_{NOP}$ (=2.7 nJ) consumed by 1 clocks in the NOP instruction, that is, a break-even cycle (BEC) with respect to the NOP instruction.

From FIG. 35, energy overhead in recovering data from the SRC1 was found to be 6×$E_{NOP}$. Difference between energy (PG-SRC1) in recovering data from the SRC1 and energy (Clock Gating) in CG shown in FIG. 35 is mainly attributed to energy required to invert the polarity of the potential of the signal OSG.

Energy required to charge and discharge the chip capacitance was found to be 34.5×$E_{NOP}$ from difference between energy (PG-SRC1-VVDD0V) in recovering data from the SRC1 when VVDD was forcibly dropped to 0V and energy in recovering data from the SRC1 (PG-SRC1). Energy overhead in recovering data from the SRC2 was found to be 7.5×$E_{NOP}$, that is a value obtained by subtracting energy required to charge and discharge the chip capacitance from the total energy overhead.

Since leakage current is extremely small in the transistor using the 0.35-µm Si process, energy overhead was substantially constant with respect to PG time.

Next, PG performance of the IGZO-R using the 45-nm Si process was examined by simulation. Note that in the prototyped processor, a 0.18-µm CAAC-IGZO process was combined with the IGZO-R using the 45-nm Si process for the reasons below.

The first reason is that the on-state current of the CAAC-IGZO FET does not require to hold a value as high as that of the Si FET because data saving to the SRC2 is executed without problems as long as the SRC1 holds the data. Thus, PG performance is not influenced by electrical characteristics of the CAAC-IGZO FET except in data saving to the SRC2. The second reason is that if the size of the CAAC-IGZO FET is somewhat large, the register area is not increased because the CAAC-IGZO FET can be provided over a region where the Si FET is formed as described below. In addition, since the CAAC-IGZO FET requires less mobility than the Si FET, the channel length of the CAAC-IGZO FET requires less reduction than that of the Si FET. The third reason is that the hybrid process technology using the 0.18-µm CAAC-IGZO process has been established through chip evaluation.

Time in saving operation and time in recovery operation were calculated by simulation. Table 7 below shows the results of simulation employing a 0.35-µm process Si FET model based on prototype results and simulation employing a 45-nm process Si FET model based on PTM. Note that in both cases, the 0.18-µm process CAAC-IGZO FET model based on prototype results was used.

TABLE 7

| | 0.35-µm Si and 0.18-µm CAAC-IGZO *1 | 45-nm Si and 0.18-µm CAAC-IGZO *2 |
|---|---|---|
| SRC1 Backup time | 1.3 ns | 0.4 ns |
| Retention time | 2.0 ms | 489 ns |
| SRC2 Backup time | 96 ns | 16 ns |
| Retention time | >13 days | >2 hours |
| Recovery time | 1.4 ns | 1.1 ns |
| Total energy of backup and recovery | 3450 fJ (726 fJ) *3 | 68.8 fJ (19.8 fJ) *3 |

*1 13-fF Cs1, 133-fF Cs2 and 2.5 V VDD are assumed.
*2 1-fF Cs1, 5-fF Cs2 and 1.1 V VDD are assumed.
*3 Contribution of the CAAC-IGZO transistor and the capacitors.

According to Table 7, the holding time (489 ns) of the SRC1 is long enough, compared to the data saving time (16 ns) of the SRC2, which shows that the IGZO-R using the 45-nm Si process operates without problems. In addition, the holding time (2 hours) of the SRC2 is long enough for PG. The main reasons why the holding time of the SRC2 in the IGZO-R using the 45-nm Si process is short are that the capacitor Cs2 is small and that a power supply voltage is reduced.

The PG energy overheads of the IGZO-R, a state retention register including only an Si FET (hereinafter, referred to as SR-R), and a non-volatile register using an STT-MTJ element (hereinafter, referred to as MTJ-R), in each of which the 0.35-µm Si process and the 45-nm Si process are used, are compared with each other. PG energy overhead $E_{OH}(t)$ in a period t, from which energy accumulated in the chip capacitance when PG is started is excluded, is expressed by the following Equation 2.

$$E_{OH}(t)=P_{OFF}\times(t-t_{BR})+P_{LEAK}\times t_{BR}+E_{BR} \quad \text{(Equation 2)}$$

Note that in Equation 2, $P_{OFF}$ denotes leakage power in PG, $P_{LEAK}$ denotes leakage power in CG, and $t_{BR}$ denotes a period during which a power supply voltage is kept being supplied for data saving and recovery. $E_{BR}$ denotes a dynamic energy consumed in data saving and recovery.

In the SR-R, the power supply voltage is supplied to the flip-flop all the time; thus, the influence of $P_{OFF}$ becomes a problem in miniaturization. For example, in a miniaturized processor in which $P_{OFF}=(1/10)P_{LEAK}$, $P_{LEAK}=(1/2)P_{NOP}$, energy for 10 clocks of the NOP instruction is consumed when supply of the power supply voltage is stopped for a period of just approximately 200 clocks. This energy overhead is rapidly increased when a period during which supply of the power supply voltage is stopped is lengthened.

In the MTJ-R, $P_{OFF}$ is close to zero; however, there is a problem in that $t_{BR}$ and $E_{BR}$ are large. For example, in a prototyped memory cell using a 100-nm process MTJ element, time required for saving and energy required for saving are estimated to be 40 ns and 5.4 pJ, respectively. Energy required for data saving is large. Further, in a miniaturized chip in which $P_{LEAK}=(1/2)P_{NOP}$, f=1 GHz, for example, energy for 20 clocks or more of the NOP instruction is consumed only by leakage power in data saving.

On the other hand, in the IGZO-R, $P_{OFF}$ was close to zero and $t_{BR}$ in the 45-nm Si process was extremely small. In the case of the 45-nm Si process, as shown in Table 7, saving time and recovery time were 0.4 ns and 1.1 ns, respectively. In the $E_{BR}$ that corresponds to dynamic energy consumed in data saving and recovery, proportion of dynamic energy consumed in the CAAC-IGZO FET and the capacitor Cs2 was 29%. It was thus found that a Si circuit included in the IGZO-R greatly contributes to the energy overhead of the IGZO-R and the energy corresponds to $6 \times E_{NOP}$ of the prototyped chip.

From the above results, the energy reduction effect by PG in the processor using the 45-nm Si process IGZO-R is expected to be higher than that in the processor using the SR-R or the MTJ-R.

Next, the influence of the state retention circuit on the area of the IGZO-R was estimated.

Figure 36:
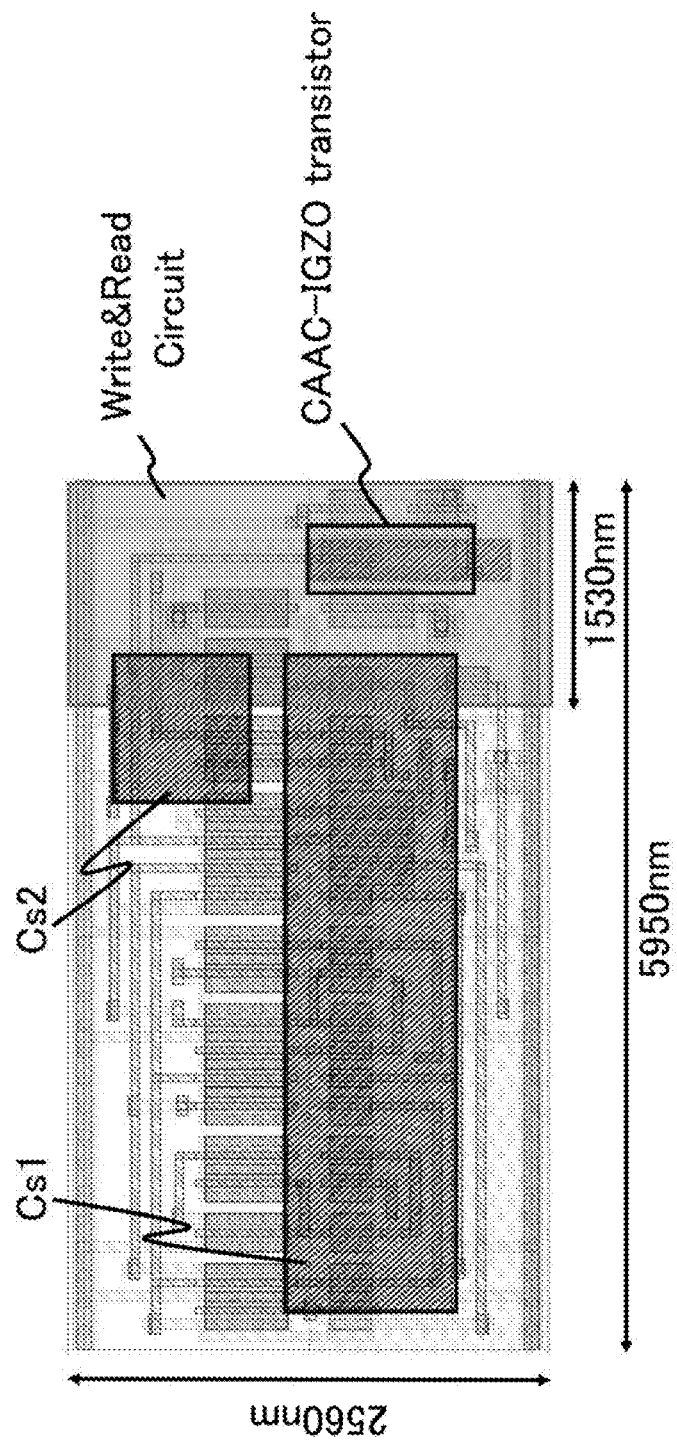
FIG. 36 shows a layout of an IGZO-R.

FIG. 36 is a layout of the IGZO-R using the 45-nm Si process and the 0.18-μm CAAC-IGZO process. Overhead in terms of area (hereinafter, referred to as area overhead) was 35%. This is attributed to the Si circuit included in the state retention circuit. On the other hand, since the CAAC-IGZO FET and the capacitor Cs2 were stacked over the Si circuit as shown in FIG. 36, there was no increase in area attributed to the CAAC-IGZO FET and the Cs2. The area overhead was 35% in the IGZO-R using the 0.35-μm Si process and the 0.18-μm CAAC-IGZO process, as in the IGZO-R using the 45-nm Si process and the 0.18-μm CAAC-IGZO process.

Next, the influence on the operation rate and the power consumption of the IGZO-R were estimated by the SPICE simulation. Table 8 below shows estimated results for the above-described two processes. In Table 8, each of the degree of delay degradation and the power consumption of the IGZO-R using the 0.35-μm Si process and the IGZO-R using the 45-nm Si process are compared.

TABLE 8

|  | 0.35-μm Si and 0.18-μm CAAC-IGZO | | 45-nm Si and 0.18-μm CAAC-IGZO | |
| --- | --- | --- | --- | --- |
|  | Standard DFF | IGZO-R | Standard DFF | IGZO-R |
| Delay time [ps] | 520 | 600 | 50 | 54 |
| (ratio) | (1.00) | (1.15) | (1.00) | (1.08) |
| Active energy with data inversion per clock [pJ] | 1.76 | 2.03 | 0.087 | 0.099 |
| (ratio) | (1.00) | (1.15) | (1.00) | (1.14) |
| Area [μm$^2$] | 1566 | 2120 | 11.3 | 15.2 |
| (ratio) | (1.00) | (1.35) | (1.00) | (1.35) |

As a result of the simulation, in the processor fabricated by the 0.35-μm Si process, the area overhead of the core was 2%, the energy overhead due to the state retention circuit was as small as 0.2%, and the rate of degradation was 0.12%. The rate degradation was calculated using the delay time of 80 ps obtained by Table 8 and the clock cycle of 67 ns at 15 MHz. These values are considered to be small also in the 45-nm Si process because these values are influenced mainly by the electric characteristics of the IGZO-R and the shape of the processor and do not depend on the Si process. In addition, the influence on the chip operation frequency is considered to be small. For example, according to Table 8, the degradation of the operation frequency is 0.4% due to the increase in delay time of 4 ps.

This application is based on Japanese Patent Application serial No. 2013-010795 filed with Japan Patent Office on Jan. 24, 2013 and Japanese Patent Application serial No. 2013-061603 filed with Japan Patent Office on Mar. 25, 2013, and the entire contents of which are hereby incorporated by reference.

What is claimed is:

1. A memory device comprising:
    a first circuit, the first circuit retaining data in a first period during which a power supply voltage is supplied;
    a second circuit, the second circuit saving the data retained in the first circuit in the first period and retaining the data in a second period during which the power supply voltage is not supplied; and
    a third circuit, the third circuit saving the data retained in the second circuit in the second period and retaining the data in a third period during which the power supply voltage is not supplied,
    wherein the third circuit comprises a first transistor in which a channel formation region is provided in an oxide semiconductor film and a first capacitor to which a first potential corresponding to the data is supplied through the first transistor.

2. The memory device according to claim 1,
    wherein the second circuit comprises a second transistor and a second capacitor to which a second potential corresponding to the data is supplied through the second transistor, and
    wherein a capacitance of the first capacitor is larger than a capacitance of the second capacitor.

3. The memory device according to claim 2, further comprising a third transistor, wherein the data retained in the third circuit is configured to be recovered to the first circuit by selection between a conduction state or a non-conduction state of the third transistor in accordance with the first potential.

4. The memory device according to claim 1, wherein the oxide semiconductor film comprises indium and zinc.

5. The memory device according to claim 4, wherein the oxide semiconductor film comprises gallium.

6. A semiconductor device comprising the memory device according to claim 1.

7. A memory device comprising:
    a first circuit configured to hold a data;
    a second circuit comprising:
        a first transistor comprising:
            a first terminal electrically connected to the first circuit;
            a second terminal; and
            a gate; and
        a first capacitor comprising:
            a first terminal electrically connected to the second terminal of the first transistor; and
            a second terminal;
    a third circuit comprising:
        a second transistor comprising:
            a first terminal;
            a second terminal; and
            a gate electrically connected to the second terminal of the first transistor and the first terminal of the first capacitor;
        a third transistor comprising:
            a first terminal electrically connected to the second terminal of the second transistor;
            a second terminal; and
            a gate; and a second capacitor comprising:
   a first terminal electrically connected to the first circuit and the second terminal of the third transistor,
wherein the third transistor comprises an oxide semiconductor film in which a channel formation region is provided.

8. The memory device according to claim 7, wherein a capacitance of the second capacitor is larger than a capacitance of the first capacitor.

9. The memory device according to claim 7, wherein the oxide semiconductor film comprises indium and zinc.

10. The memory device according to claim 9, wherein the oxide semiconductor film comprises gallium.

11. The memory device according to claim 7, wherein a channel formation region of the first transistor comprises silicon.

12. The memory device according to claim 7, wherein the first terminal of the second transistor is electrically connected to a wiring capable of supplying a power source potential.

13. A memory device comprising:
   a first circuit configured to hold a data;
   a second circuit comprising:
      a first transistor comprising:
         a first terminal electrically connected to the first circuit;
         a second terminal; and
         a gate; and
      a first capacitor comprising:
         a first terminal electrically connected to the second terminal of the first transistor; and
         a second terminal;
   a third circuit comprising:
      a second transistor comprising:
         a first terminal;
         a second terminal; and
         a gate electrically connected to the second terminal of the first transistor and the first terminal of the first capacitor;
      a third transistor comprising;
         a first terminal electrically connected to the second terminal of the second transistor;
         a second terminal; and
         a gate; and
      a second capacitor comprising:
         a first terminal electrically connected to the second terminal of the third transistor; and
         a second terminal; and
   a fourth circuit comprising a fourth transistor comprising:
      a first terminal electrically connected to a first wiring capable of supplying a first power source potential;
      a second terminal electrically connected to a second wiring capable of supplying a second power source potential; and
      a gate electrically connected to the second terminal of the third transistor and the first terminal of the second capacitor,
   wherein the third transistor comprises an oxide semiconductor film in which a channel formation region is provided.

14. The memory device according to claim 13,
   wherein the third circuit comprises a fifth transistor comprising:
      a first terminal;
      a second terminal electrically connected to the second terminal of the second transistor and the first terminal of the third transistor; and
      a gate electrically connected to the first terminal of the second transistor and the first terminal of the fifth transistor.

15. The memory device according to claim 13,
   wherein the first circuit comprises:
      a first inverter comprising:
         an input terminal; and
         an output terminal electrically connected to the first terminal of the first transistor; and
      a second inverter comprising:
         an input terminal electrically connected to the output terminal of the first inverter and the fourth circuit; and
         an output terminal electrically connected to the input terminal of the first inverter.

16. The memory device according to claim 13, wherein a capacitance of the second capacitor is larger than a capacitance of the first capacitor.

17. The memory device according to claim 13, wherein the oxide semiconductor film comprises indium and zinc.

18. The memory device according to claim 13, wherein the oxide semiconductor film comprises gallium.

19. The memory device according to claim 13, wherein a channel formation region of the first transistor comprises silicon.

* * * * *